(12) United States Patent
Numata et al.

(10) Patent No.: US 11,043,639 B2
(45) Date of Patent: Jun. 22, 2021

(54) CHARGE TRANSPORT MATERIAL, COMPOSITION INCLUDING THE CHARGE TRANSPORT MATERIAL, AND ORGANIC LIGHT-EMITTING DEVICE INCLUDING THE COMPOSITION

(71) Applicant: Samsung Electronics Co., Ltd., Suwon-si (KR)

(72) Inventors: Masaki Numata, Kanagawa (JP); Keisuke Korai, Kanagawa (JP); Mitsunori Ito, Kanagawa (JP)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/726,423

(22) Filed: Dec. 24, 2019

(65) Prior Publication Data
US 2020/0212313 A1 Jul. 2, 2020

(30) Foreign Application Priority Data

Dec. 28, 2018 (JP) .............................. JP2018-248449
Sep. 9, 2019 (KR) ......................... 10-2019-0111555

(51) Int. Cl.
*H01L 51/50* (2006.01)
*H01L 51/00* (2006.01)

(52) U.S. Cl.
CPC ...... *H01L 51/0072* (2013.01); *H01L 51/0059* (2013.01); *H01L 51/0074* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| 8,227,096 | B2 | 7/2012 | Miki et al. |
| 10,134,988 | B2 | 11/2018 | Fennimore et al. |
| 10,199,577 | B2 | 2/2019 | Park et al. |
| 2006/0232198 | A1 | 10/2006 | Kawamura et al. |
| 2008/0241591 | A1 | 10/2008 | Kawamura et al. |
| 2018/0294416 | A1 | 10/2018 | Hayashi et al. |

FOREIGN PATENT DOCUMENTS

| JP | 2000186066 A | 7/2000 | |
| JP | 2000309566 A | 11/2000 | |
| JP | 5009801 B2 | 6/2012 | |
| KR | 2016066308 | * 6/2016 | ............ H01L 51/50 |
| WO | 2006120859 A1 | 12/2008 | |
| WO | 2011159872 A1 | 12/2011 | |
| WO | 2015089304 A1 | 6/2015 | |
| WO | 2017051765 A1 | 3/2017 | |

* cited by examiner

*Primary Examiner* — Gregory D Clark
(74) *Attorney, Agent, or Firm* — Cantor Colburn LLP

(57) ABSTRACT

Provided are a charge transport material represented by Formula 1, a composition including the charge transport material, and an organic light-emitting device including the composition Formula 1

$(Ar_1)_{b1}-(L_1)_{a1}-(G_1)_{c1}+(L_2)_{a2}-(G_2)_{a2}+(L_3)_{a3}-A]_{n2}]_{n1}$.

20 Claims, 4 Drawing Sheets

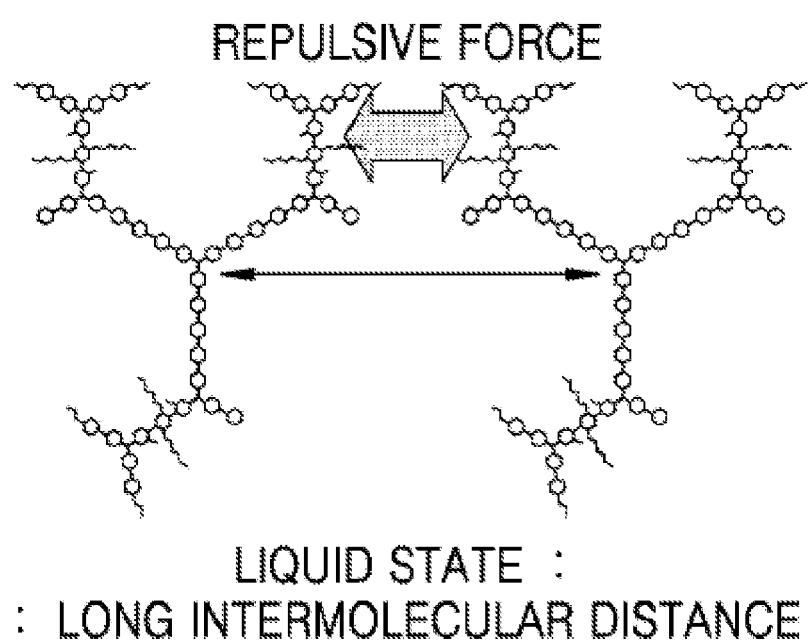

CHARGE TRANSPORT MATERIAL, COMPOSITION INCLUDING THE CHARGE TRANSPORT MATERIAL, AND ORGANIC LIGHT-EMITTING DEVICE INCLUDING THE COMPOSITION

CROSS-REFERENCE TO RELATED APPLICATION

This application claims the priority to and the benefits of Korean Patent Application No. 10-2019-0111555, filed on Sep. 9, 2019, in the Korean Intellectual Property Office, and Japanese Patent Application No. 2018-248449, filed on Dec. 28, 2018, in the Japanese Intellectual Property Office. and all the benefits accruing therefrom under 35 U.S.C. § 119, the contents of which are incorporated herein in their entirety by reference.

BACKGROUND

1. Field

The present disclosure relates to a charge transport material, a composition including the charge transport material, and an organic light-emitting device including the composition.

2. Description of Related Art

Organic light-emitting devices are self-emission devices that produce full-color images, and also have wide viewing angles, high contrast ratios, short response times, as well as excellent characteristics in terms of brightness, driving voltage, and response speed.

In an example, an organic light-emitting device includes an anode, a cathode, and an organic layer that is disposed between the anode and the cathode and includes an e mission layer. The organic light-emitting device may include a hole transport region between the anode and the emission layer, and an electron transport region between the emission layer and the cathode. Holes provided from the anode may move toward the emission layer through the hole transport region, and electrons provided from the cathode m ay move toward the emission layer through the electron transport region. Carriers, such as holes and electrons, recombine in the emission layer to produce excitons. These excitons transit from an excited state to a ground state, thereby generating light.

SUMMARY

Aspects of the present disclosure provide a charge transport material, a composition including the charge transport material, and an organic light-emitting device including the composition.

It is generally known that it is important to form a stacked structure of a hole trans port layer and an emission layer in manufacturing a high-performance organic light-emitting device. However, it is difficult to form such a stacked structure in a wet condition. In order to deposit the emission layer on the hole transport layer, it is necessary that a hole transport layer film is insoluble in an emission layer solution. In the related art, a crosslinking compound is used in a hole transport layer, and insolubilization by post-processing such as heating is used. However, when the crosslinking compound is used, impurities and structural defects are often generated according to a crosslinking reaction. Hence, the efficiency of the device is deteriorated, and the lifespan of the device is reduced.

Therefore, there is an increasing need for a hole transporting compound capable of realizing stackability without using a crosslinking reaction.

Additional aspects will be set forth in part in the description which follows and, in p art, will be apparent from the description, or may be learned by practice of the presented embodiments of the disclosure.

An aspect of the present disclosure provides a charge transport material represented by Formula 1:

Formula 1

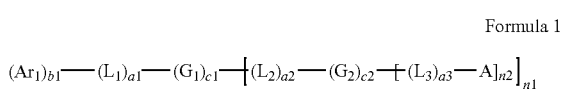

2-1

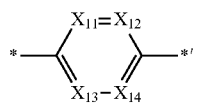

2-2

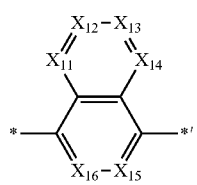

2-3

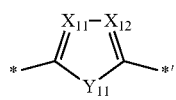

2-4

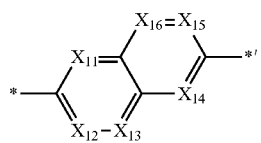

2-5

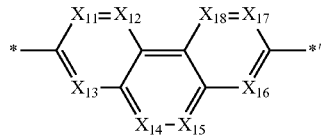

2-6

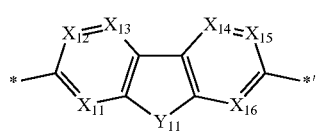

3-1

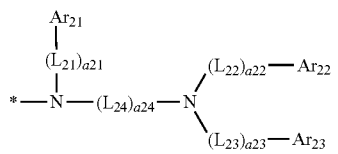

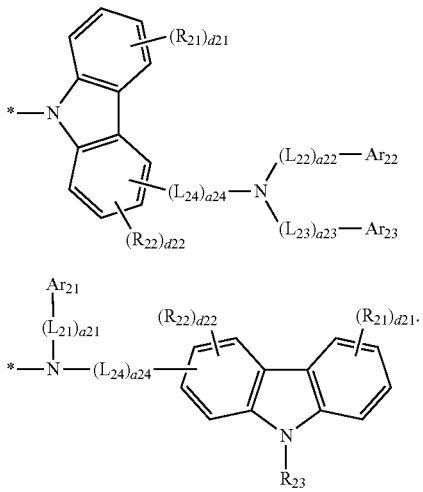

In Formulae 1, 2-1 to 2-6, and 3-1 to 3-3, $Ar_1$ is a substituted or unsubstituted $C_5$-$C_{60}$ carbocyclic group, b1 is an integer from 0 to 2, $L_1$ to $L_3$ are each independently a group represented by Formulae 2-1 to 2-6, a2 is an integer from 3 to 10, wherein, when $L_2$(s) in the number of a2 are each a group represented by Formulae 2-1 to 2-3, a2 is 4 to 10, a1 and a3 are each independently an integer from 0 to 10, when b1 is 0, then a1 is 0, $G_1$ and $G_2$ are each independently trivalent nitrogen (N), tetravalent silicon (Si), a substituted or unsubstituted $C_5$-$C_{60}$ carbocyclic group, or a substituted or unsubstituted $C_1$-$C_{60}$ heterocyclic group, c1 is an integer from 1 to 10, c2 is 0 or 1, wherein, when c2 is 0, $G_2$ is a single bond, A is a group represented by Formulae 3-1 to 3-3, $X_{11}$ to $X_{18}$ are each independently $C(R_{11})$ or N, $Y_{11}$ is O, S, Se, C(=O), $C(R_{11})(R_{12})$, or $N(R_{11})$, $L_{21}$ to $L_{24}$ are each independently a group represented by Formulae 2-1 to 2-6, a21 to a23 are each independently an integer from 0 to 5, a24 is an integer from 1 to 5, $Ar_{21}$ to $Ar_{23}$ are each independently a substituted or unsubstituted $C_5$-$C_{60}$ carbocyclic group or a substituted or unsubstituted $C_1$-$C_{60}$ heterocyclic group, $R_{11}$ to $R_{12}$ and $R_{21}$ to $R_{23}$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), or —N($Q_1$)($Q_2$), d21 is an integer from 0 to 4, d22 is an integer from 0 to 3, any two adjacent groups among $R_{11}$, $R_{12}$, $R_{21}$(s) in the number of d21, $R_{22}$(s) in the number of d22, and $R_{23}$ are optionally linked to form a substituted or unsubstituted $C_5$-$C_{30}$ carbocyclic group or a substituted or unsubstituted $C_1$-$C_{30}$ heterocyclic group, n1 is an integer from 2 to 8, n2 is 1 or 2, wherein at least one of A(s) in the number of n1×n2 includes one or more $C_1$-$C_{60}$ alkyl groups, and a total number of carbon atoms of the one or more $C_1$-$C_{60}$ alkyl groups is 6 or more, at least one substituent of the substituted $C_5$-$C_{60}$ carbocyclic group, the substituted $C_1$-$C_{60}$ heterocyclic group, the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_1$-$C_{60}$ heteroaryloxy group, the substituted $C_1$-$C_{60}$ heteroarylthio group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, —NCS, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, —NCS, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, Si($Q_1$)($Q_2$)($Q_{13}$), —N($Q_{11}$)($Q_{12}$), —C(=O)($Q_{11}$), or any combination thereof;

a $C_3$-$C_{10}$ cycloalkyl group, a $C_1$-$C_{10}$ heterocycloalkyl group, a $C_3$-$C_{10}$ cycloalkenyl group, or a $C_1$-$C_{10}$ heterocycloalkenyl group;

a $C_3$-$C_{10}$ cycloalkyl group, a $C_1$-$C_{10}$ heterocycloalkyl group, a $C_3$-$C_{10}$ cycloalkenyl group, or a $C_1$-$C_{10}$ heterocycloalkenyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, —Si($Q_{21}$)($Q_{22}$)($Q_{23}$), —N($Q_{21}$)($Q_{22}$), —C(=O)($Q_{21}$), or any combination thereof; or —Si($Q_{31}$)($Q_{32}$)($Q_{33}$), —N($Q_{31}$)($Q_{32}$), or —C(=O)($Q_{31}$), $Q_1$ to $Q_3$, Q to $Q_{13}$, $Q_{21}$ to $Q_{23}$, and $Q_{31}$ to $Q_{33}$ are each independently hydrogen, deuterium, a $C_1$-$C_{20}$ alkyl group, a $C_1$-$C_{20}$ alkoxy group, a phenyl group, or a biphenyl group, and

* and *' each indicate a binding site to a neighboring atom.

Another aspect of the present disclosure provides a composition including at least one charge transport material represented by Formula 1.

Another aspect of the present disclosure provides an organic light-emitting device including: a first electrode; a second electrode; an organic layer between the first electrode and the second electrode and including an emission layer; and at least one charge transport material represented by Formula 1.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 1A and 1B are conceptual diagrams illustrating states of existence of a compound in a state in which a charge transport material according to an embodiment is dissolved in a solution and a film state after deposition, respectively.

DETAILED DESCRIPTION

Figure 1B:
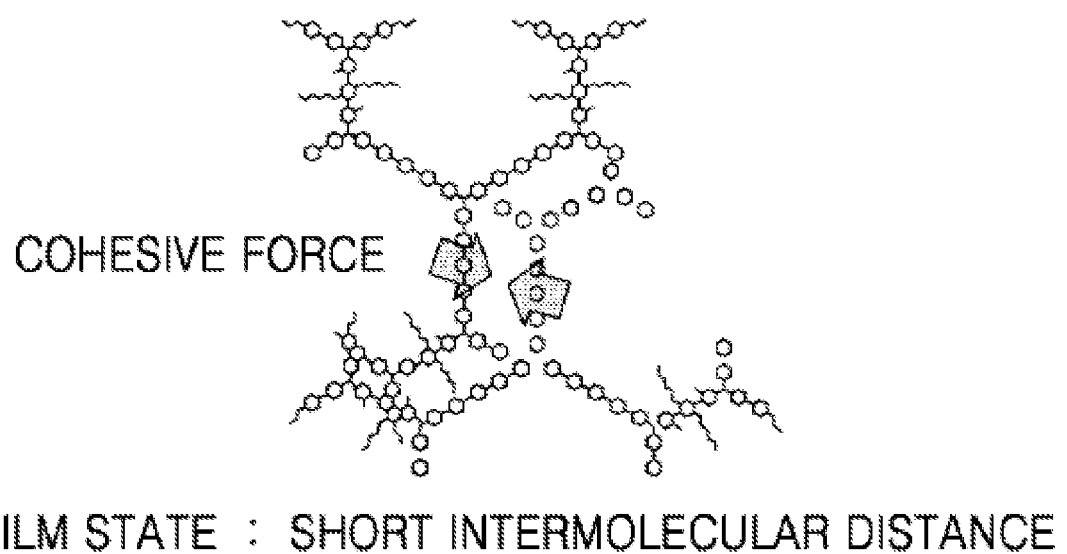

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the present specification, unless defined otherwise, operations and measurements of physical properties are performed in a condition of room temperature (about 20° C. to about 25° C.) and a relative humidity of about 40% RH to about 50% RH. A "compound for an organic light-emitting device" may be referred to as a "compound", and a "material for an organic light-emitting device" may be referred to as a "material," Also, a "composition for an organic light-emitting device" may be simply referred to as a "composition."

Charge Transport Material

A charge transport material represented by Formula 1 according to an embodiment will be described as follows:

Formula 1

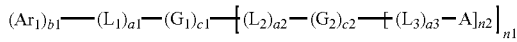

In Formula 1, $Ar_1$ is a substituted or unsubstituted $C_5$-$C_{60}$ carbocyclic group.

For example, $Ar_1$ may be:

a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, or a pyranthrenyl group; or a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, or a pyranthrenyl group, each substituted with at least one deuterium, —F, —Cl, —Br, —I, a hydroxyl group, a cyano group, a nitro group, an amino group, an amidino group, a hydrazino group, a hydrazono group, a $C_1$-$C_{30}$ alkyl group, a $C_1$-$C_{30}$ alkoxy group, a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, or any combination thereof.

In Formula 1, b1 is an integer from 0 to 2, and b1 indicates the number of a group(s) represented by $Ar_1$. When b1 is 2 or more, $Ar_1$(s) in the number of b1 may be identical to or different from each other.

In Formula 1, $L_1$ to $L_3$ are each independently groups represented by Formulae 2-1 to 2-6:

2-1
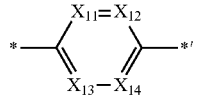

2-2
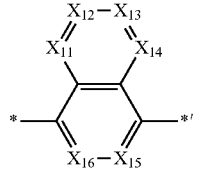

2-3
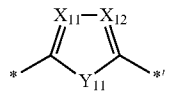

2-4
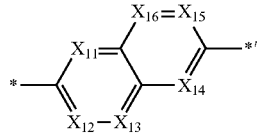

2-5
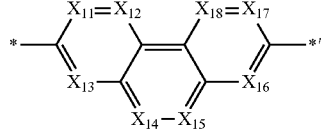

2-6
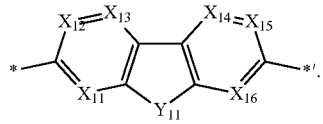

In Formulae 2-1 to 2-6, $X_{11}$ to $X_{18}$ are each independently $C(R_{11})$ or N.

For example, $X_{11}$ to $X_{18}$ may each be $C(R_{11})$.

In Formulae 2-1 to 2-6, $Y_{11}$ is O, S, Se, C(=O), $C(R_{11})(R_2)$, or $N(R_{11})$.

For example, $L_1$ to $L_3$ may each independently be groups represented by Formulae 4-1 to 4-3.

4-1
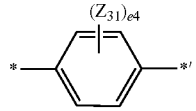

4-2
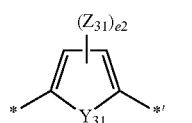

4-3
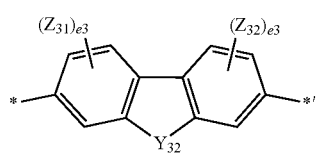

In Formulae 4-1 to 4-3, $Y_{31}$ may be O, S, or Se, $Y_{32}$ may be O, S, Se, C(=), C($Z_{33}$)($Z_{34}$), or N($Z_{33}$), $Z_{31}$ to $Z_{34}$ may each independently be hydrogen, —F, —Cl, —Br, —I, a hydroxyl group, a cyano group, a nitro group, or a $C_1$-$C_{30}$ alkyl group, e2 may be an integer from 0 to 2, e3 may be an integer from 0 to 3, e4 may be an integer from 0 to 4, and

* and *' each indicate a binding site to a neighboring atom.

In Formula 1, a2 may be an integer from 3 to 10, wherein, when $L_2$(s) in the number of a2 are each a group represented by Formulae 2-1 to 2-3, a2 may be 4 to 10, a1 and a3 may each independently be an integer from 0 to 10, and when b1 is 0, a1 may be 0.

The designation a1 indicates the number of a group(s) represented by $L_1$, a2 indicates the number of a group(s) represented by $L_2$, and a3 indicates the number of a group(s) represented by $L_3$, wherein, when a1 is 2 or more, $L_1$(s) in the number of a1 may be identical to or different from each other, $L_2$(s) in the number of a2 may be identical to or different from each other, when a3 is 2 or more, $L_3$(s) in the number of a3 may be identical to or different from each other, when a1 is 0, *$(L_1)_{a1}$-*' may be a single bond, and when a3 is 0, *-$(L_3)_{a3}$-*' may be a single bond.

For example, a2 may be an integer from 5 to 10.

For example, a1 to a3 may each independently be an integer equal to or less than 8.

For example, *-$(L_3)_{a3}$-*' may be a single bond or a group represented by Formulae 4(1) and 4(2):

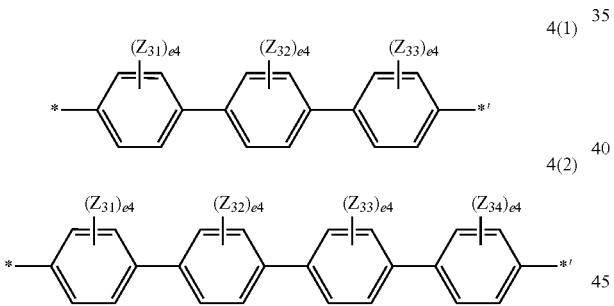

In Formulae 4(1) and 4(2), $Z_{31}$ to $Z_{34}$ may each independently be hydrogen, —F, —Cl, —Br, —I, a hydroxyl group, a cyano group, a nitro group, or a $C_1$-$C_{30}$ alkyl group, e24 may be an integer from 0 to 4, and

* and *' each indicate a binding site to a neighboring atom.

In Formula 1, $G_1$ and $G_2$ may each independently be trivalent nitrogen (N), tetravalent silicon (Si), a substituted or unsubstituted $C_5$-$C_{60}$ carbocyclic group, or a substituted or unsubstituted $C_1$-$C_{60}$ heterocyclic group.

In Formula 1, c1 may be an integer from 1 to 10, and c2 may be 0 or 1, wherein, when c2 is 0, $G_2$ may be a single bond.

The designation c1 indicates the number of a group(s) represented by $G_1$, and c2 indicates the number of a group(s) represented by $G_2$, wherein, when c1 is 2 or more, $G_1$(s) in the number of c1 may be identical to or different from each other, and when c2 is 2 or more, $G_2$(s) in the number of c2 may be identical to or different from each other.

For example, $(G_1)_{c1}$ may be a group represented by Formulae 5-1 to 5-8, and $(G_2)_{c2}$ may be a single bond or a group represented by Formulae 5-1 to 5-8:

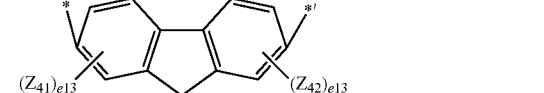

In Formulae 5-1 to 5-8, $Y_{41}$ may be O, S, Se, C(=), C($Z_{45}$)($Z_{46}$), or N($Z_{45}$), $Z_{41}$ to $Z_{46}$ may each independently be hydrogen, —F, —Cl, —Br, —I, a hydroxyl group, a cyano group, a nitro group, or a $C_1$-$C_{30}$ alkyl group, e13 may be an integer from 0 to 3, e14 may be an integer from 0 to 4, and

*, *', *'', and *''' each indicate a binding site to a neighboring atom.

In Formula 1, A may be a group represented by Formulae 3-1 to 3-3:

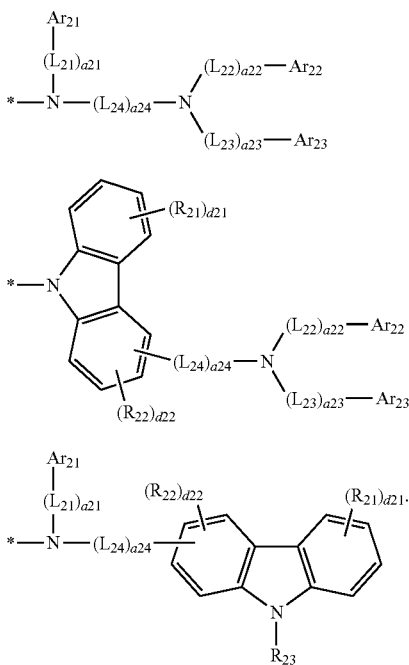

3-1

3-2

3-3

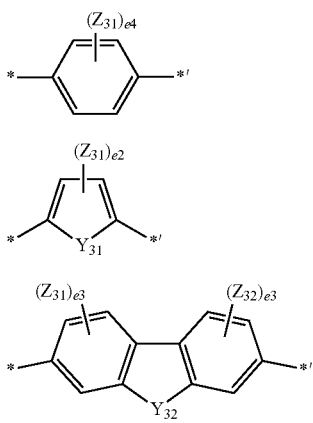

4-1

4-2

4-3

In Formulae 4-1 to 4-3,
$Y_{31}$ may be O, S, or Se,
$Y_{32}$ may be O, S, Se, C(=), C($Z_{33}$)($Z_{34}$), or N($Z_{33}$),
$Z_{31}$ to $Z_{34}$ may each independently be hydrogen, —F, —Cl, —Br, —I, a hydroxyl group, a cyano group, a nitro group, or a $C_1$-$C_{30}$ alkyl group,
e2 may be an integer from 0 to 2,
e3 may be an integer from 0 to 3,
e4 may be an integer from 0 to 4, and
* and *' each indicate a binding site to a neighboring atom.

In Formulae 3-1 to 3-3, a21 to a23 may each independently be an integer from 0 to 5, and a24 may be an integer from 1 to 5.

The designation a21 indicates the number of a group(s) represented by $L_{21}$, a22 indicates the number of a group(s) represented by $L_{22}$, a23 indicates the number of a group(s) represented by $L_{23}$, and a24 indicates the number of a group(s) represented by $L_{24}$, wherein, when a21 is 2 or more, $L_{21}$(s) in the number of a21 may be identical to or different from each other, when a22 is 2 or more, $L_{22}$(s) in the number of a22 may be identical to or different from each other, when a23 is 2 or more, $L_{23}$(s) in the number of a23 may be identical to or different from each other, when a24 is 2 or more, $L_{24}$(s) in the number of a24 may be identical to or different from each other, when a21 is 0, *-$(L_{21})_{a21}$-*' may be a single bond, when a22 is 0, *-$(L_{22})_{a22}$-*' may be a single bond, and when a23 is 0, *-$(L_{23})_{a23}$-*' may be a single bond.

For example, *-$(L_{24})_{a24}$-*' may be a single bond or a group represented by Formulae 6-1 to 6-6:

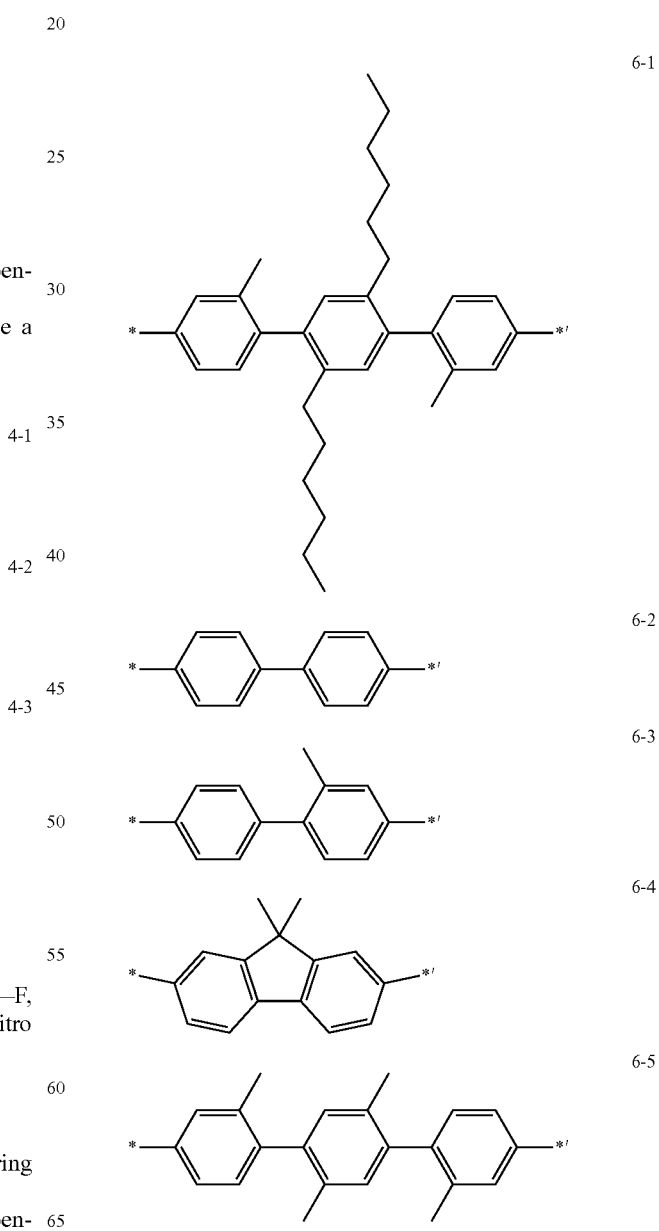

6-6

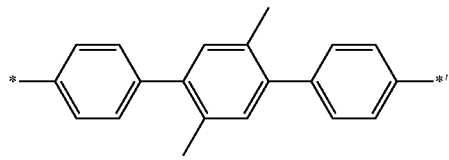

In Formulae 6-1 to 6-6, * and *' indicate a binding site to a neighboring atom.

In Formulae 3-1 to 3-3, $Ar_{21}$ to $Ar_{23}$ may each independently be a substituted or unsubstituted $C_5$-$C_{60}$ carbocyclic group, or a substituted or unsubstituted $C_1$-$C_{60}$ heterocyclic group.

For example, $Ar_{21}$ to $Ar_{23}$ may each independently be:

a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a triphenylenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyridinyl group, a pyrazinyl group, a pyridazinyl group, a pyrimidinyl group, a triazinyl group, a quinolinyl group, an isoquinolinyl group, a quinoxalinyl group, a quinazolinyl group, a naphthyridinyl group, an acridinyl group, a phenazinyl group, a benzoquinolinyl group, a benzoisoquinolinyl group, a phenanthridinyl group, a phenanthrolinyl group, a benzoquinonyl group, a coumarinyl group, an anthraquinonyl group, a fluorenonyl group, a furanyl group, a thienyl group, a silolyl group, a benzofuranyl group, a benzothienyl group, a benzosilolyl group, a dibenzofuranyl group, a dibenzothiophenyl group, a dibenzosilolyl group, a pyrrolyl group, an indolyl group, an isoindolyl group, a carbazolyl group, a benzocarbazolyl group, a dibenzocarbazolyl group, an imidazolyl group, a benzimidazolyl group, a pyrazolyl group, a triazolyl group, a tetrazolyl group, an indazolyl group, an oxazolyl group, an isoxazolyl group, a benzoxazolyl group, a benzisoxazolyl group, a thiazolyl group, an isothiazolyl group, a benzothiazolyl group, a benzisothiazolyl group, an imidazopyridinyl group, an imidazopyrimidinyl group, an imidazophenanthridinyl group, a benzimidazophenanthridinyl group, an azadibenzofuranyl group, an azacarbazolyl group, an azadibenzothienyl group, a diazadibenzofuranyl group, a diazacarbazolyl group, a diazadibenzothienyl group, a xanthonenyl group, or a thioxanthonyl group; or a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a triphenylenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyridinyl group, a pyrazinyl group, a pyridazinyl group, a pyrimidinyl group, a triazinyl group, a quinolinyl group, an isoquinolinyl group, a quinoxalinyl group, a quinazolinyl group, a naphthyridinyl group, an acridinyl group, a phenazinyl group, a benzoquinolinyl group, a benzoisoquinolinyl group, a phenanthridinyl group, a phenanthrolinyl group, a benzoquinonyl group, a coumarinyl group, an anthraquinonyl group, a fluorenonyl group, a furanyl group, a thienyl group, a silolyl group, a benzofuranyl group, a benzothienyl group, a benzosilolyl group, a dibenzofuranyl group, a dibenzothiophenyl group, a dibenzosilolyl group, a pyrrolyl group, an indolyl group, an isoindolyl group, a carbazolyl group, a benzocarbazolyl group, a dibenzocarbazolyl group, an imidazolyl group, a benzimidazolyl group, a pyrazolyl group, a triazolyl group, a tetrazolyl group, an indazolyl group, an oxazolyl group, an isoxazolyl group, a benzoxazolyl group, a benzisoxazolyl group, a thiazolyl group, an isothiazolyl group, a benzothiazolyl group, a benzisothiazolyl group, an imidazopyridinyl group, an imidazopyrimidinyl group, an imidazophenanthridinyl group, a benzimidazophenanthridinyl group, an azadibenzofuranyl group, an azacarbazolyl group, an azadibenzothienyl group, a diazadibenzofuranyl group, a diazacarbazolyl group, a diazadibenzothienyl group, a xanthonenyl group, or a thioxanthonyl group, each substituted with at least one deuterium, —F, —Cl, —Br, —I, a hydroxyl group, a cyano group, a nitro group, an amino group, an amidino group, a hydrazino group, a hydrazono group, a $C_1$-$C_{30}$ alkyl group, a $C_1$-$C_{30}$ alkoxy group, a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a triphenylenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, a pyridinyl group, a pyrazinyl group, a pyridazinyl group, a pyrimidinyl group, a triazinyl group, a quinolinyl group, an isoquinolinyl group, a quinoxalinyl group, a quinazolinyl group, a naphthyridinyl group, an acridinyl group, a phenazinyl group, a benzoquinolinyl group, a benzoisoquinolinyl group, a phenanthridinyl group, a phenanthrolinyl group, a benzoquinonyl group, a coumarinyl group, an anthraquinonyl group, a fluorenonyl group, a furanyl group, a thienyl group, a silolyl group, a benzofuranyl group, a benzothienyl group, a benzosilolyl group, a dibenzofuranyl group, a dibenzothiophenyl group, a dibenzosilolyl group, a pyrrolyl group, an indolyl group, an isoindolyl group, a carbazolyl group, a benzocarbazolyl group, a dibenzocarbazolyl group, an imidazolyl group, a benzimidazolyl group, a pyrazolyl group, a triazolyl group, a tetrazolyl group, an indazolyl group, an oxazolyl group, an isoxazolyl group, a benzoxazolyl group, a benzisoxazolyl group, a thiazolyl group, an isothiazolyl group, a benzothiazolyl group, a benzisothiazolyl group, an imidazopyridinyl group, an imidazopyrimidinyl group, an imidazophenanthridinyl group, a benzimidazophenanthridinyl group, an azadibenzofuranyl group, an azacarbazolyl group, an azadibenzothienyl group, a diazadibenzofuranyl group, a diazacarbazolyl group, a diazadibenzothienyl group, a xanthonenyl group, a thioxanthonyl group, or any combination thereof.

For example, $Ar_{21}$ to $Ar_{23}$ may each independently be:

a phenyl group, a biphenyl group, a fluorenyl group, or a carbazolyl group; or a phenyl group, a biphenyl group, a fluorenyl group, or a carbazolyl group, each substituted with at least one deuterium, —F, —Cl, —Br, —I, a hydroxyl group, a cyano group, a nitro group, an amino group, an amidino group, a hydrazino group, a hydrazono group, a $C_1$-$C_{30}$ alkyl group, a $C_1$-$C_{30}$ alkoxy group, a phenyl group, a biphenyl group, a terphenyl group, or any combination thereof.

For example, $*-(L_{22})_{a22}-Ar_{22}$ and $*-(L_{23})_{a23}-Ar_{23}$ may each independently be a group represented by Formulae 7-1 to 7-5:

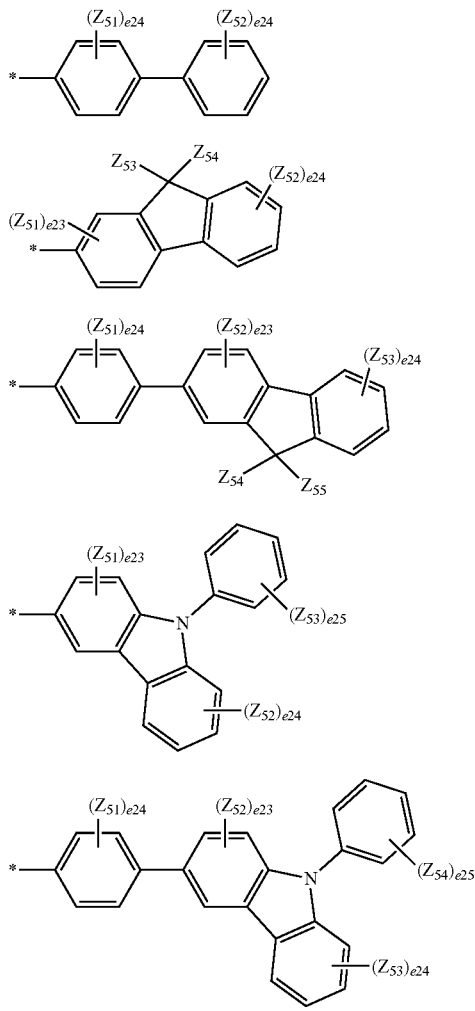

In Formulae 7-1 to 7-5, $Z_{51}$ to $Z_{55}$ may each independently be hydrogen, —F, —Cl, —Br, —I, a hydroxyl group, a cyano group, a nitro group, a $C_1$-$C_{30}$ alkyl group, or a $C_3$-$C_{10}$ cycloalkyl group, e23 may be an integer from 0 to 3, e24 may be an integer from 0 to 4, e25 may be an integer from 0 to 5, and

* indicates a binding site to a neighboring atom.

In Formulae 2-1 to 2-6 and 3-1 to 3-3, Ru to $R_{12}$ and $R_{21}$ to $R_{23}$ may each independently be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), or —N($Q_1$)($Q_2$).

For example, Rn to $R_{12}$ and $R_{21}$ to $R_{23}$ may each independently be:

hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, or a naphthyl group; or a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, or a naphthyl group, each substituted with at least one deuterium, —F, —Cl, —Br, —I, a cyano group, a phenyl group, a biphenyl group, a terphenyl group, or any combination thereof.

In Formulae 2-1 to 2-6 and 3-1 to 3-3, d21 may be an integer from 0 to 4, and d22 may be an integer from 0 to 3. Any two adjacent groups among $R_{11}$, $R_{12}$, $R_{21}$(s) in the number of d21, $R_{22}$(s) in the number of d22, and $R_{23}$ may optionally be linked to form a substituted or unsubstituted $C_5$-$C_{30}$ carbocyclic group or a substituted or unsubstituted $C_1$-$C_{30}$ heterocyclic group.

In Formula 1, n1 may be an integer from 2 to 8, and n2 may be 1 or 2.

The designation n1 indicates the number of a group(s) represented by $*-[-(L_2)_{a2}-(G_2)_{c2}-[-(L_3)_{a3}-A]_{n2}]$ linked to $(G)_{c1}$, the groups represented by $*-[-(L_2)_{a2}-(G_2)_{c2}-[-(L_3)_{a3}-A]_{n2}]$ may be identical to or different from each other, the product of n1 and n2 (n1×n2) indicates the number of a group(s) represented by $*-[-(L_3)_{a3}-A]$ linked to $(G_2)_{c2}$ and included in the charge transport material represented by Formula 1, and the groups represented by $*-[-(L_3)_{a3}-A]$ may be identical to or different from each other.

For example, n1 may be an integer from 2 to 6.

In one or more embodiments, A may be at least one of Formulae A1 to A9:

A1

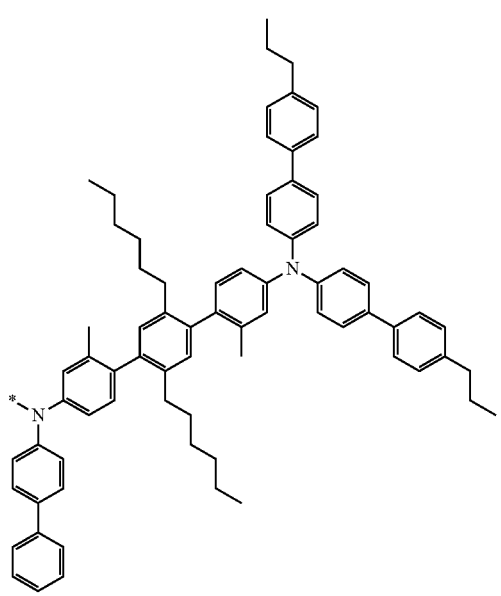

A2
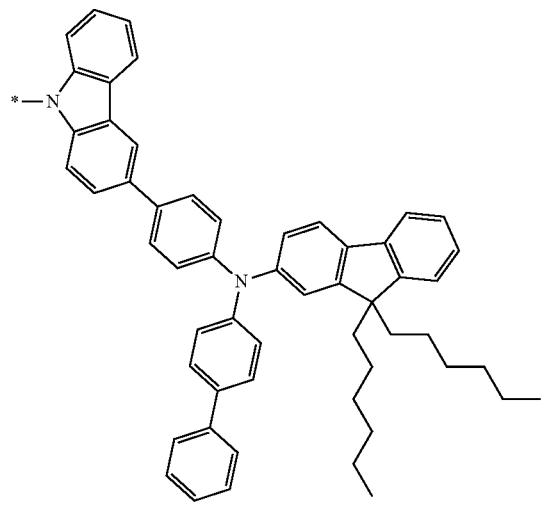
A4
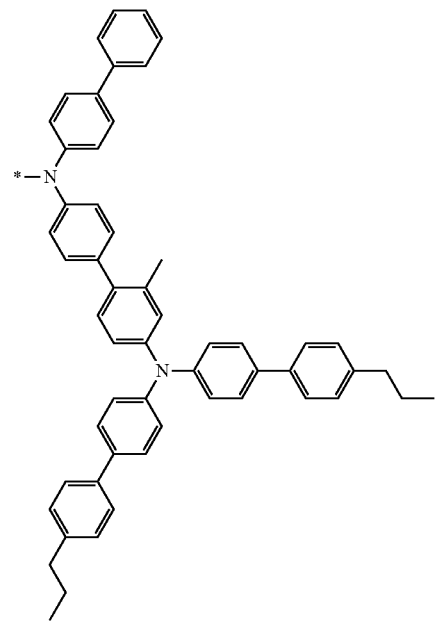
A3
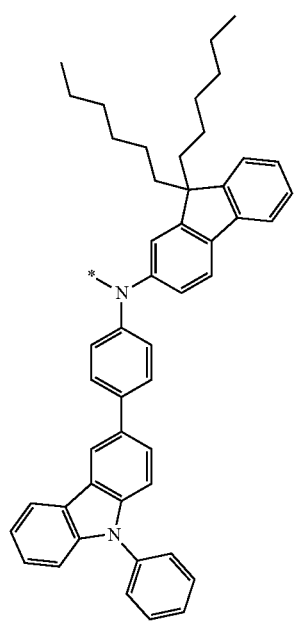
A5
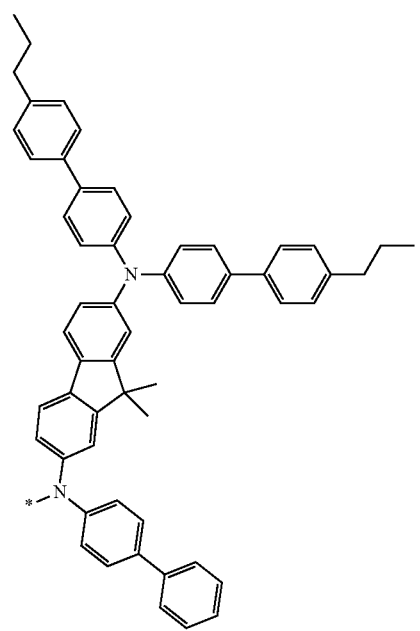

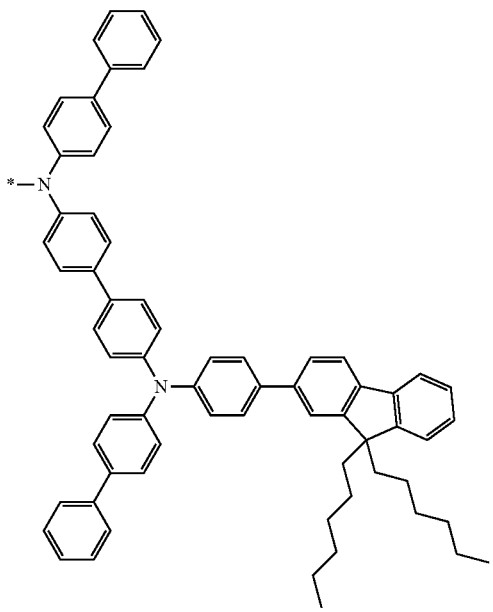

A6

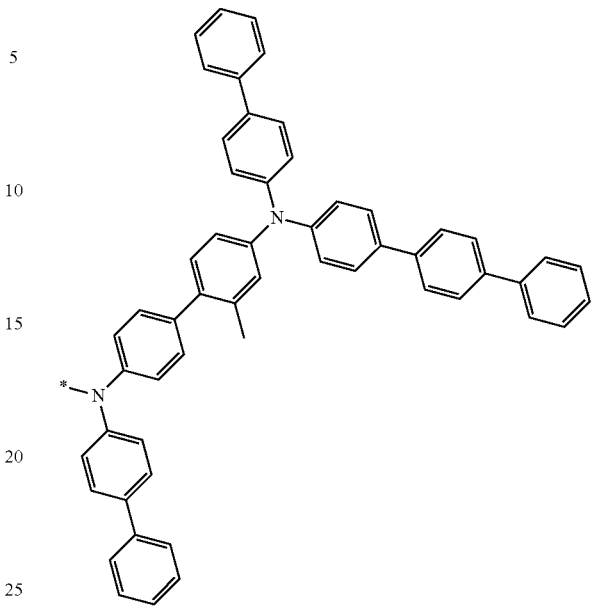

A8

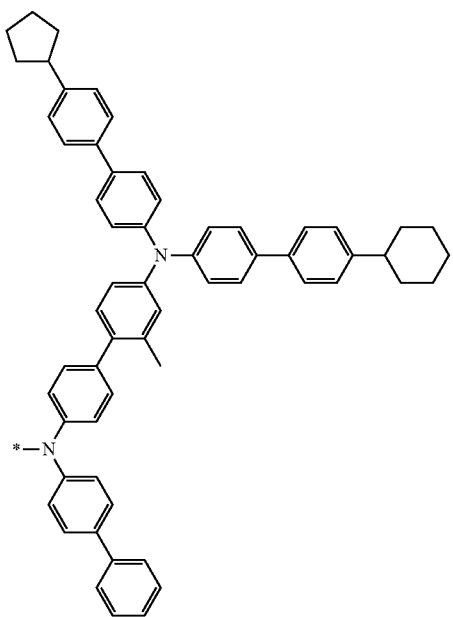

A7

A9

In Formulae A1 to A9, * indicates a binding site to a neighboring atom.

In Formula 1, at least one of A(s) in the number of n1×n2 may include one or more $C_1$-$C_{60}$ alkyl groups, and the total number of carbon atoms of the one or more $C_1$-$C_{60}$ alkyl groups may be 6 or more.

For example, the total number of carbon atoms of the one or more $C_1$-$C_{60}$ alkyl groups included in the at least one of A(s) in the number of n1×n2 may be 6 to 40.

For example, the total number of carbon atoms of the one or more $C_1$-$C_{60}$ alkyl groups included in the at least one of A(s) in the number of n1×n2 may be 6 to 30.

In one or more embodiments, the charge transport material may be a group represented by Formulae 1-1 to 1-10.

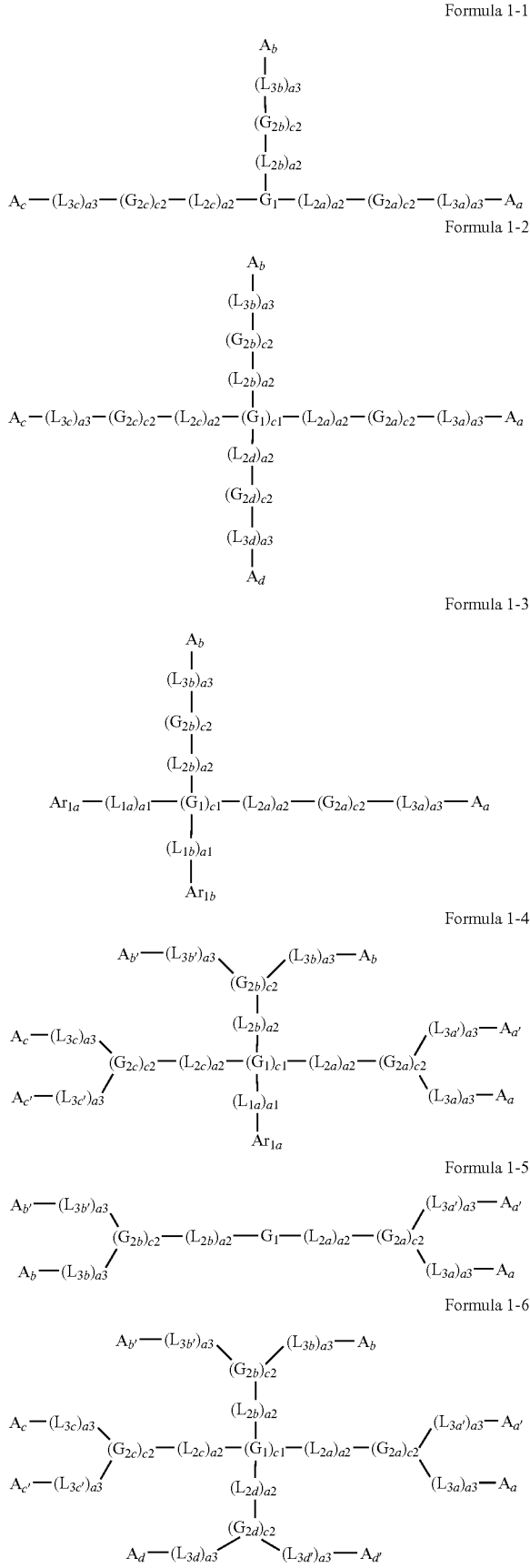
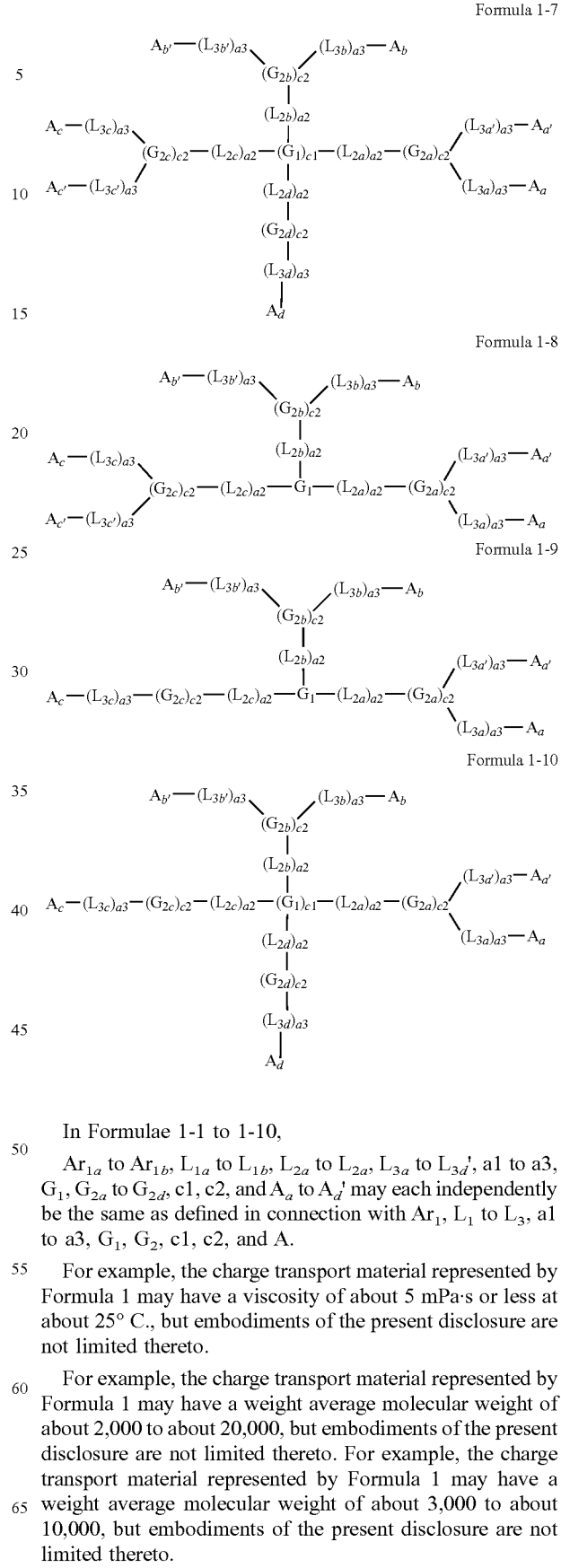

In Formulae 1-1 to 1-10, $Ar_{1a}$ to $Ar_{1b}$, $L_{1a}$ to $L_{1b}$, $L_{2a}$ to $L_{2a}$, $L_{3a}$ to $L_{3d}'$, a1 to a3, $G_1$, $G_{2a}$ to $G_{2d}$, c1, c2, and $A_a$ to $A_d'$ may each independently be the same as defined in connection with $Ar_1$, $L_1$ to $L_3$, a1 to a3, $G_1$, $G_2$, c1, c2, and A.

For example, the charge transport material represented by Formula 1 may have a viscosity of about 5 mPa·s or less at about 25° C., but embodiments of the present disclosure are not limited thereto.

For example, the charge transport material represented by Formula 1 may have a weight average molecular weight of about 2,000 to about 20,000, but embodiments of the present disclosure are not limited thereto. For example, the charge transport material represented by Formula 1 may have a weight average molecular weight of about 3,000 to about 10,000, but embodiments of the present disclosure are not limited thereto.

In one or more embodiments, the charge transport material represented by Formula 1 may be at least one of Compounds 1 to 23, but embodiments of the present disclosure are not limited thereto:

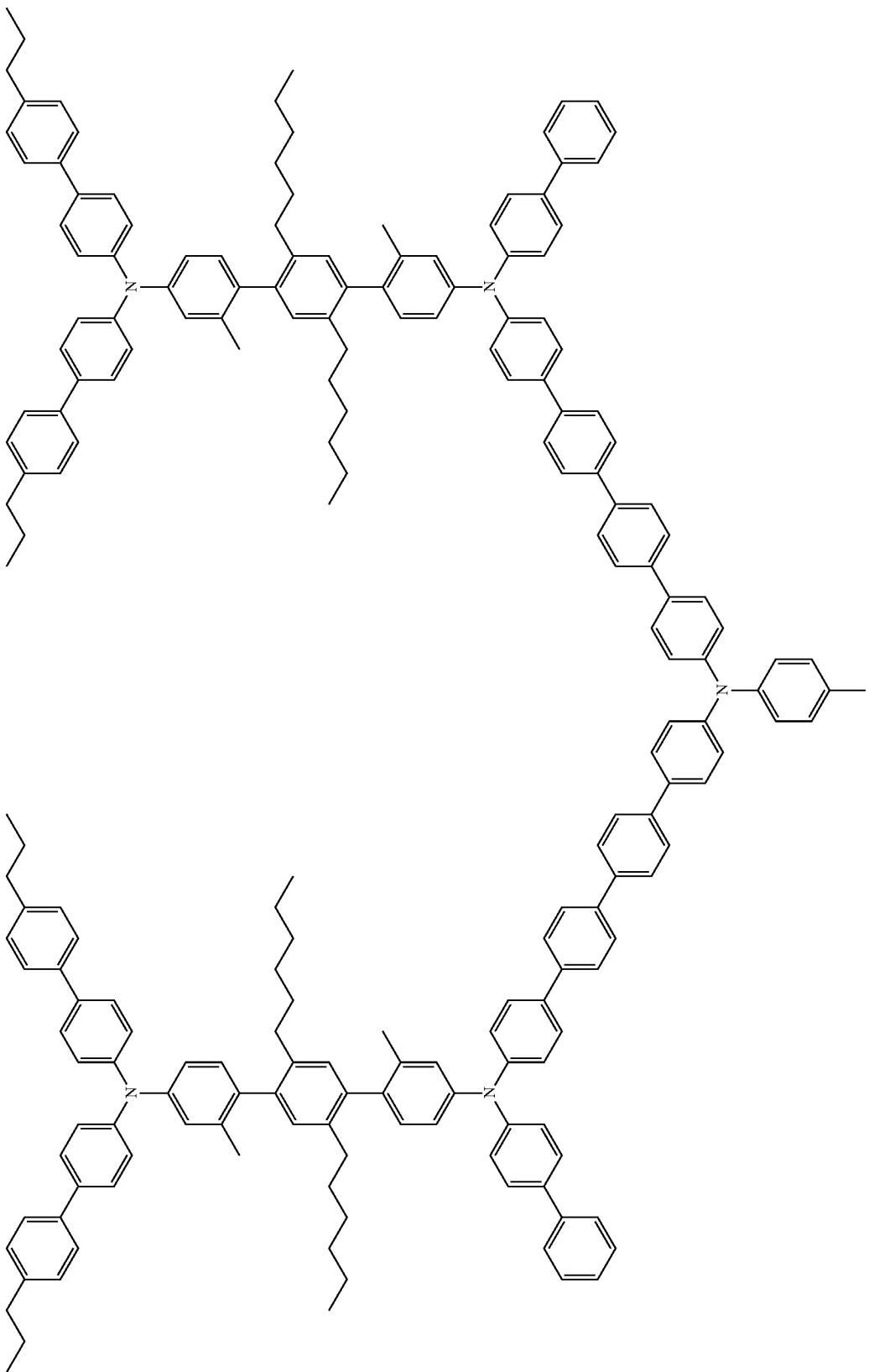

-continued
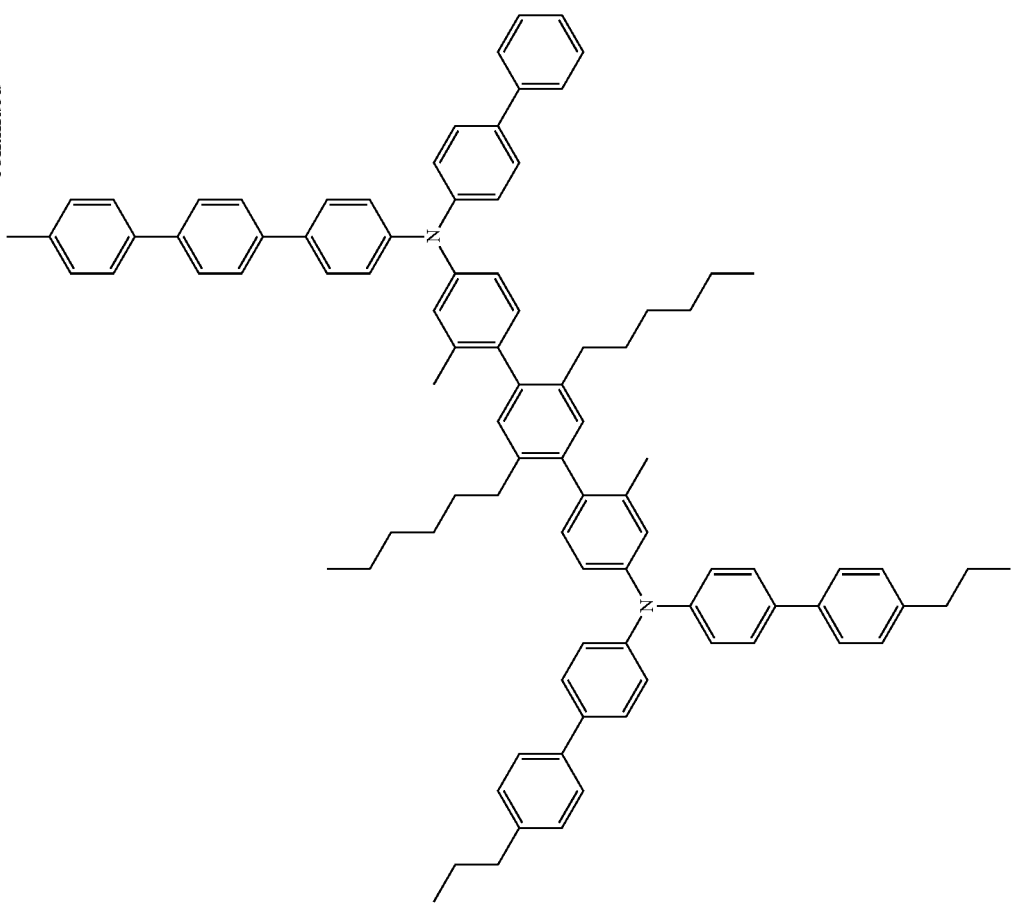

-continued
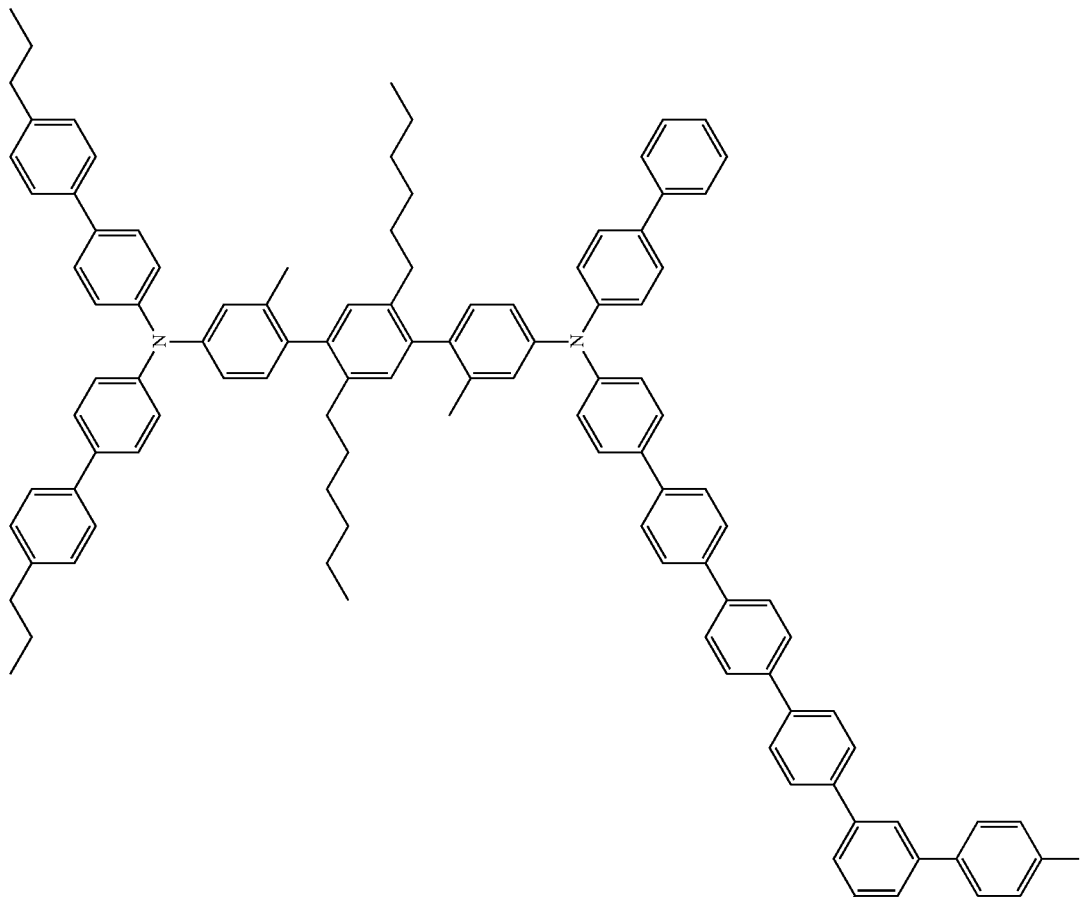
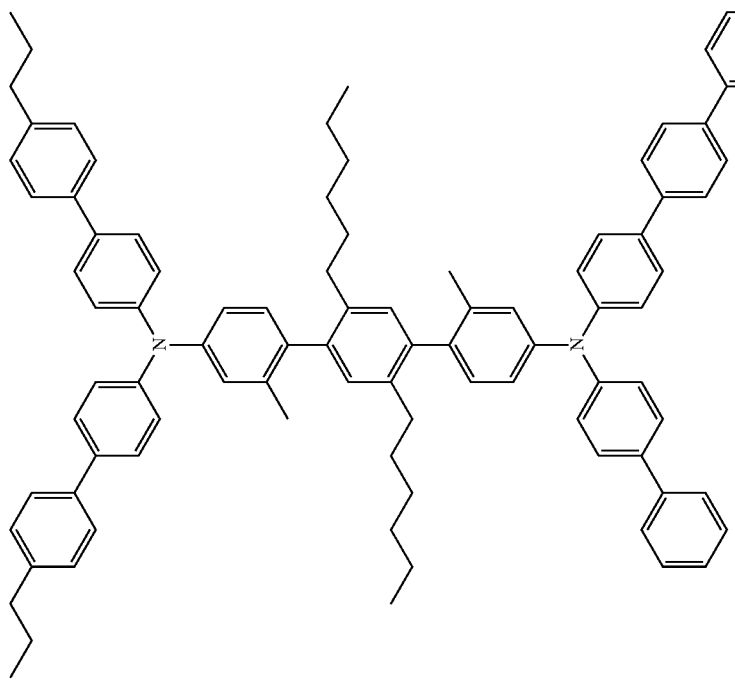

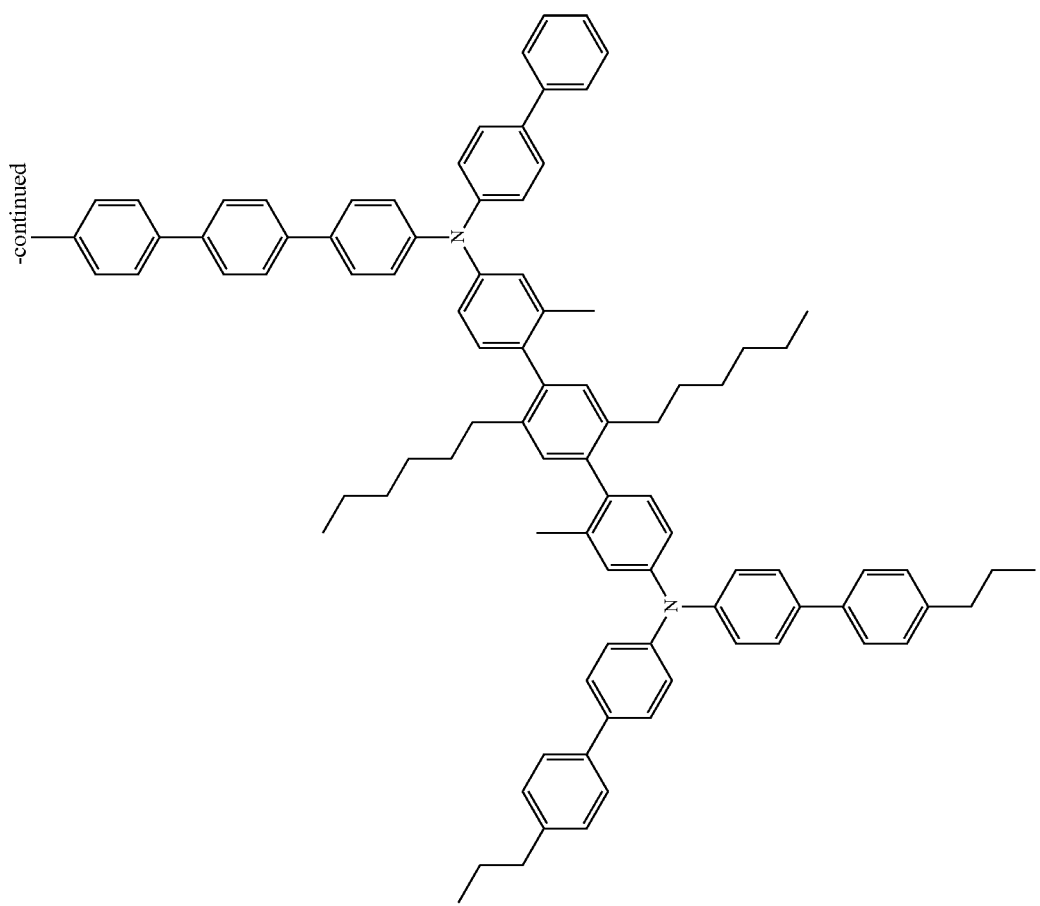

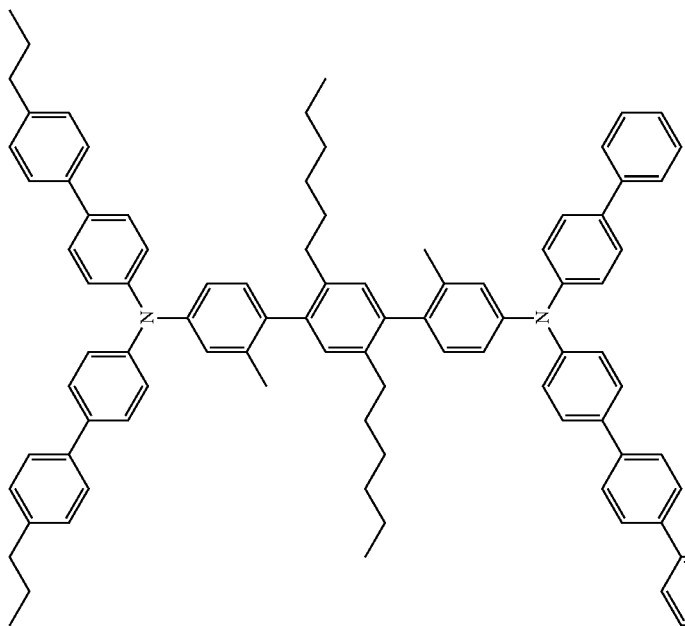
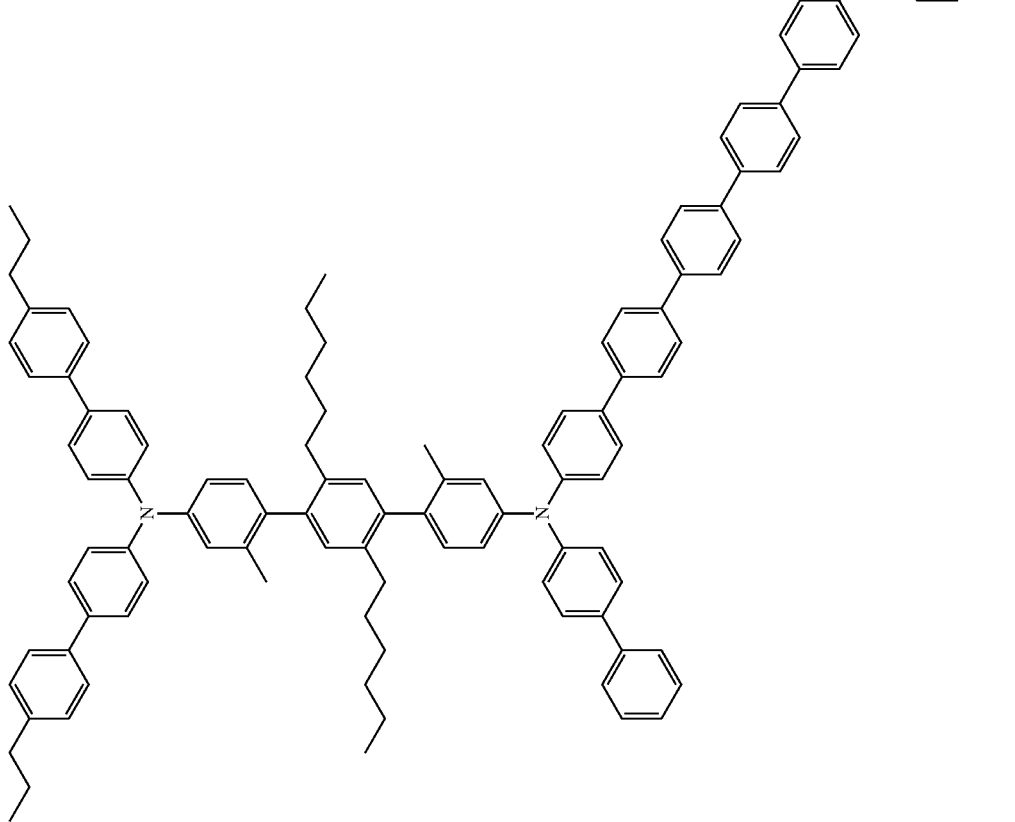

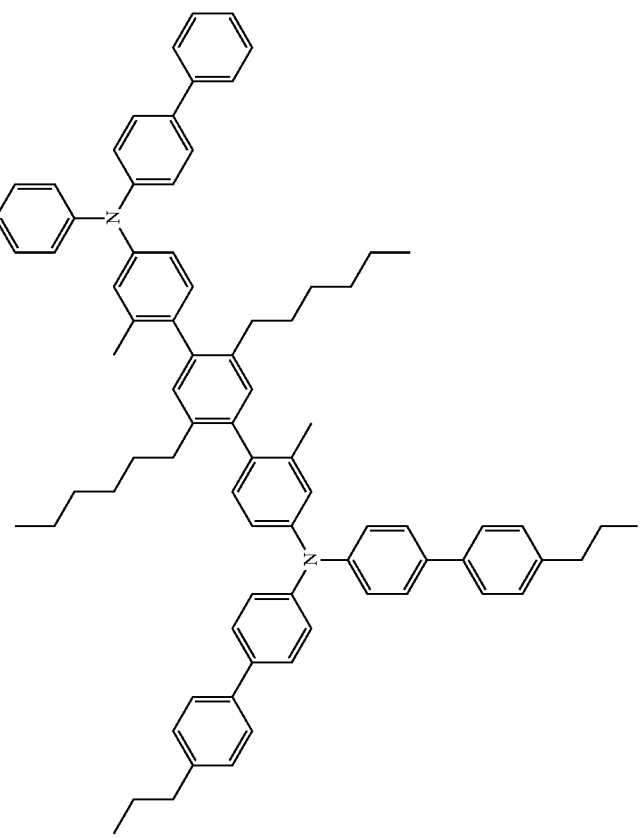

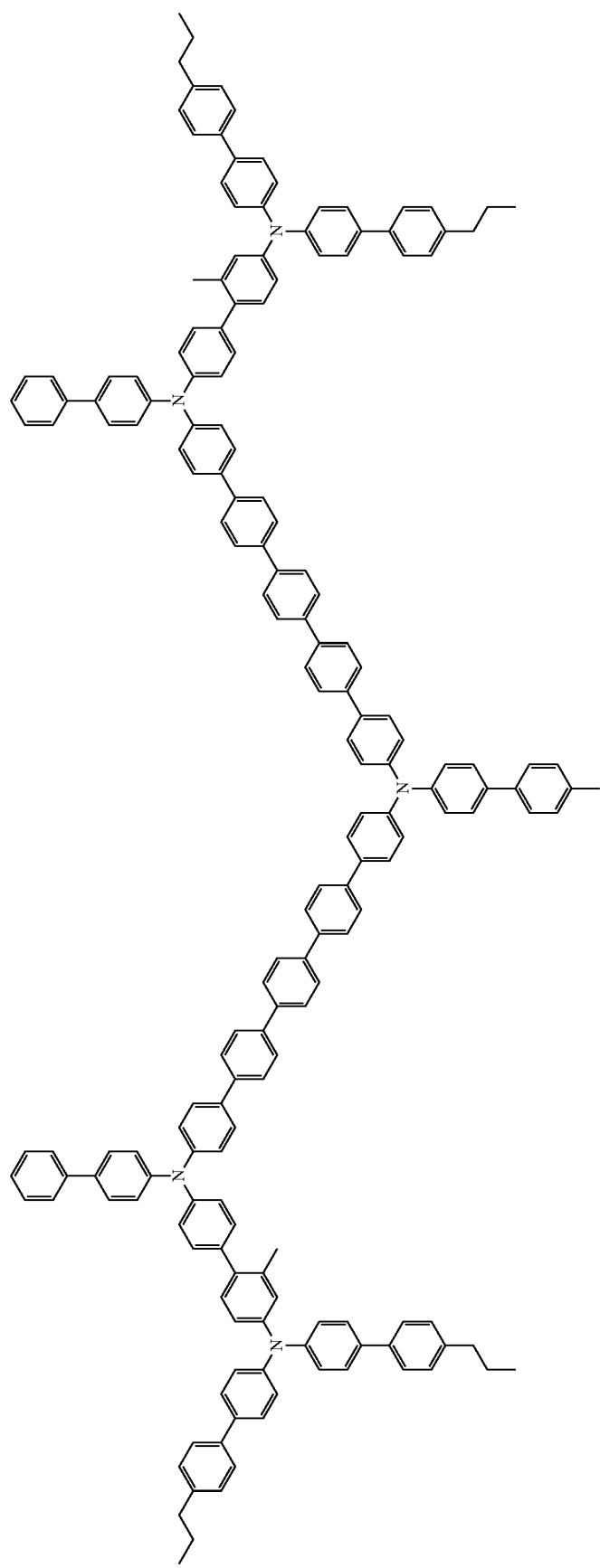

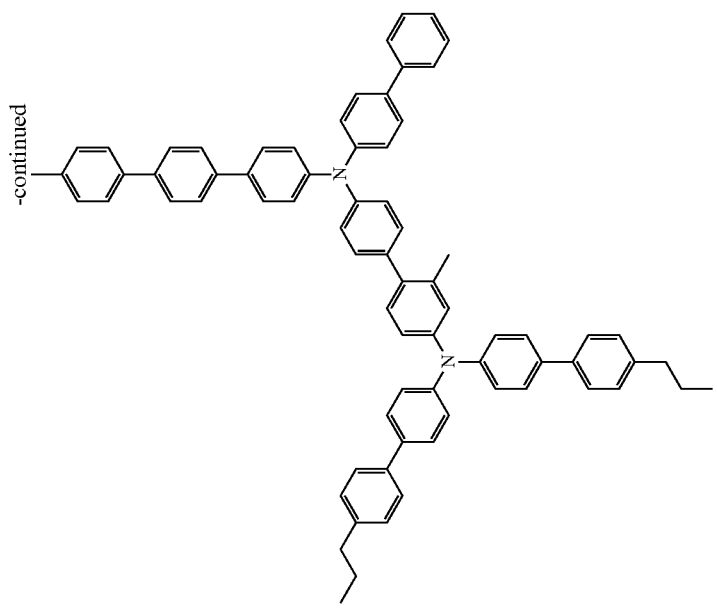

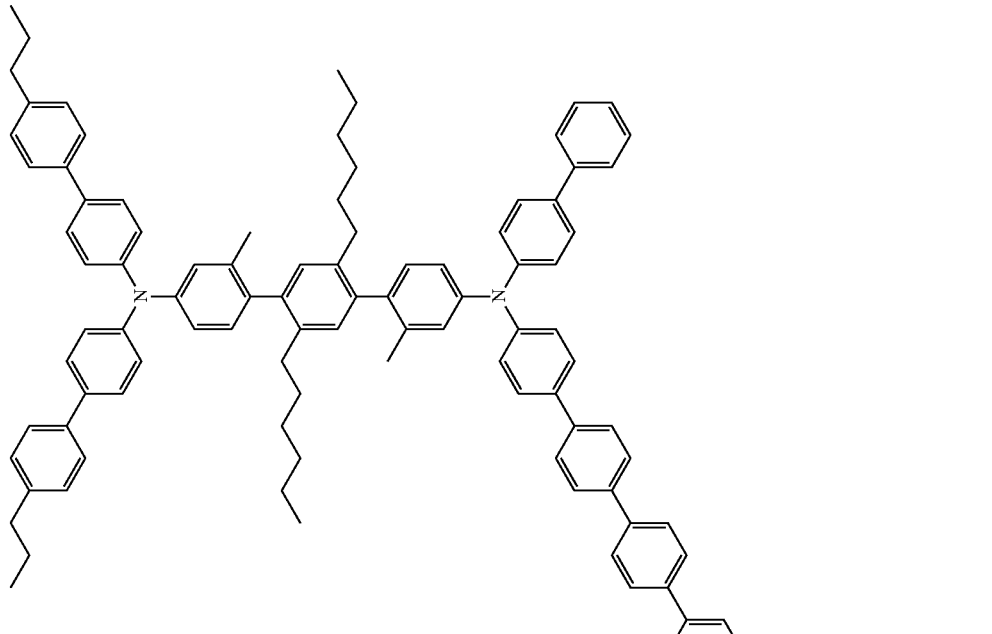
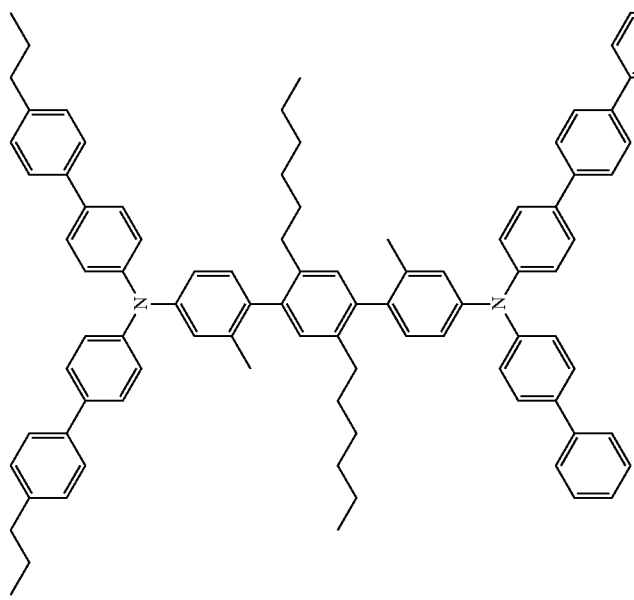

-continued
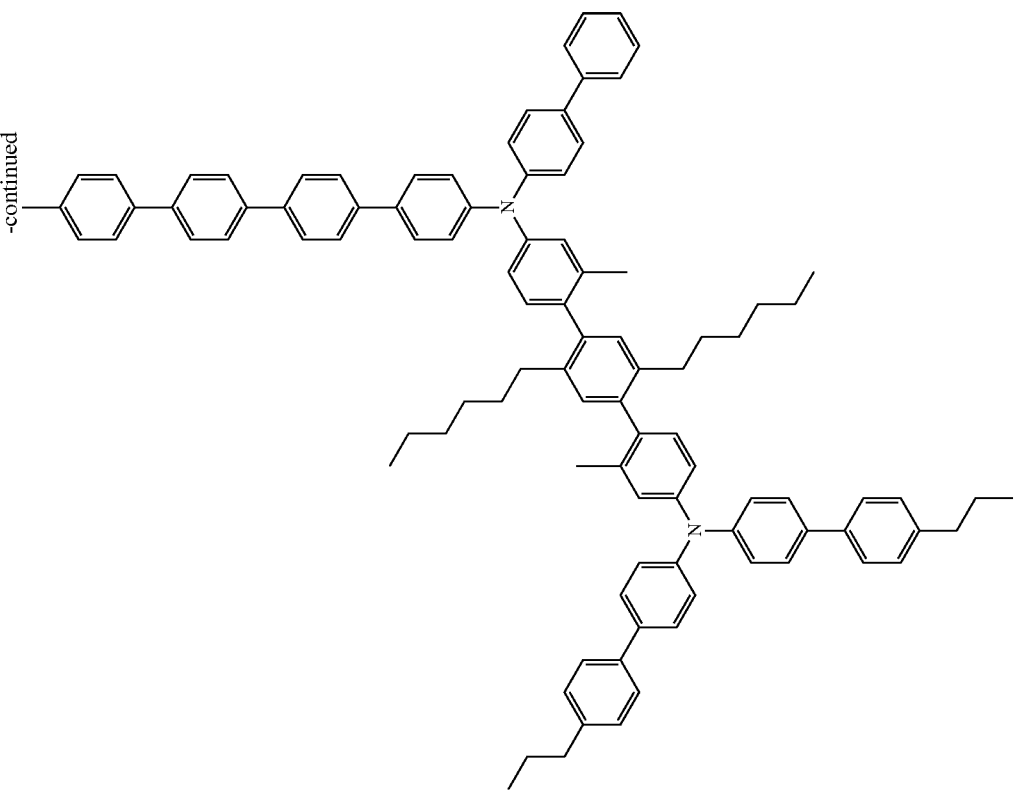

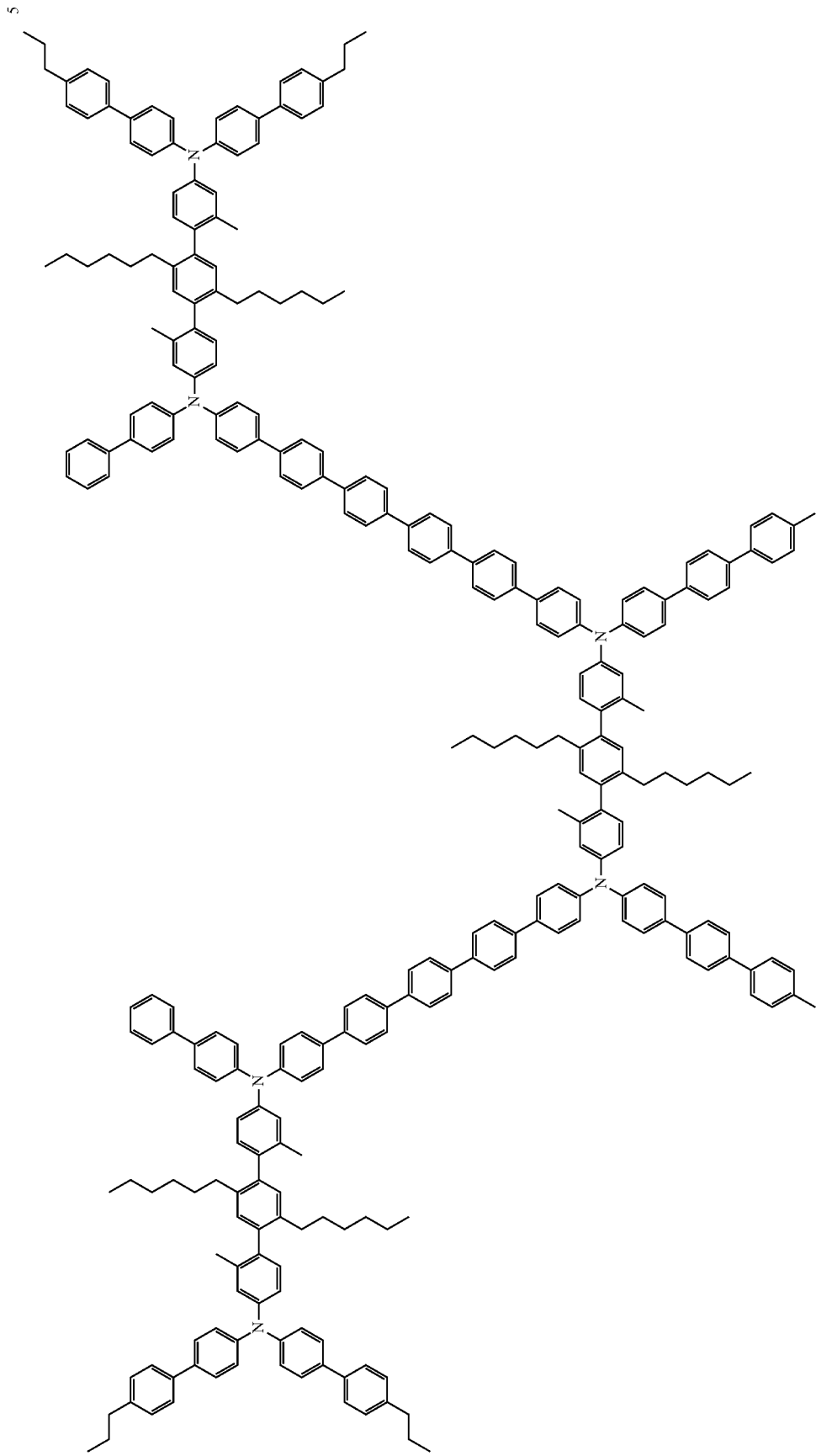

-continued
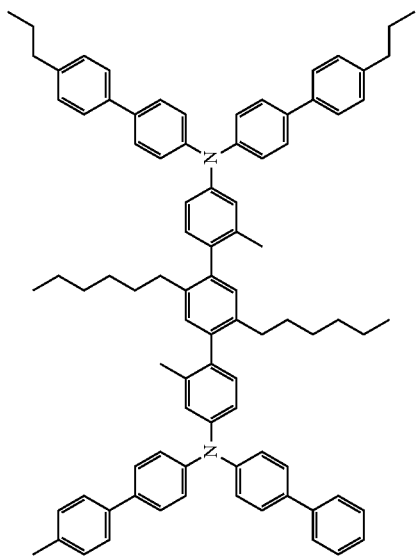
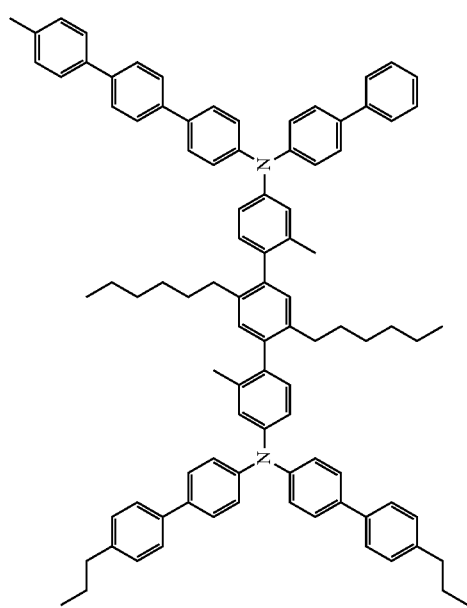

-continued
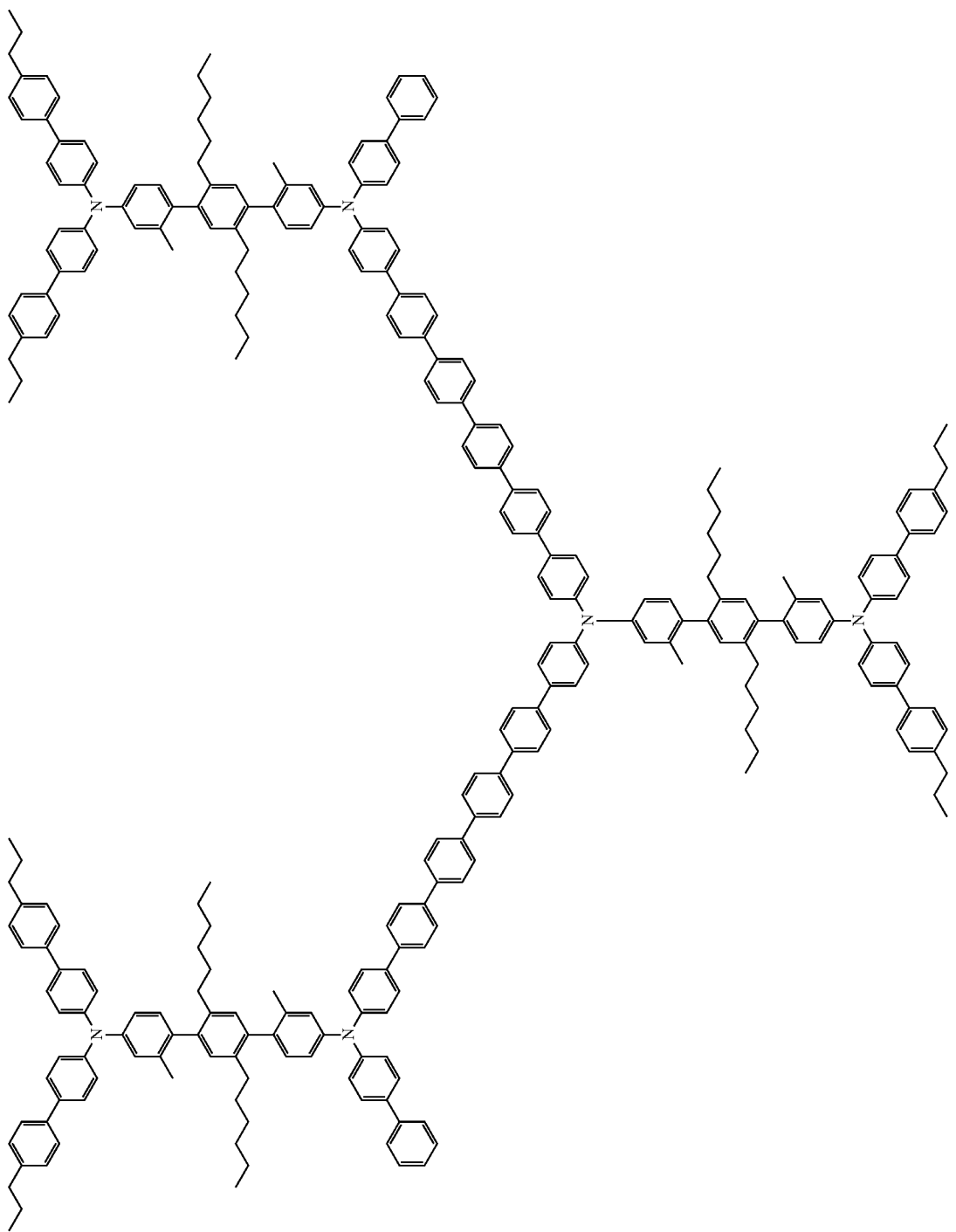

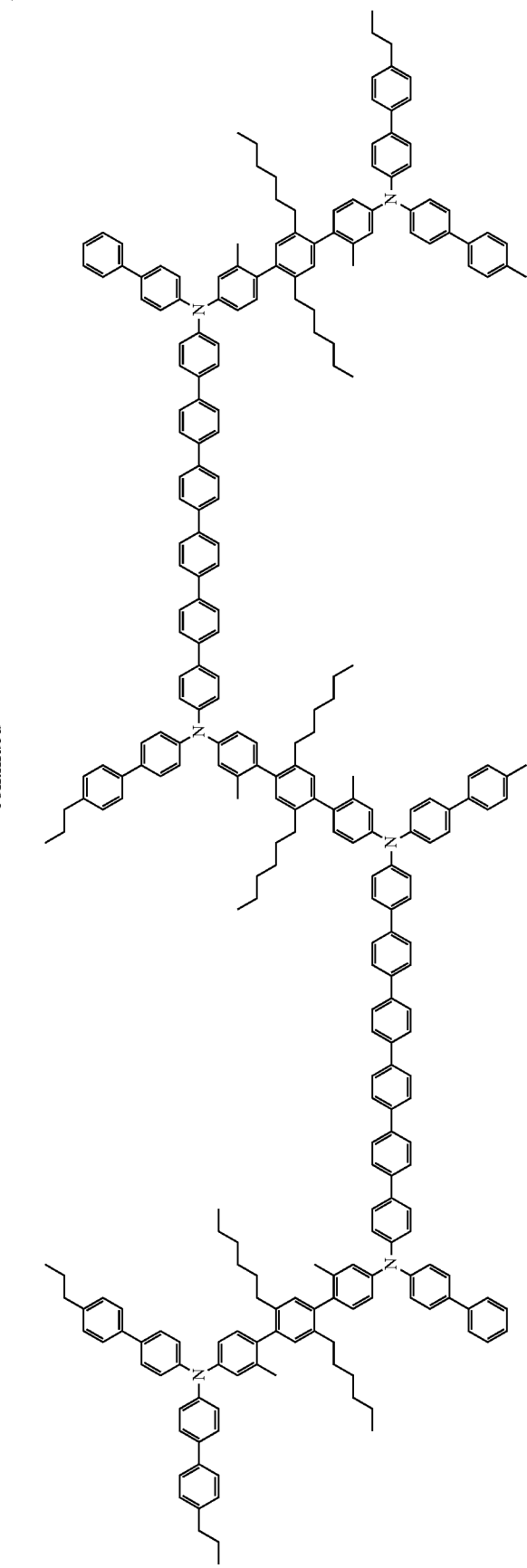

-continued
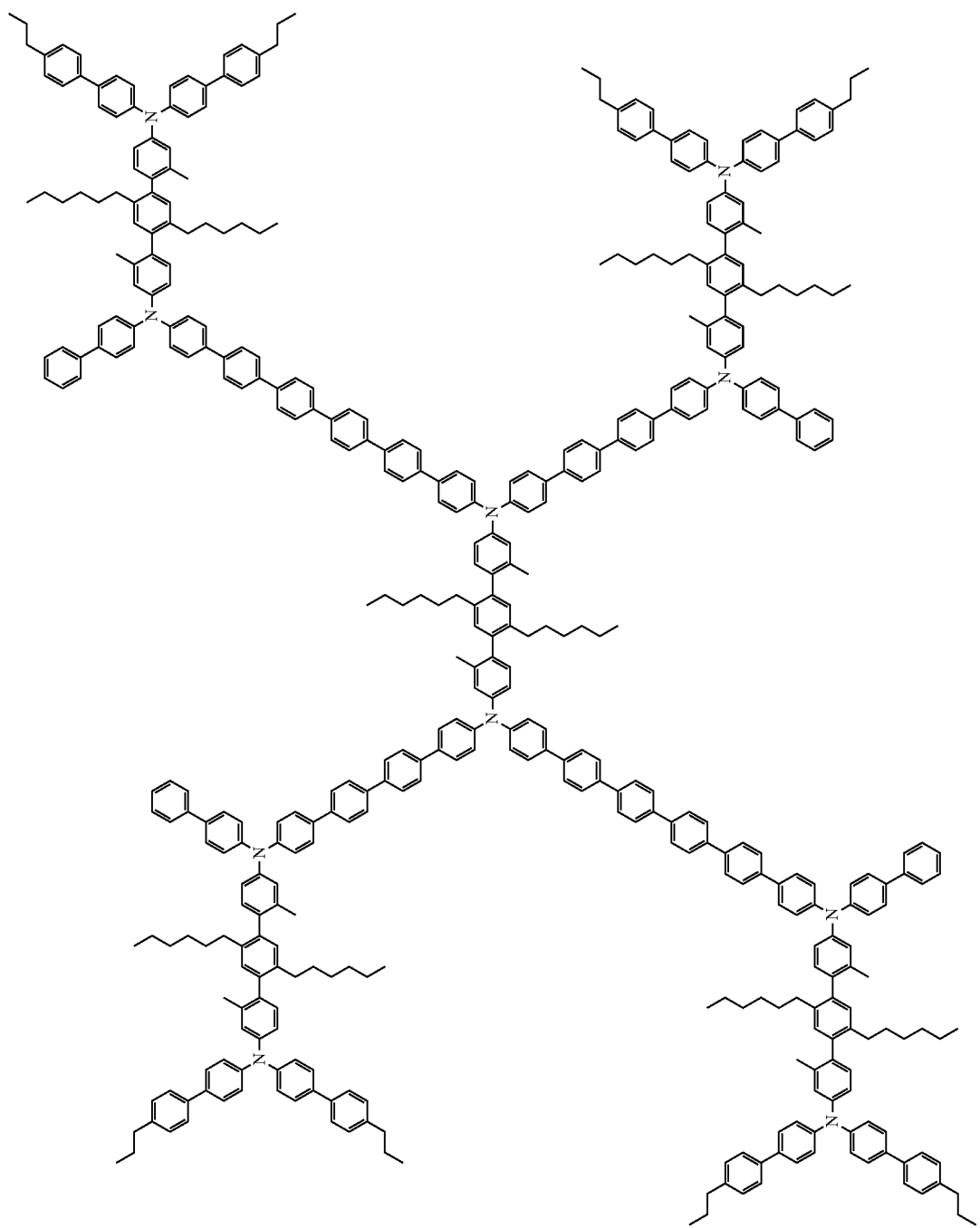

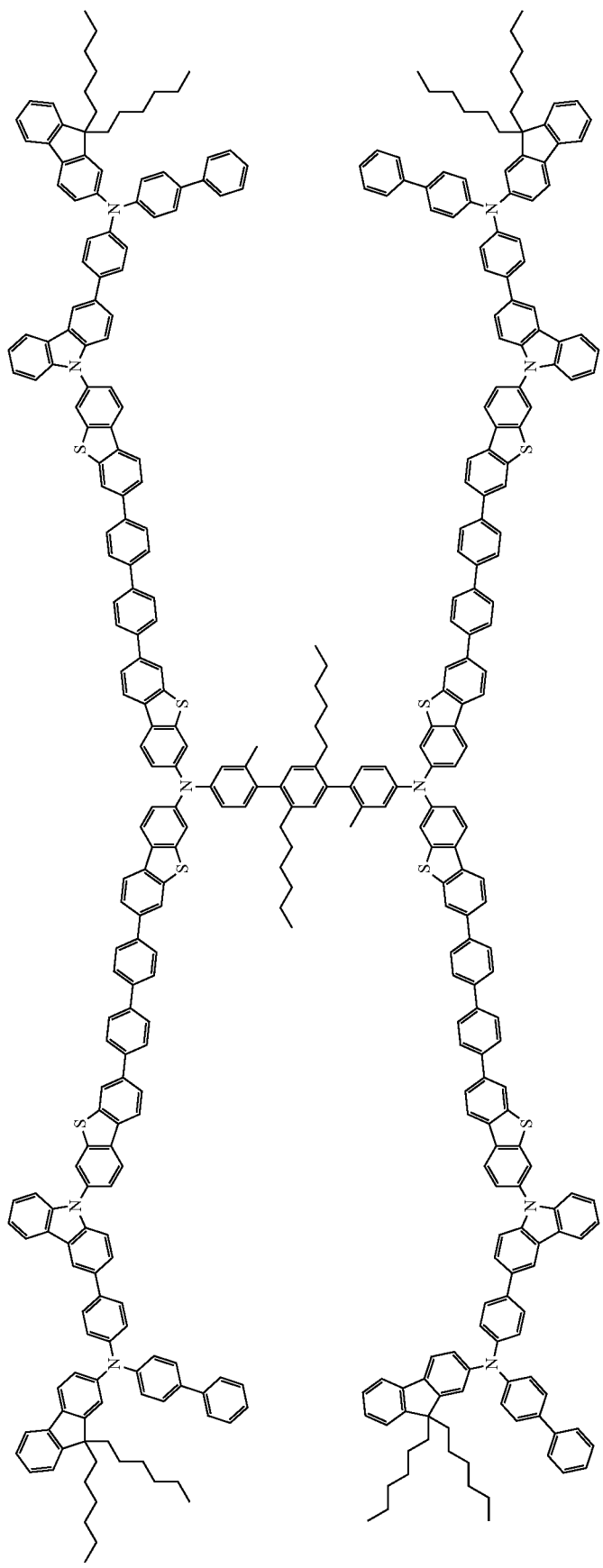

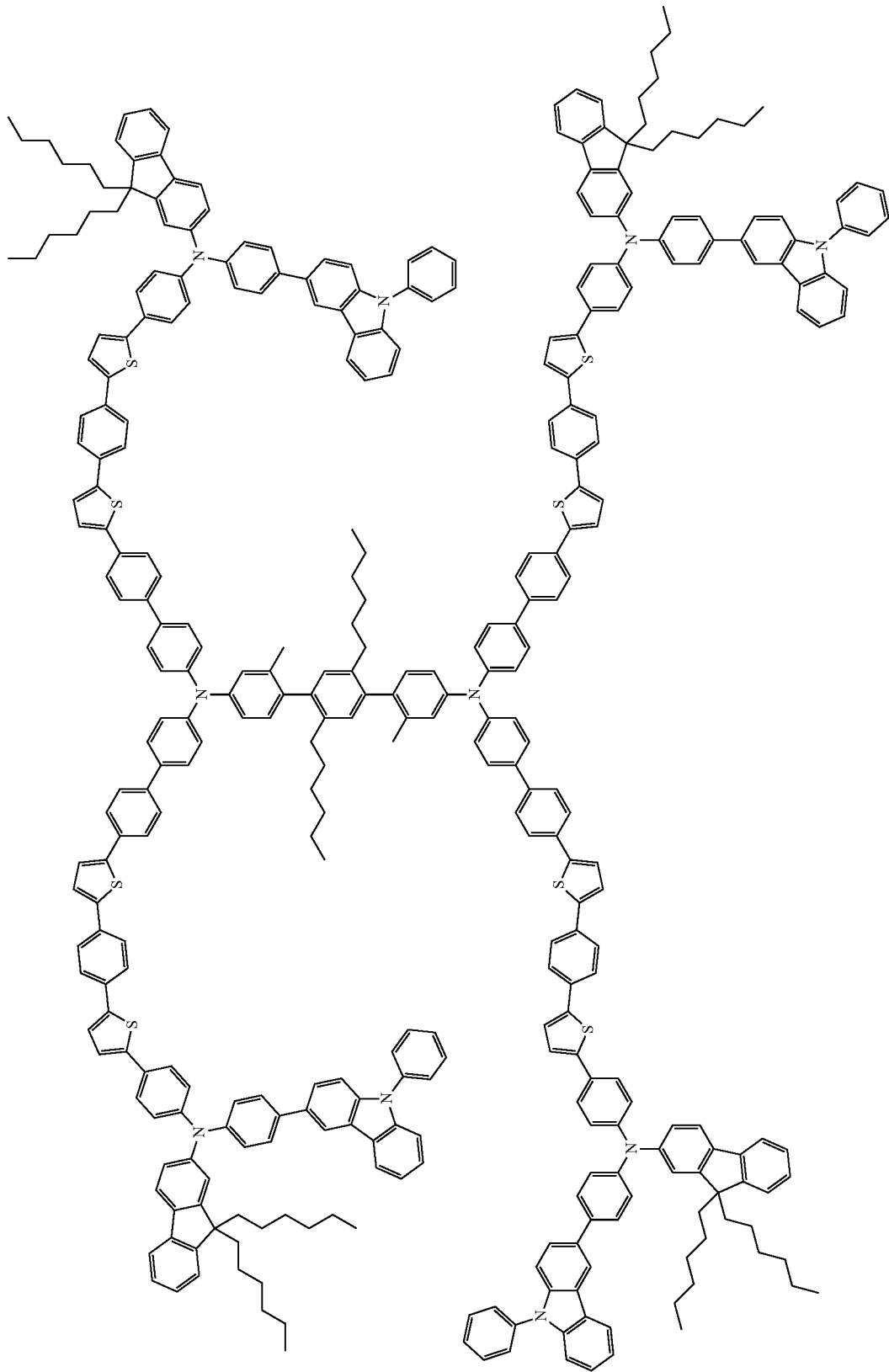

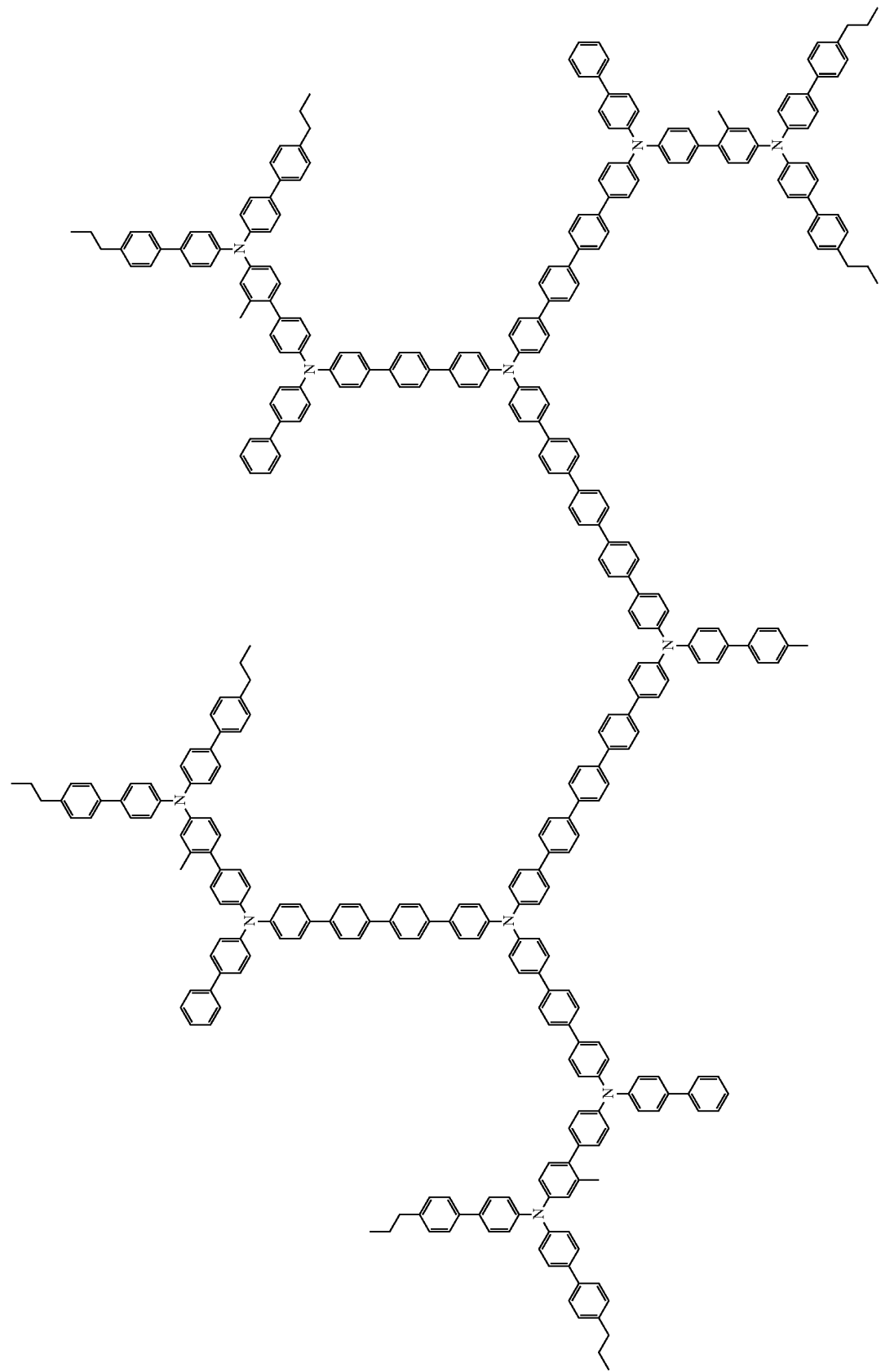

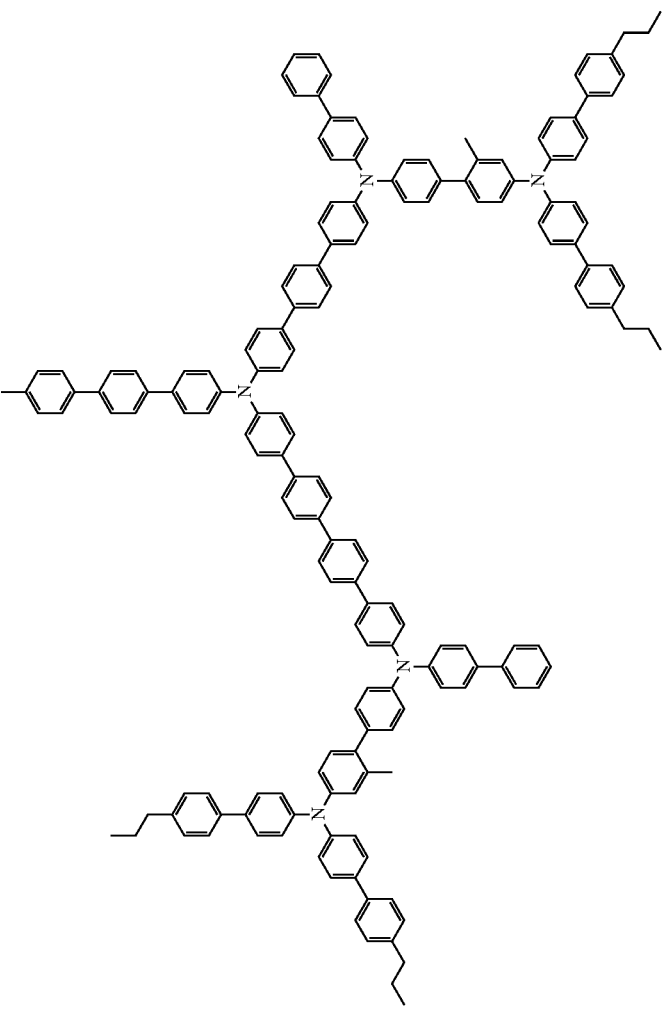

-continued
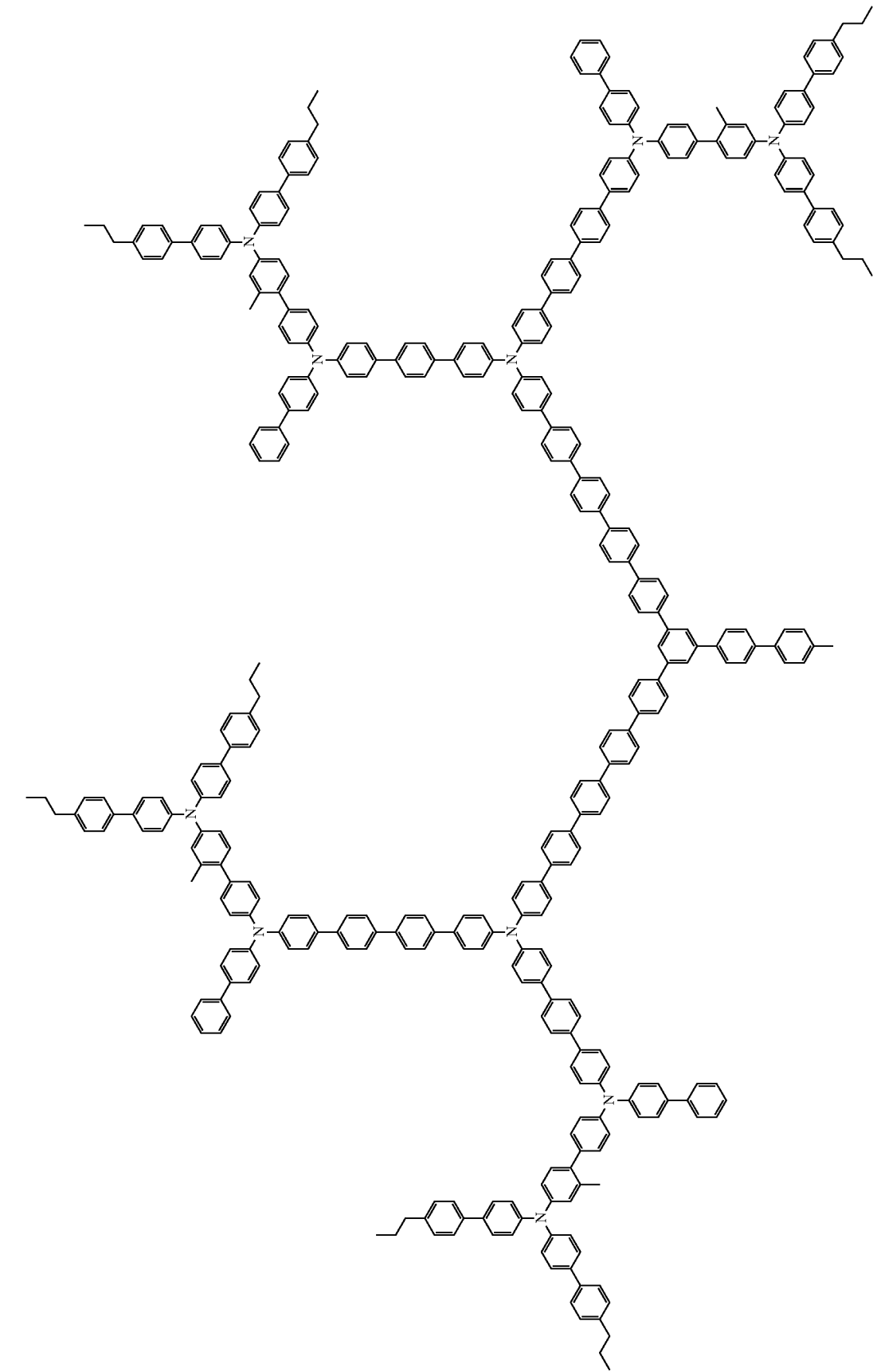

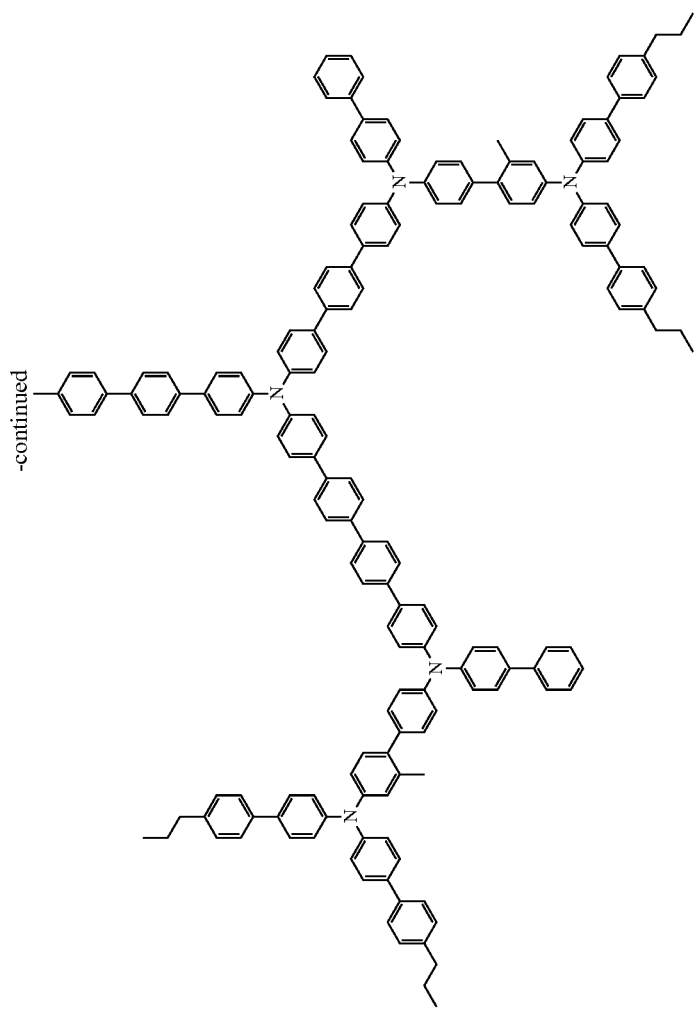

-continued
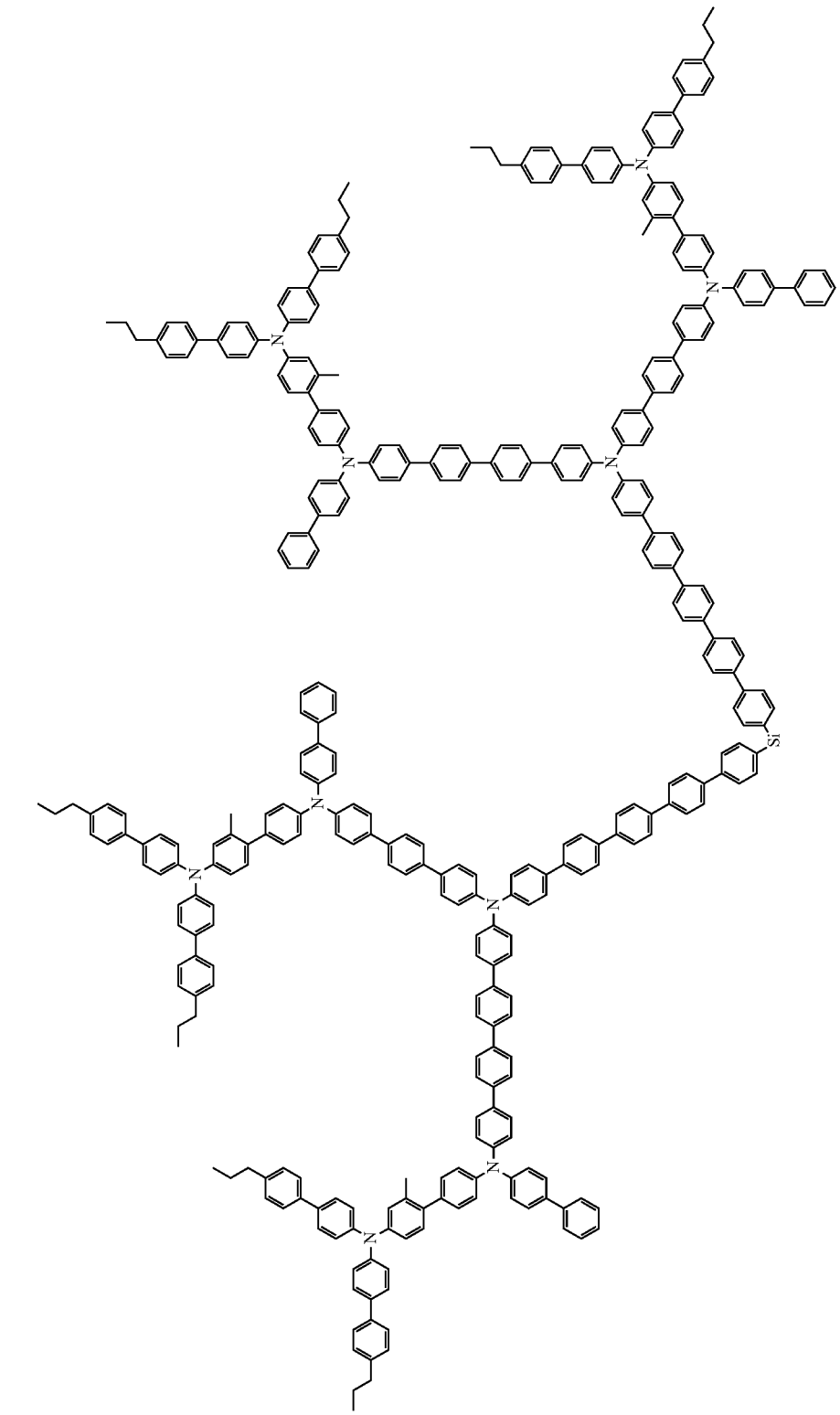

-continued
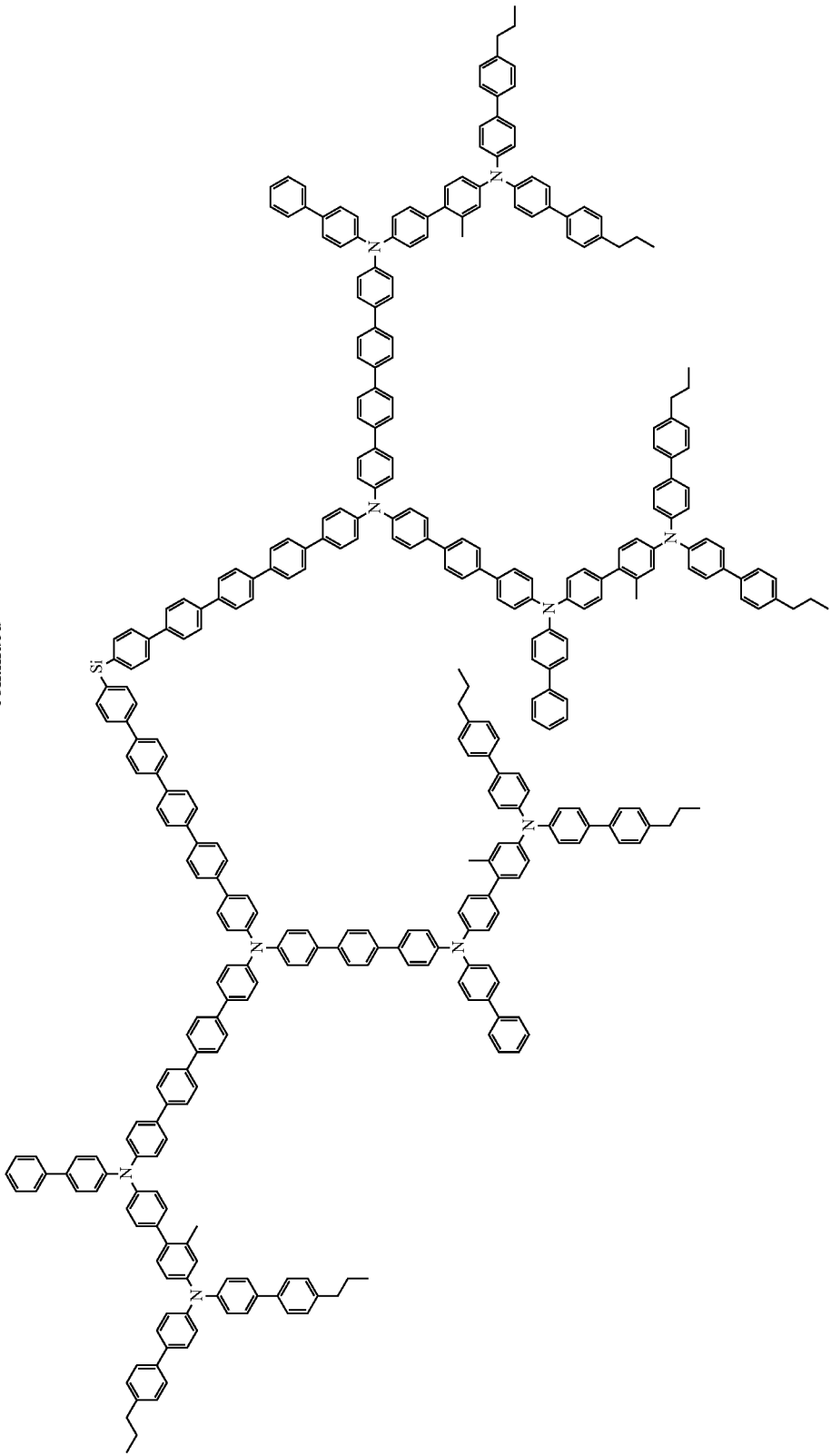

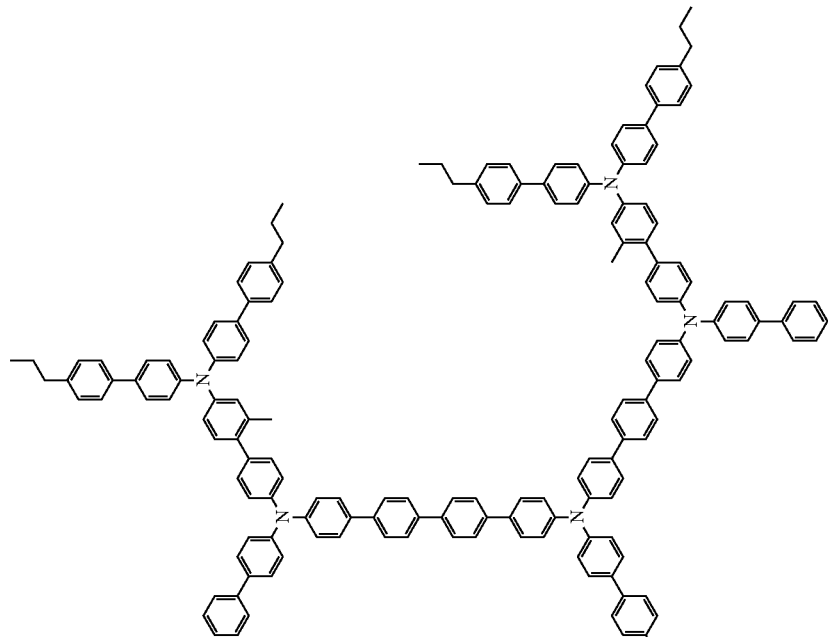
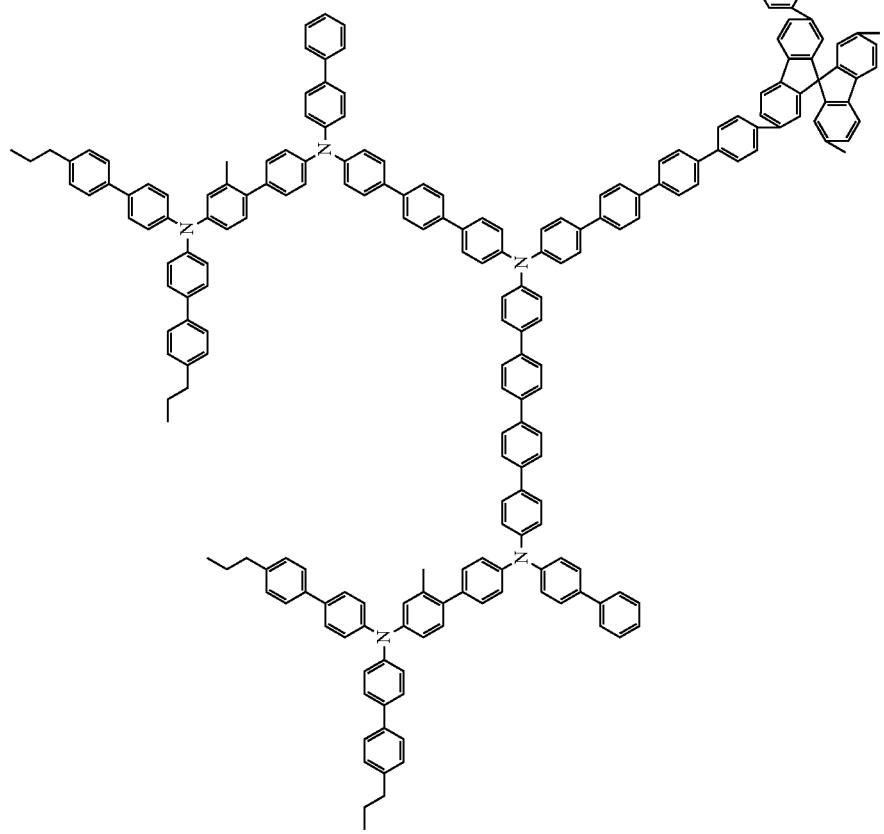

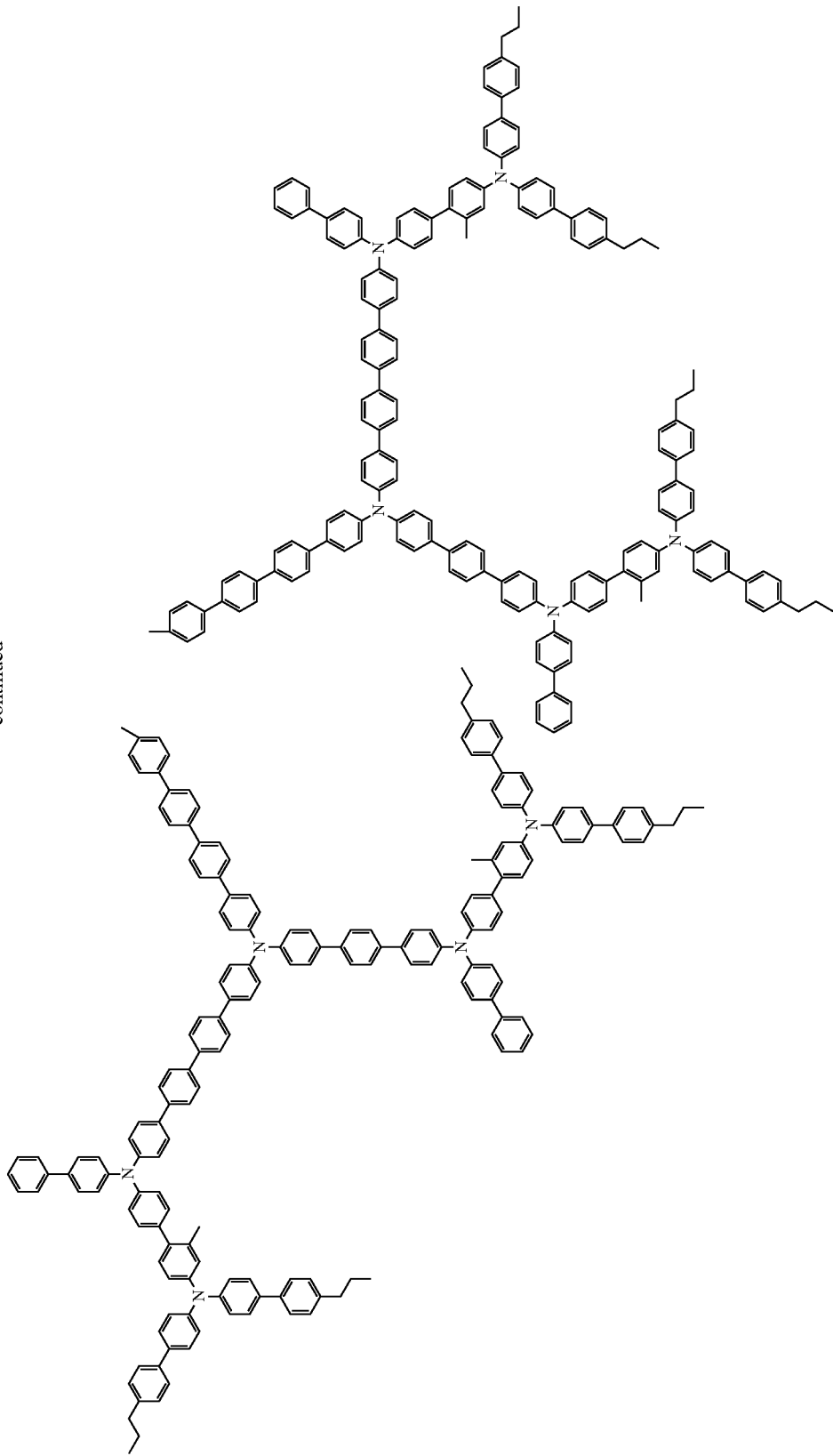

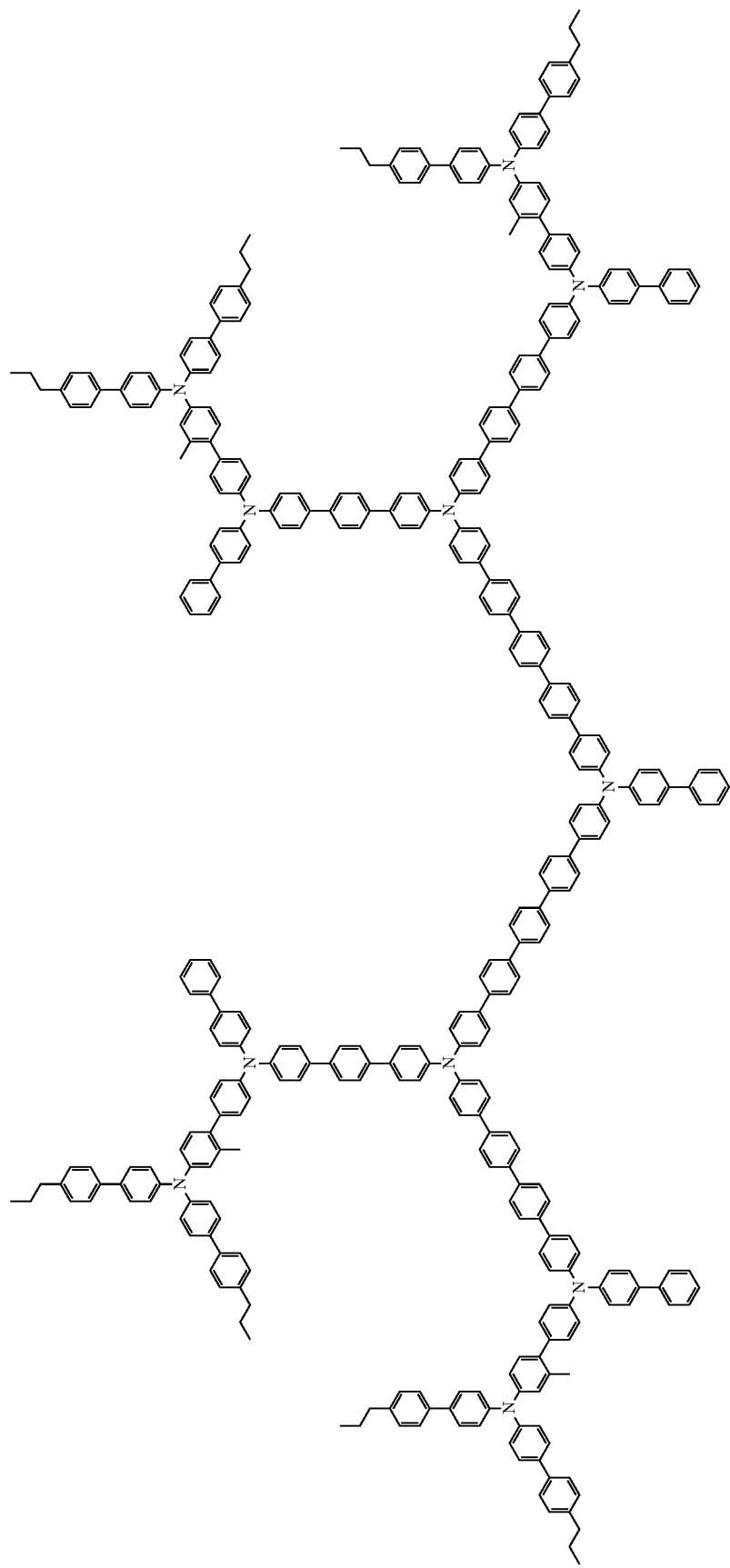

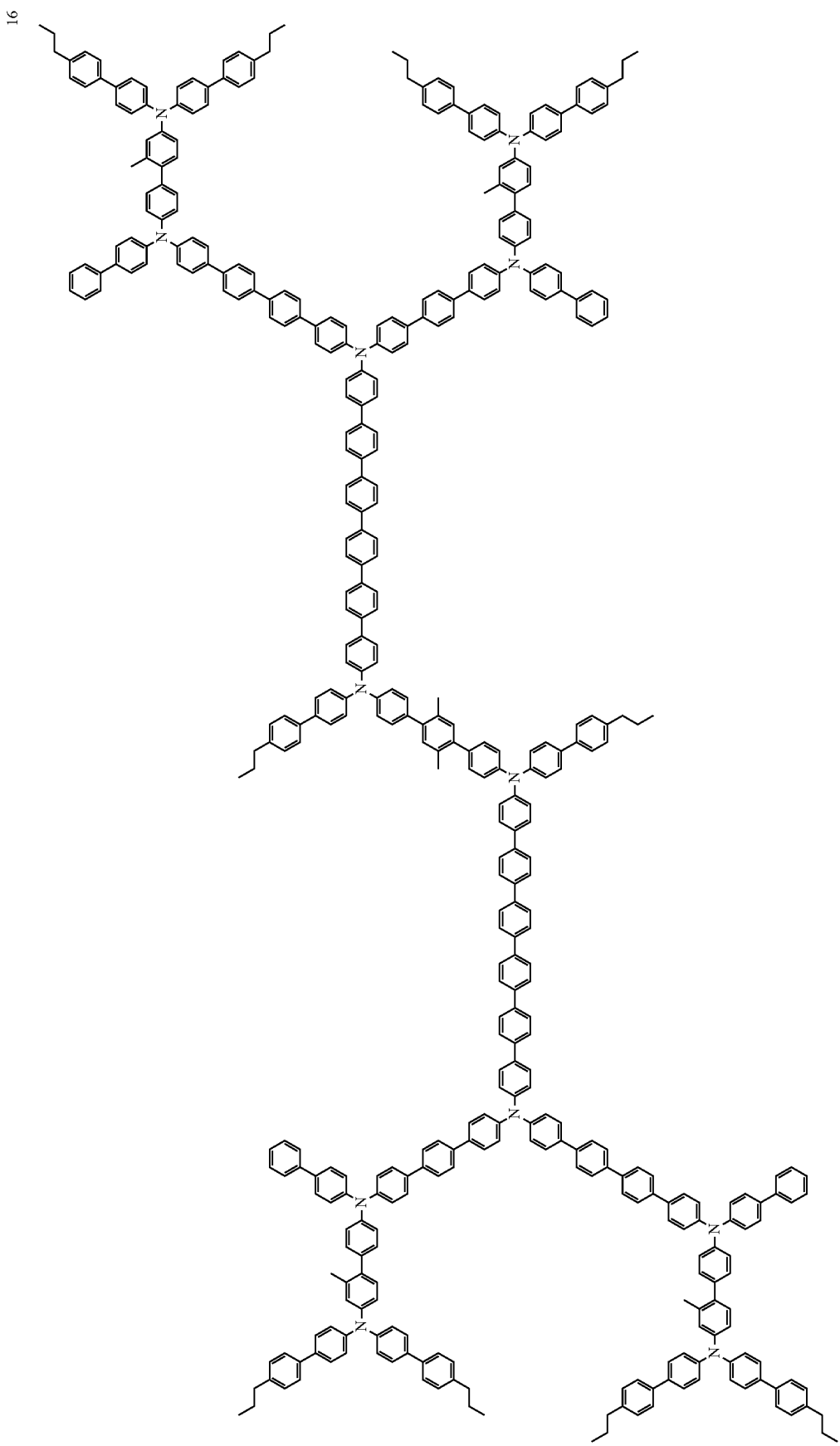

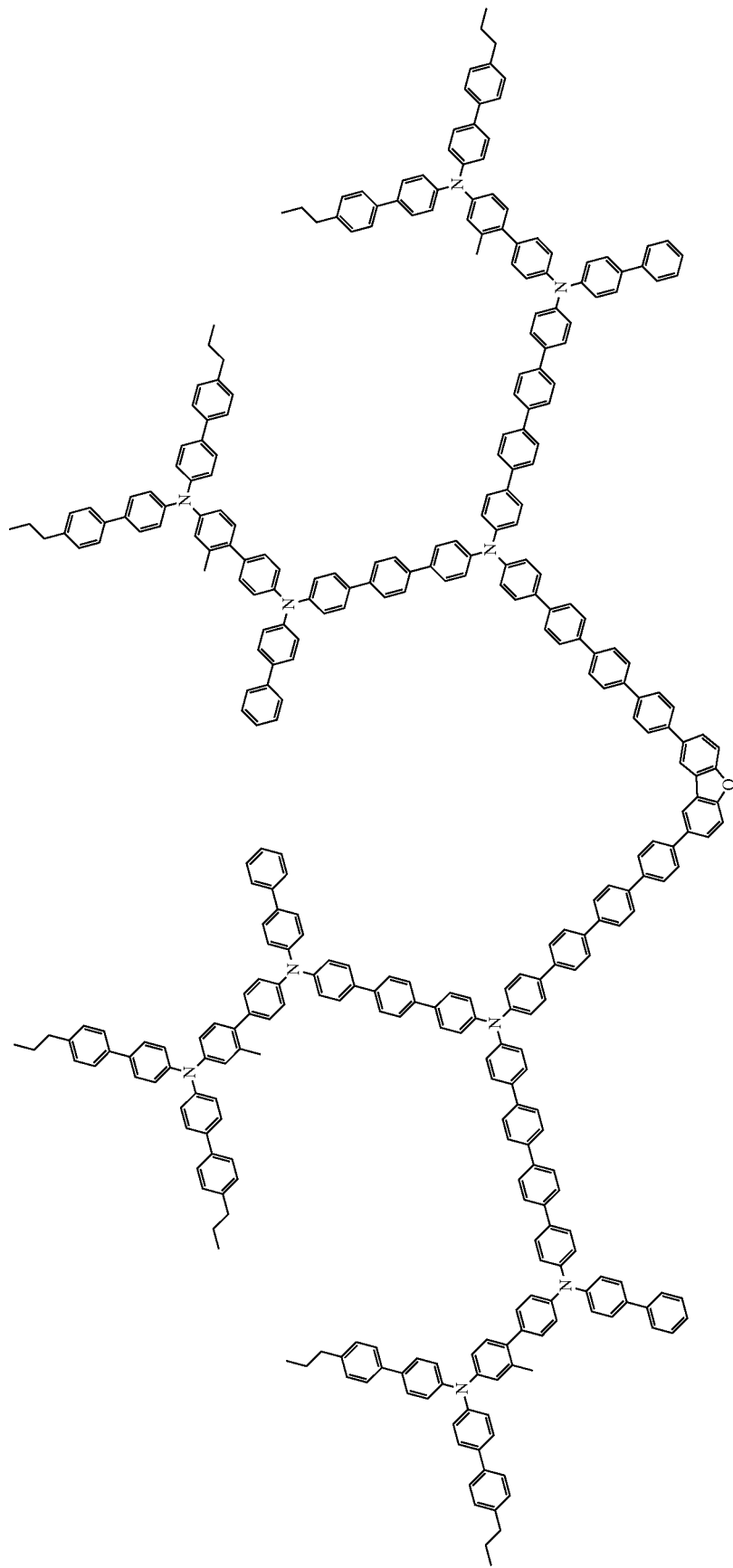

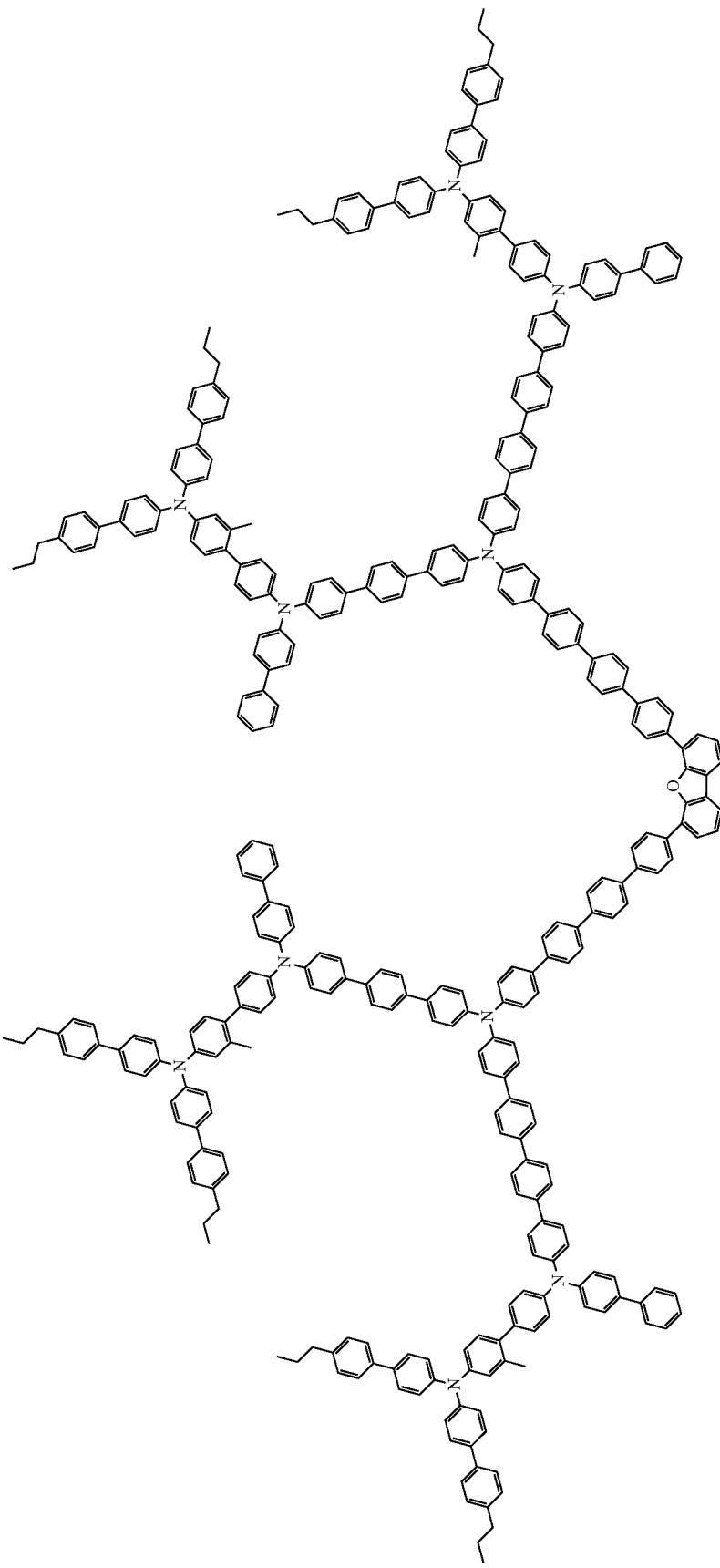

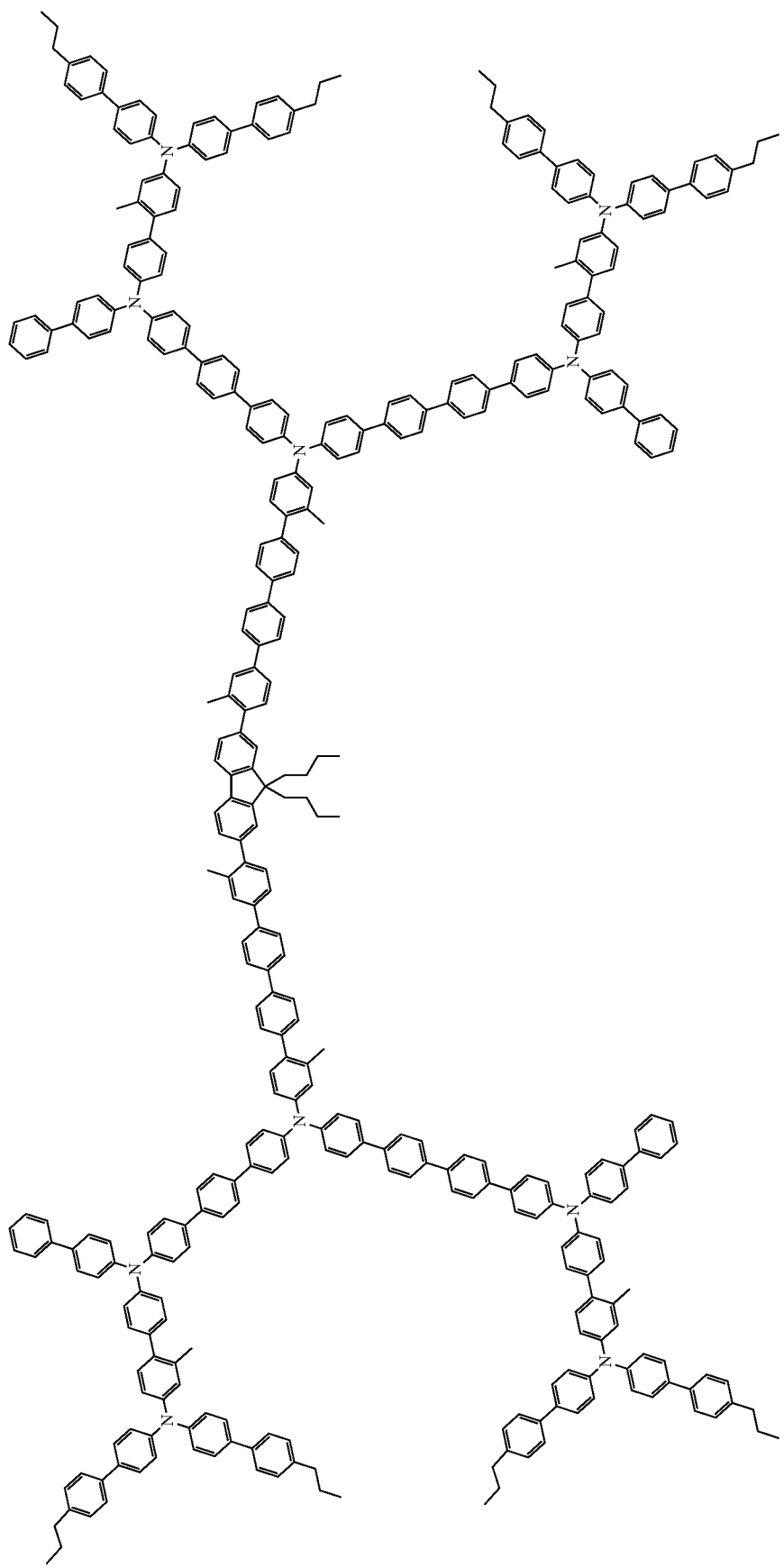

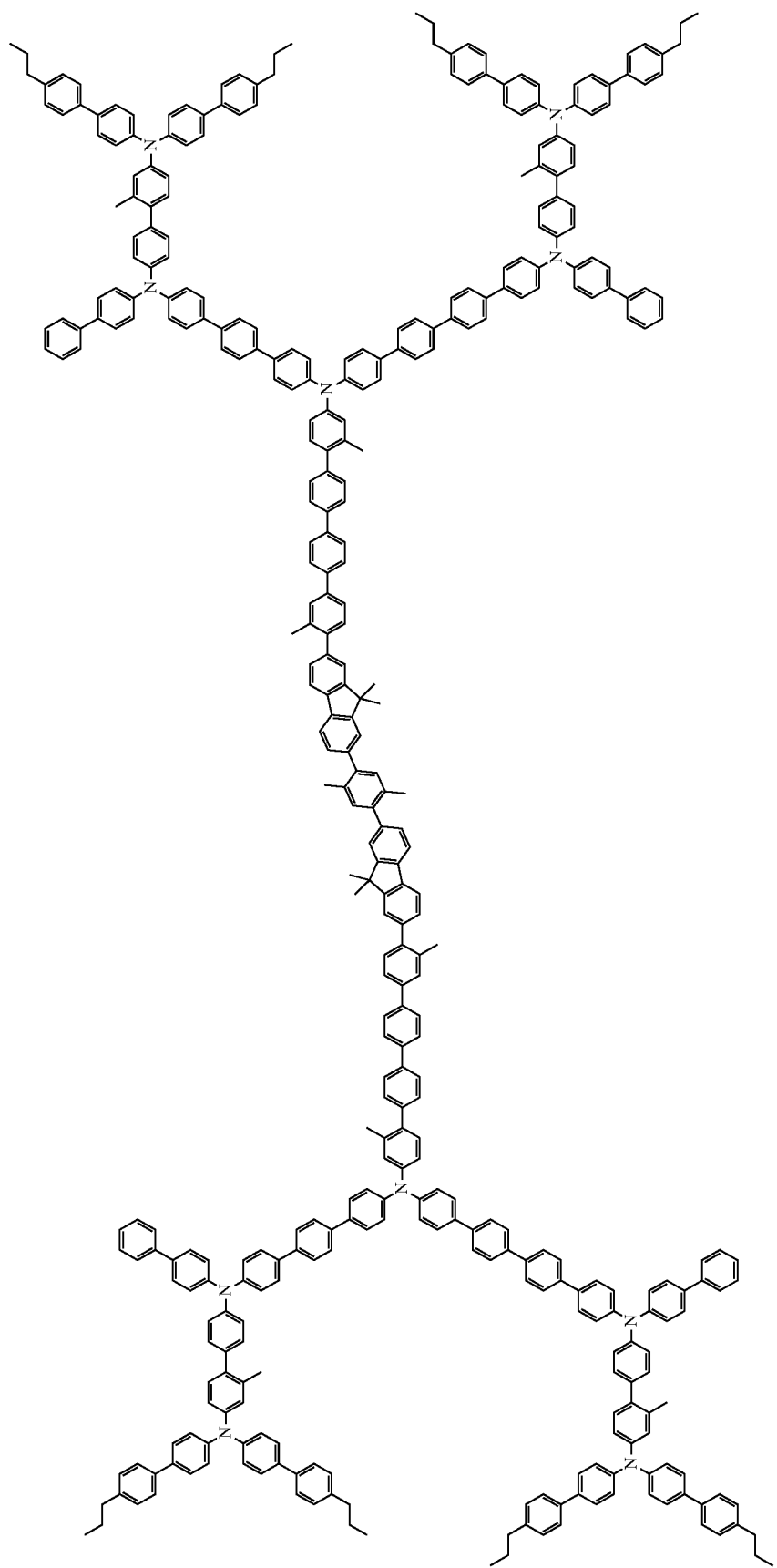

-continued
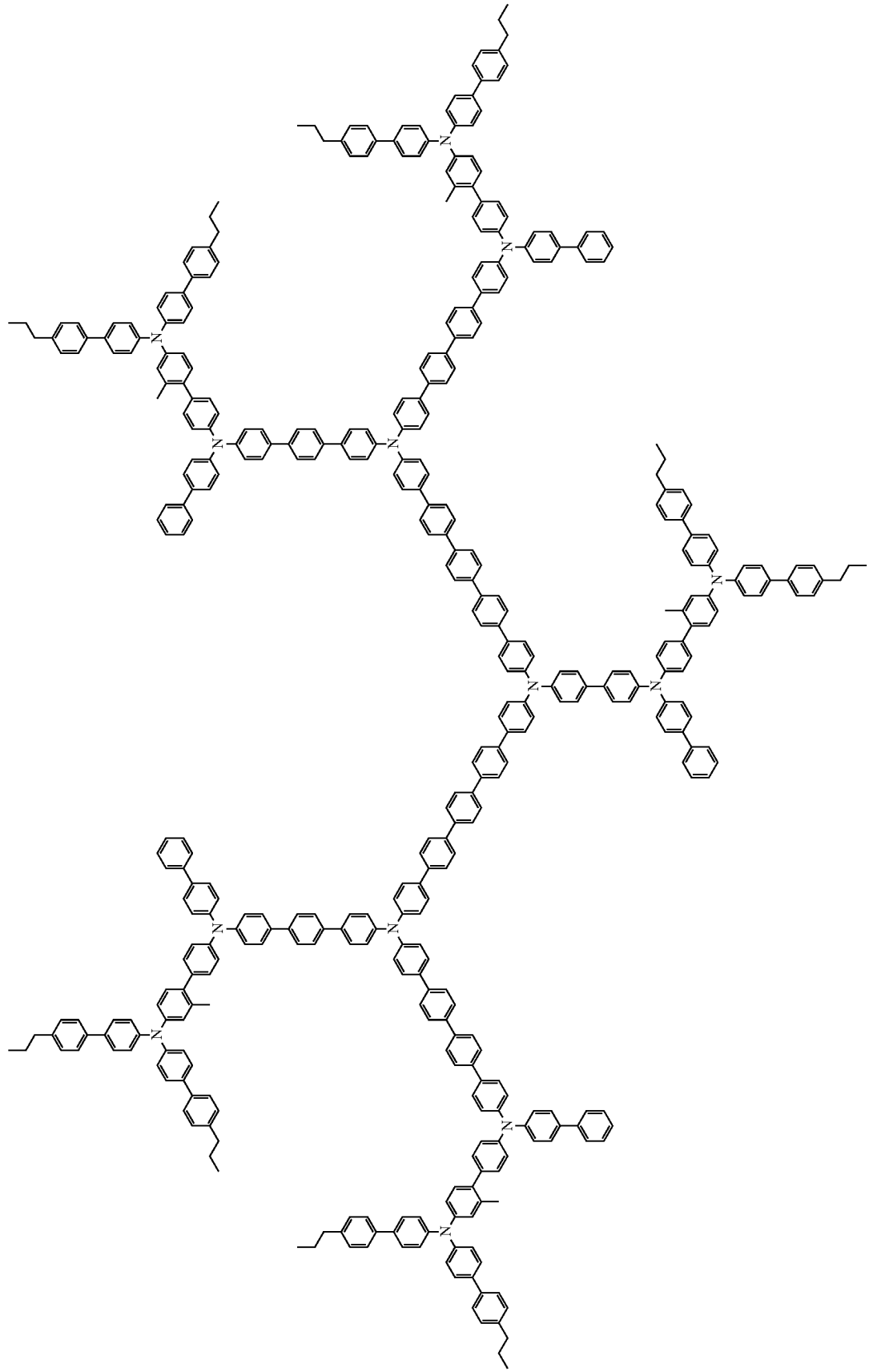

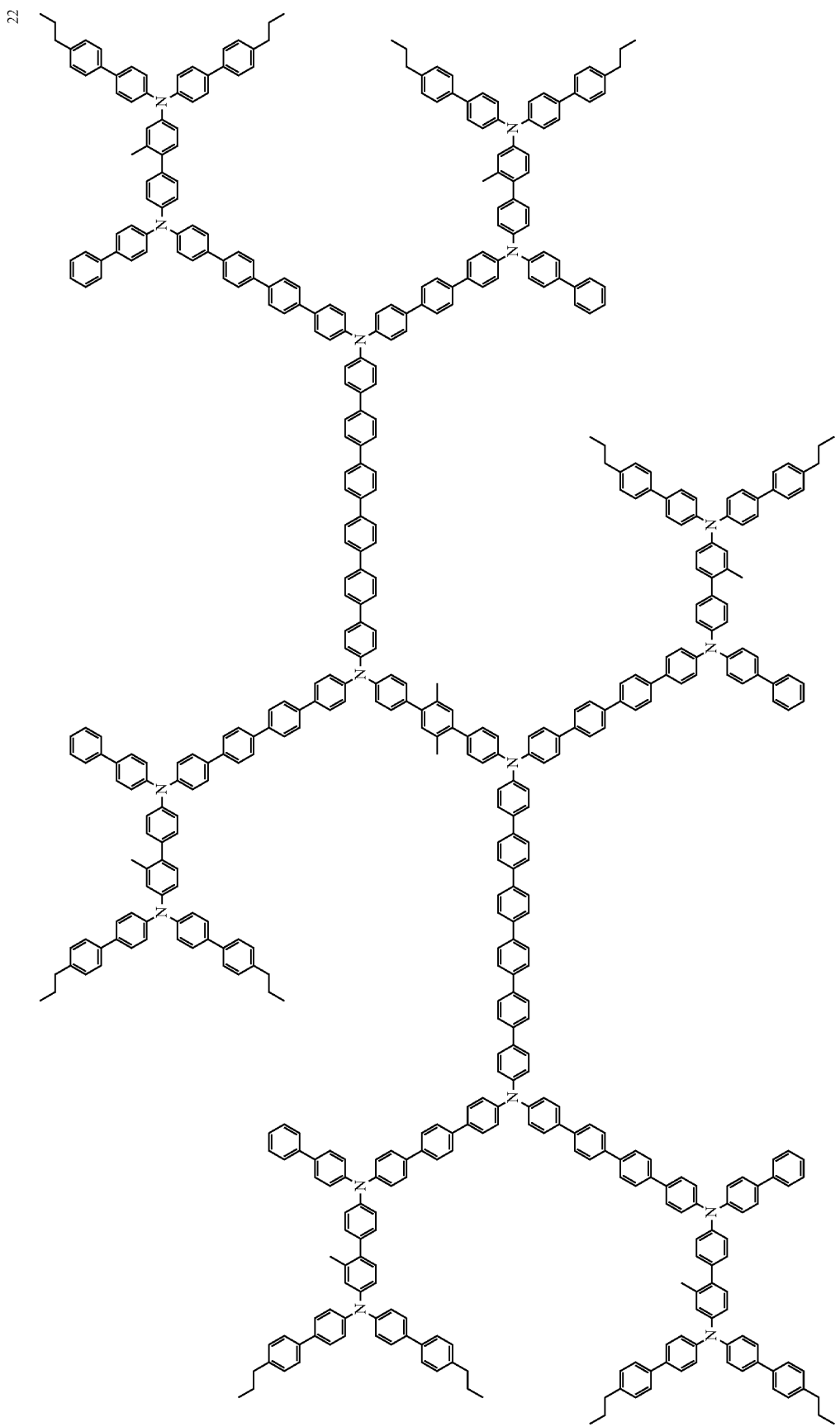

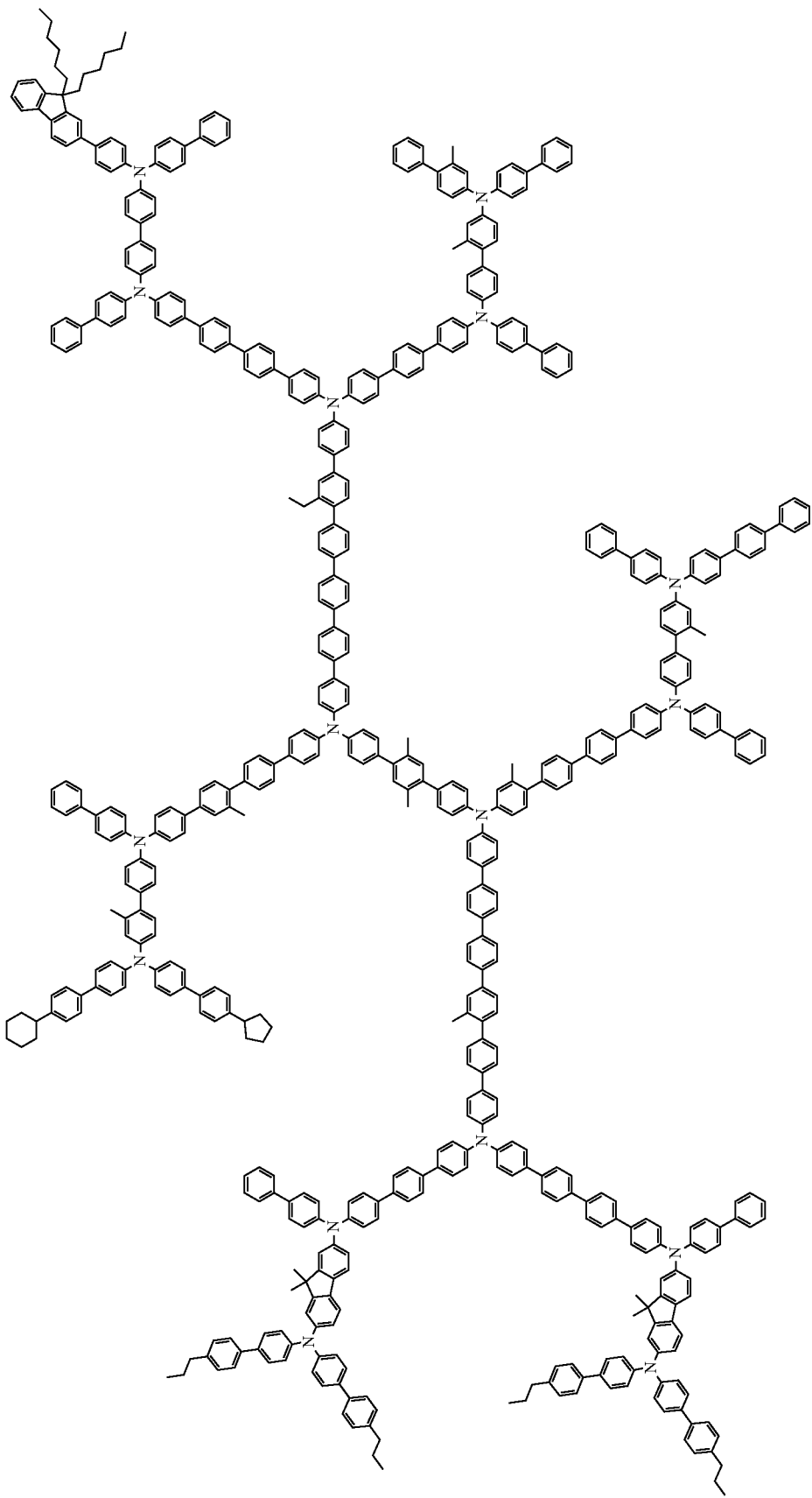

The charge transport material represented by Formula 1 includes an alkyl group in A, and the alkyl group acts as an intramolecular dissolution group. Intermolecular access is suppressed by the alkyl group, and a dissolved state is stabilized in an ink solution used in a wet method (see FIG. 1A).

Figure 1C:
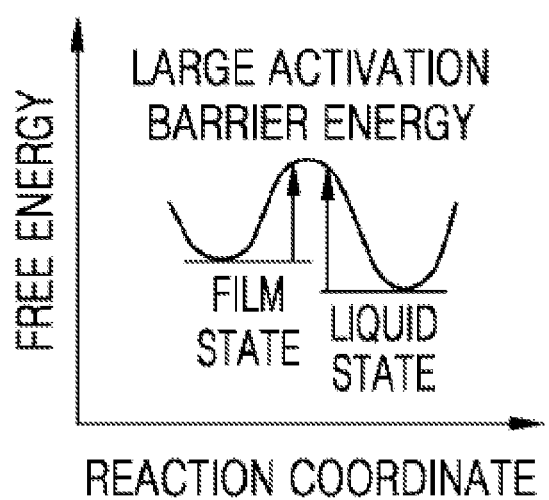
FIG. 1C is a conceptual diagram illustrating energy coordinates in each state.

In addition, the charge transport material represented by Formula 1 has a structure in which a plurality of aromatic groups are linked as insoluble groups in a molecule (for example. $L_2$ and $L_3$). Therefore, an aggregated state is stabilized by a rigid aromatic group (insoluble group) in a film state after deposition. These two stable states (the dissolved state and the film state) exist through large activation barrier energies (see FIG. 1C).

In addition, the charge transport material represented by Formula 1 includes a structure in which the rigid aromatic group acting as insolubilizing group and the alkyl group acting as solubilizing group in the molecule are in appropriate quantitative balance and arranged in the molecule. Therefore, the solubility in a solvent used in a wet method is high. Furthermore, in manufacturing an organic light-emitting device, even when a hole transport layer is formed by a wet method, it is difficult to dissolve in a solvent used to form an upper layer (for example, an emission layer). Therefore, excellent stackability is achieved.

In addition, in the case of a high-molecular-weight compound used in the related art, since impurities are easily incorporated into a polymer in the process of a polymerization reaction and a crosslinking reaction, it is difficult to identify and remove the impurities. Unlike the existing high-molecular-weight compound, the charge transport material represented by Formula 1 is a structurally monodisperse compound having a small molecular weight, thus a polymerization reaction and a crosslinking reaction do not involve in a synthesis process of the charge transport material represented by Formula 1.

Even when the impurities are introduced into the compositions are generated in the synthesis process, the identification and removal of such impurities is easily achieved. Therefore, when the charge transport material represented by Formula 1 is used, it is easy to specify impurities, and the convenience in a purification process and quality control is excellent.

In addition, the charge transport material represented by Formula 1 has an aryl a mine structure. Therefore, an organic film formed by using the charge transport material represented by Formula 1 efficiently forms a hole transport path and exhibits excellent hole transportability.

As described above, due to excellent stackability, impurity removal probability, and hole transportability of the charge transport material represented by Formula 1, excellent performance (for example, high efficiency and/or long lifespan) of an organic light-emitting device including the charge transport material may be realized.

The charge transport material represented by Formula 1 may be synthesized by u sing a known organic synthesis method. A synthesis method for the charge transport material represented by Formula 1 may be apparent to those of ordinary skill in the art by referring to the following examples.

In one or more embodiments, the charge transport material represented by Formula 1 may have a weight average molecular weight of about 2,000 or more and about 20,000 or less.

For example, the charge transport material represented by Formula 1 may have a weight average molecular weight of about 3,000 or more and about 10,000 or less.

When the weight average molecular weight of the charge transport material is about 2,000 or more, stackability may be more improved. When the weight average molecular weight of the charge transport material is about 20,000 or less, it is advantageous in dissolubility and low ink viscosity. That is, when the molecular weight is controlled to be low, the aggregation effect may be reduced and the ink viscosity may be lowered. Therefore, the charge transport material may be dropped in small amount and may be applied to high resolution inkjet.

Composition

Hereinafter, the composition according to an embodiment will be described in detail below.

The composition may include at least one of the charge transport material described above.

For example, the composition may include a low-molecular-weight compound having a weight average molecular weight less than about 2,000.

The low-molecular-weight compound may be at least one of compounds represented by Formulae (J1) to (J3):

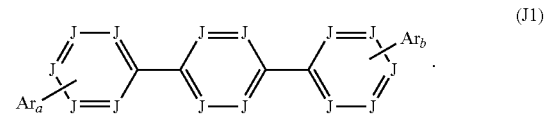

(J1)

In Formula (J1), $Ar_a$ and $Ar_b$ may each independently be a substituted or unsubstituted $C_5$-$C_{60}$ carbocyclic group or a substituted or unsubstituted $C_1$-$C_{60}$ heterocyclic group.

For example, $Ar_a$ and $Ar_b$ may each independently be a substituted or unsubstituted phenyl group or a substituted or unsubstituted m-terphenyl group.

For example, substituents that may be introduced into $Ar_a$ and $Ar_b$ are not particularly limited, and examples of the substituents may include the above-described substituents. In addition, $Ar_a$ and $Ar_b$ may optionally be linked to a neighboring aromatic ring to form a ring.

In Formula (J1), J may be $C(R_a)$ or N, for example, $C(R_a)$.

For example, $R_a$ may be hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), or —N($Q_1$)($Q_2$).

The compound represented by Formula (J1) may be represented by, for example, Formula J1-1:

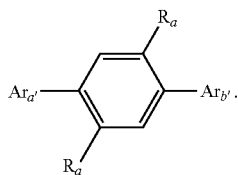

(J1-1)

In Formula (J1-1), $Ar_{a'}$ and $Ar_{b'}$ may be Group I. In addition, each group of Group I may be unsubstituted or substituted with the above-described substituents.

The designation * in Group I indicates a binding site to a neighboring atom.

In addition, in Formula (J1-1), $R_a$ may be a $C_1$-$C_{30}$ alkyl group.

Group I

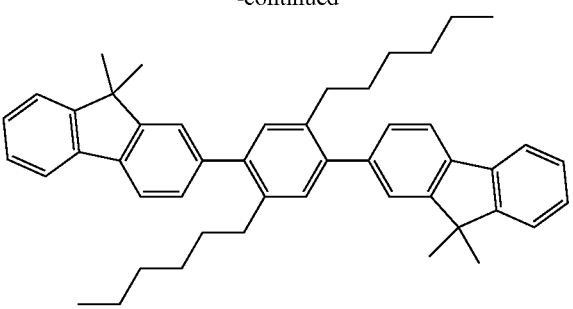

Examples of the low-molecular-weight compound represented by Formula (J1) may include the compounds represented by Group 1-1. The compounds may be used solely or in combination of two or more thereof.

Group I-1

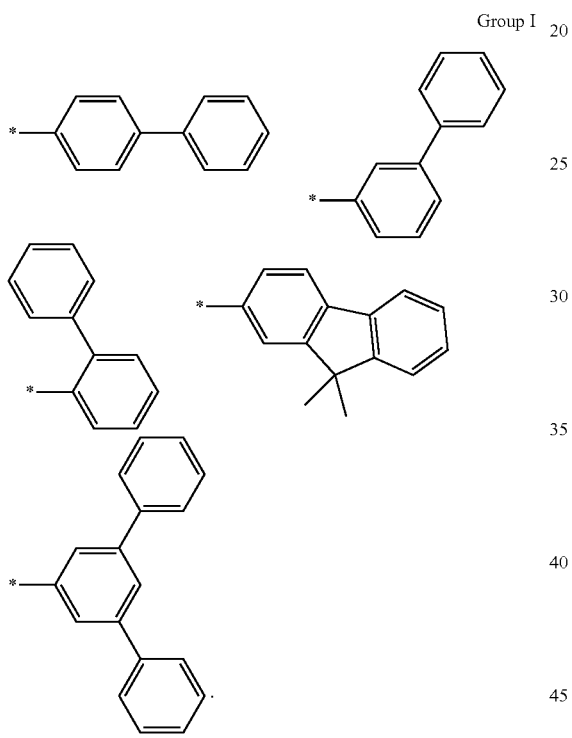

(J-2)

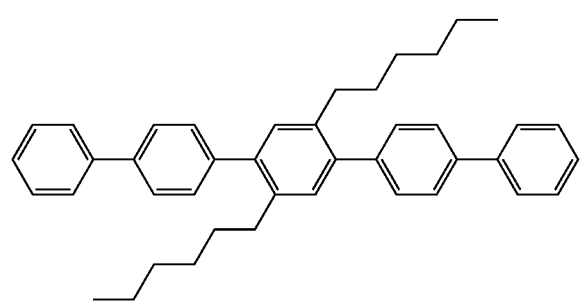

In Formula (J2), $Ar_c$ to $Ar_e$ may each independently be a substituted or unsubstituted $C_5$-$C_{60}$ carbocyclic group, or a substituted or unsubstituted $C_1$-$C_{60}$ heterocyclic group.

For example, $Ar_c$ to $Ar_e$ may each independently be a substituted or unsubstituted phenyl group, a substituted or unsubstituted biphenyl group, a substituted or unsubstituted fluorenyl group, or a substituted or unsubstituted benzofluorenyl group.

For example, substituents that may be introduced into $Ar_c$ to $Ar_e$ are not particularly limited, and examples of the substituents may include the above-described substituents. In addition, $Ar_c$ to $Ar_e$ may be identical to or different from each other. For example, at least two of $Ar_c$ to $Ar_e$ may be identical to each other.

Examples of the low-molecular-weight compound represented by Formula (J2) may be compounds represented by group II-1. The compounds may be used solely or in combination of two or more thereof.

Group II-1

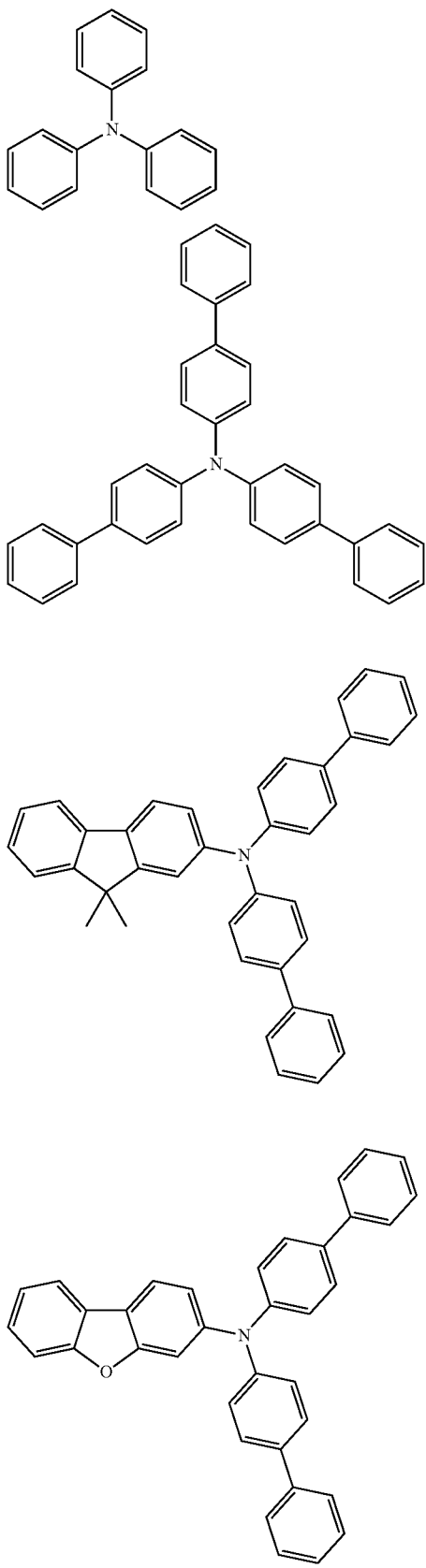

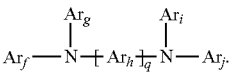

(J3)

In Formula (J3), $Ar_f$, $Ar_g$, $Ar_i$, and $Ar_j$ may each independently be a substituted or unsubstituted $C_5$-$C_{60}$ carbocyclic group or a substituted or unsubstituted $C_1$-$C_{60}$ heterocyclic group.

For example, $Ar_f$, $Ar_g$, $Ar_i$, and $Ar_j$ may each independently be a substituted or un substituted phenyl group, a substituted or unsubstituted biphenyl group, a substituted or unsubstituted fluorenyl group, or a substituted or unsubstituted benzofluorenyl group.

$Ar_f$, $Ar_g$, $Ar_i$, and $Ar_j$ may optionally be linked to form a ring.

In Formula (J3), $Ar_h$ may be a substituted or unsubstituted $C_5$-$C_{60}$ carbocyclic group or a substituted or unsubstituted $C_1$-$C_{60}$ heterocyclic group.

For example, $Ar_h$ may be a phenylene group.

For example, substituents that may be introduced into $Ar_f$ to $Ar_j$ are not particularly limited, and examples of the substituents may include the above-described substituents.

In Formula (J3), q may be an integer from 1 to 10, for example, an integer from 2 to 5.

Examples of the low-molecular-weight compound represented by Formula (J3) m ay include compounds represented by group III-1. The compounds may be used solely or in combination of two or more thereof.

Group III-1

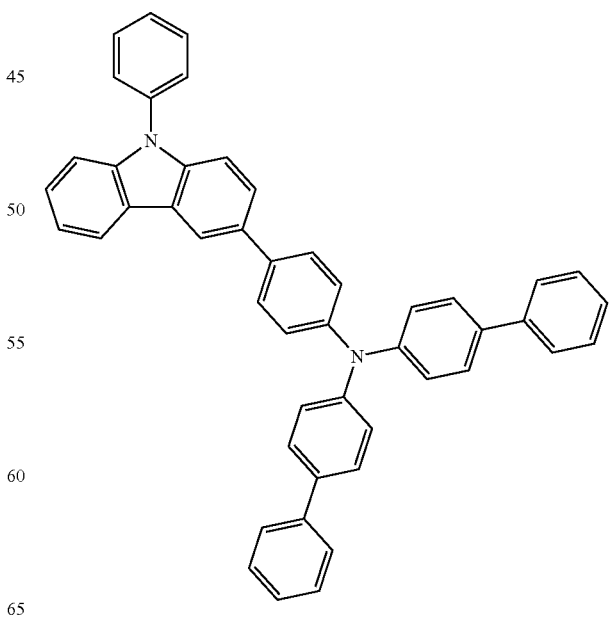

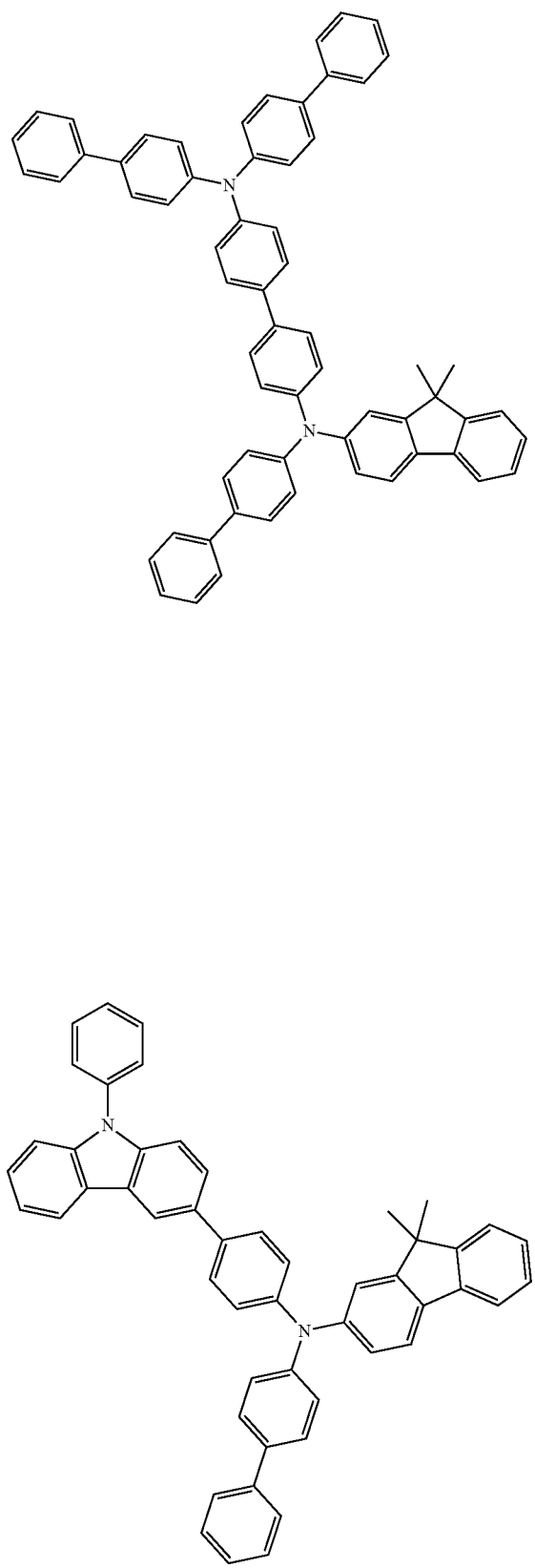

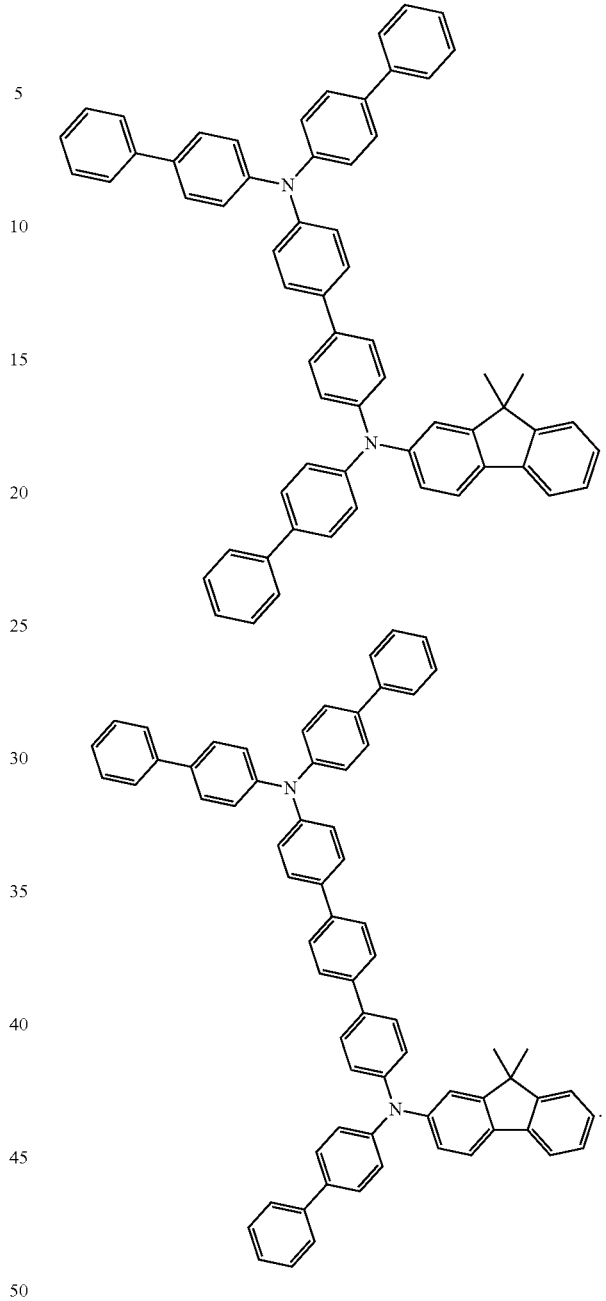

In the composition, a weight ratio of the charge transport material represented by Formula 1 to the low-molecular-weight compound may be in a range of about 20:80 to about 90:10.

Another aspect of the present disclosure provides an organic light-emitting device including: a first electrode; a second electrode; and an organic film between the first electrode and the second electrode, wherein the organic film includes the composition described above.

For example, the organic film may include a hole injection layer, a hole transport layer, or a combination thereof, and the composition may be included in the hole injection layer and/or the hole transport layer.

The composition may further include a solvent.

For example, the solvent may have a boiling point of about 100° C. or more and about 350° C. or less at about 101.3 kPa (1 atm). For example, the boiling point of the solvent may be in a range of about 150° C. or more and about 320° C. or less, for example, about 180° C. or more and about 300° C. or less.

The amount of the solvent of the composition is not particularly limited. For example, a concentration of the charge transport material in the composition may be in a range of about 0.05 wt % or more and about 10 wt % or less, for example, about 0.1 wt % or more and about 6 wt % or less. When the charge transport material is within this concentration, it is preferable in terms of solubility, and precipitation is minimized in the solution. Therefore, it is preferable in terms of improvement in pot life of the solution.

For example, a concentration of a compound (for example, a first compound, a second compound, a phosphorescent metal complex, etc.) different from the charge transport material in the composition may be in a range of about 0.05 wt % or more and about 10 wt % or less, for example, about 0.1 wt % or more and about 6 wt % or less. When the concentration of the compound is within this range, it is preferable in terms of solubility, and precipitation hardly occurs in the solution. Therefore, it is preferable in terms of improvement in pot life of the solution.

The solvent is not particularly limited as long as the charge transport material represented by Formula 1 and/or the first compound represented by Formula 9 are/is dissolved therein. Examples of the solvent may include octane, nonane, decane, undecane, dodecane, toluene, xylene, benzonitrile, 3-methylbenzonitrile, dimethylacetamide, N-methylpyrolidone, N,N-dimethyl formamide, dimethyl sulfoxide, hexamethyl phosphorus triamide, phenylcyclohexane, tetrahydronaphthalene, ethylbenzene, n-propylbenzene, iso-propylbenzene, diethylbenzene, mesitylene, propylbenzene, n-butylbenzene, sec-butylbenzene, 1-phenylpentane, 2-phenylpentane, 3-phenylpentane, phenylcyclopentane, 2-ethylbiphenyl, 3-ethylbiphenyl, cyclohexylbenzene, dimethoxybenzene, 1,4-dioxane, 1,2-diethoxyethane, diethyleneglycol dimethylether, diethyleneglycol diethylether, ethoxybenzene, 3-methylanisole, m-dimethoxybenzene, 2-hexanone, 3-hexanone, cyclohexanone, 2-heptanone, 3-heptanone, 4-heptanone, cycloheptanone, butylacetate, butylpropionate, heptylbutyrate, propylenecarbonate, anisole, ethoxytoluene, phenoxytoluene, isopropylbiphenyl, dimethylanisole, phenyl acetate, phenyl propionic acid, methyl benzoate, ethyl benzoate, 1-propylbenzoate, and 1-butylbenzoate, but embodiments of the present disclosure are not limited thereto.

Therefore, the composition may be used as a material for a light-emitting device (for example, an organic light-emitting device, a quantum-dot light-emitting device, etc.). Specifically, the composition may be used in an emission layer, a charge injection layer, and/or a charge transport layer of the light-emitting device. More specifically the composition may be used in the charge transport layer of the light-emitting device. In particular, the composition may be used in manufacturing the light-emitting device by using a solution coating method. The current efficiency and light-emission lifespan of the light-emitting device may be maintained or improved.

Organic Light-Emitting Device

Figure 2:
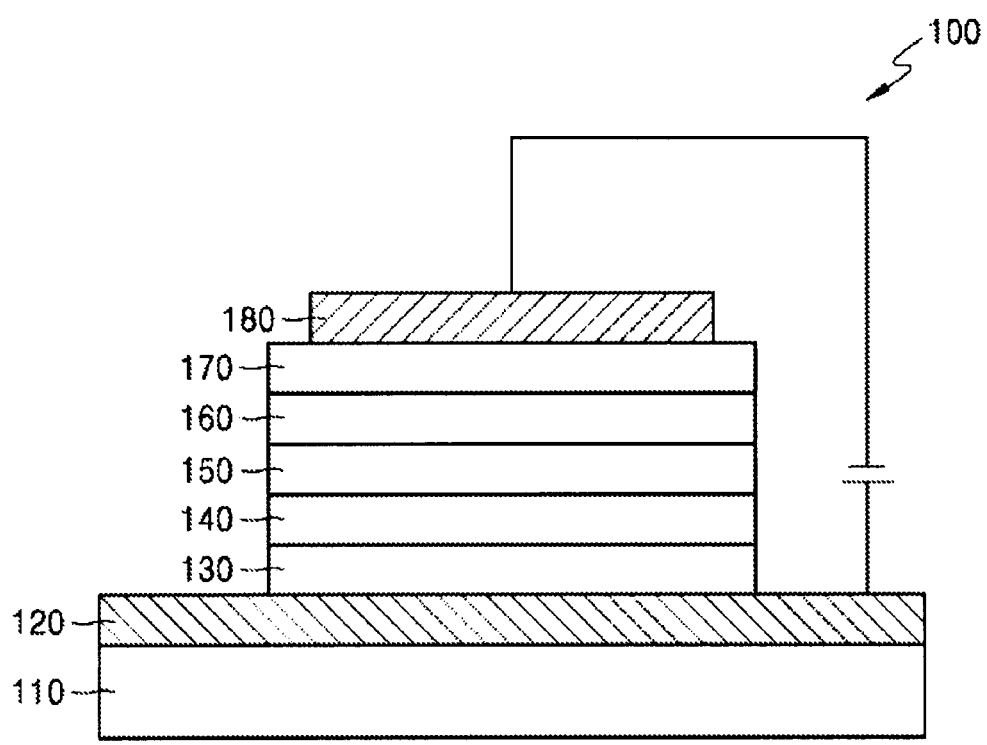
FIG. 2 is a schematic view of an organic light-emitting device according to an embodiment.

Hereinafter, by referring to FIG. 2, an organic light-emitting according to an embodiment will be described in detail. FIG. 2 is a schematic cross-sectional view of an organic light-emitting device according to an embodiment.

An organic light-emitting device 100 according to an embodiment includes a substrate 110, a first electrode 120 disposed on the substrate 110, a hole injection layer 130 disposed on the first electrode 120, a hole transport layer 140 disposed on the hole injection layer 130, an emission layer 150 disposed on the hole transport layer 140, an electron transport layer 160 disposed on the emission layer 150, an electron injection layer 170 disposed on the electron transport layer 160, and a second electrode 180 disposed on the electron injection layer 170.

The charge transport material represented by Formula 1 may be included in, for example, one of organic layers (e.g., the hole injection layer 130, the hole transport layer 140, the emission layer 150, the electron transport layer 160, and the electron injection layer 170) disposed between the first electrode 120 and the second electrode 180. In detail, the charge transport material represented by Formula 1 may be included in the hole injection layer 130 and/or the hole transport layer 140, as the charge transport material.

The term "organic layer" as used herein refers to a single layer and/or a plurality of layers between the first electrode and the second electrode of the organic light-emitting device. The "organic layer" may include, in addition to an organic compound, an organometallic compound including metal.

The expression "(an organic layer) includes at least one organometallic compound" as used herein may include a case in which "(an organic layer) includes identical charge transport materials represented by Formula 1" and a case in which "(an organic layer) includes two or more different charge transport materials represented by Formula 1".

In one or more embodiments, the organic layer may include, as the charge transport material, Compound 1 and Compound 2. In this regard, Compound 1 and Compound 2 may exist in an identical layer (for example, Compound 1 and Compound 2 all may exist in a hole transport layer).

The substrate 110 may be any substrate that is used in a typical organic light-emitting device. For example, the substrate 110 may be a glass substrate, a silicon substrate, or a transparent plastic substrate, each having excellent mechanical strength, thermal stability, surface smoothness, ease of handling, and water resistance, but embodiments of the present disclosure are not limited thereto.

The first electrode 120 may be formed on the substrate 110. The first electrode 120 may be, for example, an anode, and may be formed of a material with a high work function to facilitate hole injection, such as an alloy or a conductive compound. The first electrode 120 may be a reflective electrode, a semi-reflective electrode, or a transmissive electrode. The first electrode 120 may have a single-layered structure or a multi-layered structure including two or more layers. For example, the first electrode 120 may be a transparent electrode formed of indium tin oxide (ITO), indium zinc oxide (IZO), tin oxide (SnO2), or zinc oxide (ZnO), which has excellent transparency and conductivity. On the transparent first electrode 120, magnesium (Mg), aluminum (Al), aluminum-lithium (Al—Li), calcium (Ca), magnesium-indium (Mg—In), or magnesium-silver (Mg—Ag) may be disposed, so as to form a reflective electrode. In one or more embodiments, the first electrode 120 may have a three-layered structure of ITO/Ag/ITO, but embodiments of the present disclosure are not limited thereto.

The hole transport region may be disposed on the first electrode 120.

The hole transport region may include at least one a hole injection layer 130, a hole transport layer 140, an electron blocking layer (not shown), and a buffer layer (not shown).

The hole transport region may include only either a hole injection layer 130 or a hole transport layer 140. In one or more embodiments, the hole transport region may have a hole injection layer/hole transport layer structure or a hole injection layer/hole transport layer/electron blocking layer structure, wherein for each structure, constituting layers are sequentially stacked from the first electrode 120 in the stated order.

The hole injection layer 130 may include, in addition to the charge transport material described above, at least one, for example, poly(ether ketone)-containing triphenylamine (TPAPEK), 4-isopropyl-4'-methyldiphenyliodonium tetrakis(pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino) triphenylamine (m-MTDATA), N,N'-di(1-naphthyl)-N,N'-diphenylbenzidine (NPB), 4,4', 4"-tris(diphenylamino) triphenylamine (TDATA), 4,4',4"-tris(N,N-2-naphthylphenylamino) triphenylamine (2-TNATA), polyaniline/dodecylbenzenesulphonic acid (PANI/DBSA), poly(3,4-ethylenedioxythiophene)/poly(4-styrenesulfonate) (PEDOT/PSS), polyaniline/10-camphorsulfonic acid (PANI/CSA), polyaniline/poly(4-styrenesulfonate) (PANI/PSS), or any combination thereof.

The hole injection layer 130 may be formed to a thickness in a range of about 10 nm to about 1,000 nm, for example, about 10 nm to about 100 nm.

The hole transport layer 140 may include, in addition to the charge transport material described above, at least one, for example, a carbazole derivative, such as 1,1-bis[(di-4-tolylamino)phenyl] cyclohexane (TAPC), N-phenylcarbazole, and polyvinylcarbazole, N,N'-bis(3-methylphenyl)-N, N'-diphenyl-[1,1-biphenyl]-4,4'-diamine (TPD), 4,4',4"-tris (N-carbazolyl) triphenylamine (TCTA), N,N'-di(1-naphthyl)-N,N'-diphenylbenzidine (NPB), poly(9,9-dioctyl-fluorene-co-N-(4-butylphenyl)-diphenylamine (TFB), or any combination thereof.

The hole transport layer 140 may be formed to a thickness in a range of about 10 nm to about 1,000 nm, for example, about 10 nm to about 150 nm.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, and a cyano group-containing compound, but embodiments of the present disclosure are not limited thereto. Non-limiting examples of the p-dopant are a quinone derivative, such as tetracyanoquinondimethane (TCNQ) or 2,3,5,6-tetrafluoro-tetracyano-1,4-benzoquinodimethane (F4-TCNQ); a metal oxide, such as a tungsten oxide or a molybdenum oxide; and a cyano group-containing compound, such as Compound HT-D1 or Compound HT-D2 below, but are not limited thereto:

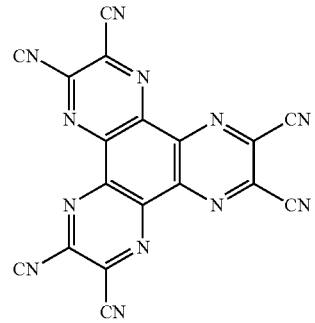

HT-D1

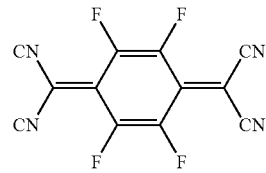

F4-TCNQ

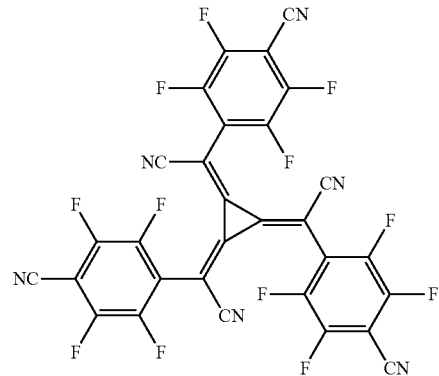

HT-D2

Meanwhile, when the hole transport region includes a buffer layer, a material for the buffer layer may be a material for the hole transport region described above or a material for a host to be explained later. However, the material for the buffer layer is not limited thereto.

Meanwhile, when the hole transport region includes an electron blocking layer, a material for the electron blocking layer may be a material for the hole transport region described above and materials for a host to be explained later. However, the material for the electron blocking layer is not limited thereto. For example, when the hole transport region includes an electron blocking layer, a material for the electron blocking layer may be mCP.

The emission layer 150 is formed on the hole transport region. The emission layer 150 is a layer emitting light by fluorescence, phosphorescence, or the like. The emission layer 150 may include a host and/or a dopant, and the host may include the charge transport material represented by Formula 1. In addition, the host and the dopant used in the emission layer 150 may be the known materials.

For example, the host may include tris(8-quinolinato) aluminium ($Alq_3$), 4,4'-bis(carbazol-9-yl)biphenyl (CBP), poly(n-vinylcarbazole) (PVK), 9,10-di(naphthalene)anthracene (ADN), 4,4',4"-tris(N-carbazolyl)triphenylamine (TCTA), 1,3,5-tris(N-phenyl-benzimidazol-2-yl)benzene (TPBi), 3-tert-butyl-9,10-di(naphth-2-yl)anthracene (TBADN), distyrylarylene (DSA), 4,4'-bis(9-carbazole)-2, 2'-dimethyl-bipheny (dmCBP), or the like, but embodiments of the present disclosure are not limited thereto.

For example, the dopant may include an iridium complex, such as perylene and a derivative thereof, rubrene and a derivative thereof, coumarin and a derivative thereof, 4-dicyanomethylene-2-(p-dimethylaminostyryl)-6-methyl-4H-pyran (DCM) and aderivative thereof, bis[2-(4,6-difluorophenyl)pyridinate] picolinate iridium (III) (Flrpic), bis(1-phenylisoquinoline)(acetylacetonate) iridium (III) (Ir(piq)$_2$(acac)), tris(2-phenylpyridine) iridium (III) (Ir(ppy)$_3$), or tris(2-(3-p-xylyl)phenyl)pyridine iridium (III)) (dopant), an osmium complex, a platinum complex, or the like, but embodiments of the present disclosure are not limited thereto.

When the emission layer includes the host and the dopant, an amount of the dopant may be in a range of about 0.01 parts by weight to about 15 parts by weight based on about 100 parts by weight of the host, but embodiments of the present disclosure are not limited thereto.

In addition, the emission layer may include nanoparticles such as a quantum dot as a light-emitting material.

The quantum dot may be nanoparticles including a group II-VI semiconductor, a group III-V semiconductor, or a group IV-VI semiconductor. Examples of the quantum dot may include CdO, CdS, CdSe, CdTe, ZnO, ZnS, ZnSe, ZnTe, HgS, HgSe, HgTe, MgSe, MgS CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, GaN, GaP, GaAs, AlN, AlP, AlAs, InN, InP, InAs, InSb, GaNP, GaNAs, GaNSb, GaPAs, GaPSb, AlNP, AlNAs, AlNSb, AlPAs, AlPSb, InNP, InNAs, InPAs, InPSb, GaAlNP, SnS, SnSe, SnTe, PbS, PbSe, PbTe, SnSeS, SnSeTe, SnSTe, PbSeS, PbSeTe, PbSTe, SnPbS, SnPbSe, and SnPbTe, but embodiments of the present disclosure are not limited thereto. In addition, although not particularly limited, a diameter of the quantum dot may be in a range of about 1 nm to about 20 nm. The quantum dot may have a single core structure or a core-shell structure.

The emission layer 150 may be formed to a thickness in a range of about 10 nm to about 60 nm.

When the organic light-emitting device is a full-color organic light-emitting device, the emission layer may be patterned into a red emission layer, a green emission layer, or a blue emission layer. In one or more embodiments, due to a stacked structure including a red emission layer, a green emission layer, and/or a blue emission layer, the emission layer may emit white light.

The electron transport region may be formed on the emission layer 150.

The electron transport region may include at least one hole blocking layer (not shown), electron transport layer 160, electron injection layer 170, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

For example, the organic light-emitting device 100 may include, to prevent diffusion of excitons or holes into the electron transport layer 160, a hole blocking layer between the electron transport layer 160 and the emission layer 150. The hole blocking layer may include, for example, at least one an oxadiazole derivative, a triazole derivative, BC P, Bphen, BAlq, HBl below, or a combination thereof, but a material therefor is not limited thereto:

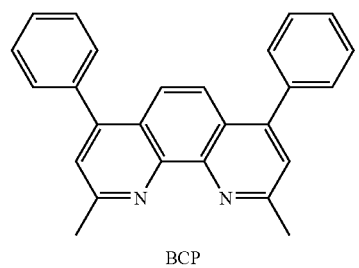
BCP

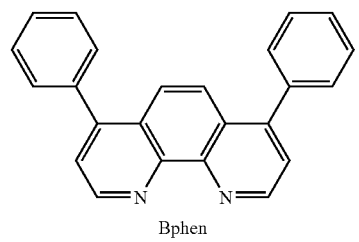
Bphen

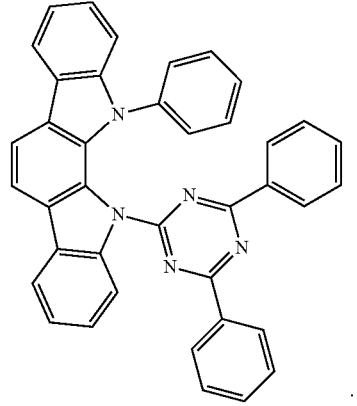
HB1

A thickness of the hole blocking layer may be from about 20 Å to about 1,000 Å, for example, about 30 Å to about 300 Å. When the thickness of the hole blocking layer is within these ranges, excellent hole blocking characteristics may be obtained without a substantial increase in driving voltage.

The electron transport layer 160 may include tris(8-quinolinato) aluminium (Alq$_3$), BAlq; a compound including a pyridine ring, such as 1,3,5-tri[(3-pyridyl)-phen-3-yl] benzene; a compound including a triazine ring, such as 2,4,6-tris(3'-(pyridin-3-yl)biphenyl-3-yl)-1,3,5-triazine; a compound including an imidazole ring, such as 2-(4-(N-phenylbenzimidazolyl-1-yl-phenyl)-9,10-dinaphthylanthracene; a compound including a triazole ring, such as TAZ and NTAZ; 1,3,5-tris(N-phenyl-benzimidazol-2-yl)benzene (TPBi), BCP, Bphen, or the like.

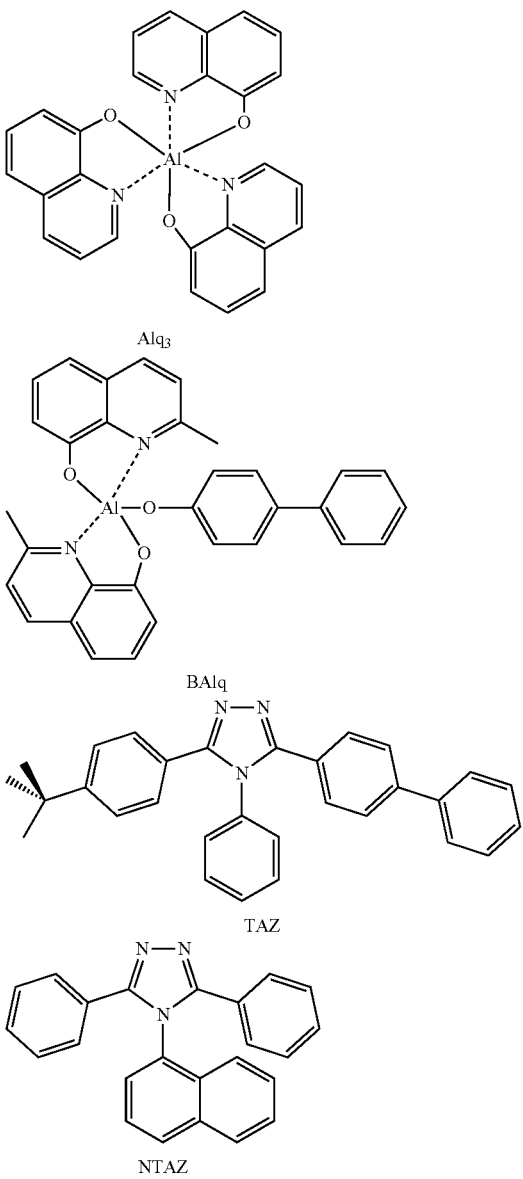

Alq₃

BAlq

TAZ

NTAZ

In one or more embodiments, the electron transport layer 160 may include a pro duct available in the art, such as KLET-01, KLET-02, KLET-03, KLET-10, and KLET-M1 (available from Chemipro Kasei Company).

Also, the electron transport layer 160 may further include, in addition to the materials described above, a metal-containing material.

The metal-containing material may include a Li complex. The Li complex may include, for example, Compound ET-D1 (lithium quinolate, LiQ) or ET-D2:

ET-D1

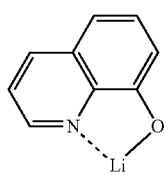

ET-D2

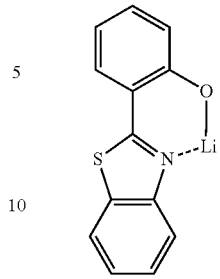

The electron transport layer 160 may be, for example, formed to a thickness in a range of about 15 nm to about 50 nm.

The electron injection layer 170 may be formed on the electron transport layer 160.

The electron injection layer 170 may include, for example, a lithium compound, such as (8-hydroxyquinolinato)lithium (Liq) and lithium fluoride (LiF), sodium chloride (Na Cl), cesium fluoride (CsF), lithium oxide ($Li_2O$), or barium oxide (BaO).

The electron injection layer 170 may be formed to a thickness in a range of about 0.3 nm to about 9 nm.

The second electrode 180 may be formed on the electron injection layer 170. The second electrode 180 may be a cathode, and a material for forming the second electro de 180 may be a metal, an alloy, an electrically conductive compound, or a combination thereof, which have a relatively low work function. For example, the second electrode 180 may be formed as a reflective electrode by using a metal such as lithium (Li), magnesium (Mg), aluminum (Al), and calcium (Ca), or an alloy such as aluminum-lithium (Al—Li), magnesium-indium (Mg—In), and magnesium-silver (Mg—Ag). In one or more embodiments, the second electrode 180 may be formed as a transparent electrode by using the metal, an alloy thin film, or a transparent conductive film such as indium oxide ($In_2O_3$—$SnO_2$) a nd indium zinc oxide ($In_2O_3$—ZnO), which has a thickness of about 20 nm or less.

In addition, the stacked structure of the organic light-emitting device 100 according to one embodiment is not limited to the above-described example. The organic light-emitting device 100 according to one embodiment may have a known stacked structure. F or example, in the organic light-emitting device 100, at least one layer the hole injection layer 130, the hole transport layer 140, the electron transport layer 160, and the electron injection layer 170 may be omitted. The organic light-emitting device 100 may further include other layers. In addition, layers constituting the organic light-emitting device 100 may be a single layer or a plurality of layers.

A method of manufacturing layers constituting the organic light-emitting device 100 according to one embodiment is not particularly limited. For example, each layer of the organic light-emitting device 100 may be manufactured by various methods such as vacuum deposition, solution coating, or Langmuir-Blodgett (LB) deposition.

The solution coating may include spin coat, casting, micro gravure coating, gravure coating, bar coating, roll coating, wire bar coating, dip coating, spry coating, screen printing, flexographic printing, offset printing, and ink-jet printing.

Examples of the solvent used in the solution coating may include toluene, xylene, diethyl ether, chloroform, ethyl acetate, dichloromethane, tetrahydrofuran, acetone, acetonitrile, N,N-dimethylformamide, dimethyl sulfoxide, anisole, hexamethyl phosphorus tri amide, 1,2-dichloroethane, 1,1,2-trichloroethane, chlorobenzene, o-dichlorobenzene, dioxane, cyclohexane, n-pentane, n-hexane, n-heptane, n-octane, n-nonane, n-decane, methyl ethyl ketone, cyclohexanone, butyl acetate, ethyl cellosolve acetate, ethylene glycol, ethylene glycol mono butyl ether, ethylene glycol mono ethyl ether, ethylene glycol mono methyl ether, dimethoxyethane, propylene glycol, diethoxy methane, triethylene glycol mono ethyl ether, glycerin, 1,2-hexanediol, methanol, ethanol, propanol, isopropanol, cyclohexanol, and N-methyl-2-pyrrolidone. However, the solvent is not particularly limited as long as the solvent is capable of dissolving a material used to form each layer.

In consideration of coatability, a concentration of the composition used in the solution coating may be in a range of about 0.1 wt % or more and about 10 wt % or less, for example, about 0.5 wt % or more and about 5 wt % or less, but embodiments of the pre sent disclosure are not limited thereto.

The vacuum deposition may be differently performed according to a compound to be used, a structure of a layer to be formed, and thermal characteristics. For example, the vacuum deposition may be performed at a deposition temperature of about 100° C. to about 500° C., a vacuum degree of about $10^{-8}$ torr to about 10-torr, and a deposition speed of about 0.01 Å/sec to about 100 Å/sec.

In one or more embodiments, the first electrode 120 may be an anode, and the second electrode 180 may be a cathode.

For example, the first electrode 120 may be an anode, the second electrode 180 may be a cathode, and the organic light-emitting device 100 may include an organic layer including the emission layer 150 and disposed between the first electrode 120 and the second electrode 180, wherein the organic layer may further include the hole transport region between the first electrode 120 and the emission layer 150 and the electron transport region between the emission layer 150 and the second electrode 180. The hole trans port region may include at least one the hole injection layer 130, the hole transport layer 140, the buffer layer, and the electron blocking layer, and the electron transport region may include at least one the hole blocking layer, the electron transport layer 160, and the electron injection layer 170.

In one or more embodiments, the first electrode 120 may be a cathode, and the second electrode 180 may be an anode.

Hereinabove, the organic light-emitting device is described by referring to FIG. 2, but embodiments of the present disclosure are not limited thereto.

Description of Substituents

The expression "X and Y may each independently be" as used herein refers to a case where X and Y may be identical to each other, or a case where X and Y may be different from each other.

The term "substituted" as used herein refers to a case where hydrogen of a substituent such as Rn may be further substituted with other substituents.

The term "$C_1$-$C_{60}$ alkyl group (or $C_1$-$C_{30}$ alkyl group)" as used herein refers to a linear or branched aliphatic saturated hydrocarbon monovalent group having 1 to 60 (or 30) carbon atoms, and examples thereof include a methyl group, an ethyl group, an n-prop yl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a1-isopropylpropyl group, a 1,2-dimethylbutyl group, an n-heptyl group, a 1,4-dim ethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethyldecyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-oxtadecyl group, an n-nonadecyl group, an n-eicosyl group, an n-heneicosyl group, an n-docosyl group, an n-tricosyl group, an n-tetracosyl group, and the like.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, a propoxy group, an isopropoxy group, an n-butoxy group, an isobutoxy group, a sec-butoxy group, a tert-butoxy group, an n-pentoxy group, an isopentoxy group, a tert-pentoxy group, a neopentoxy group, an n-hexyloxy group, an isohexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyl oxy group, a 2-ethylhexyloxy group, a 3-ethylpentyloxy group, and the like.

The term "$C_3$-$C_{10}$ cycloalkyl group" as used herein refers to a monovalent saturated hydrocarbon monocyclic group having 3 to 10 carbon atoms involved in the ring formation, and examples thereof include a cyclopropyl group, a cyclobutyl group, a cyclopentyl group, a cyclohexyl group, and a cycloheptyl group.

The term "$C_3$-$C_{10}$ cycloalkenyl group" as used herein refers to a monovalent monocyclic group having 3 to 10 carbon atoms and at least one double bond involved in the ring formation, and examples thereof include a cyclopropenyl group, a cyclobutenyl group, a cyclopentenyl group, a cyclohexenyl group, and a cycloheptenyl group.

The term "$C_1$-$C_{10}$ heterocycloalkyl group" as used herein refers to a monovalent saturated monocyclic group having N, O, Si, P, Se, Ge, B, S, or any combination thereof, and 1 to 10 carbon atoms as a ring-forming atoms, and examples thereof include an epoxide and an aziridine.

The term "$C_1$-$C_{10}$ heterocycloalkenyl group" as used herein refers to a monovalent monocyclic group having N, O, Si, P, Se, Ge, B, S, or any combination thereof and 1 to 10 carbon atoms as a ring-forming atoms, and at least one carbon-carbon double bond.

The term "$C_6$-$C_{60}$ aryl group" as used herein refers to a monovalent group having a carbocyclic aromatic system having 6 to 60 carbon atoms involved in the ring formation (that is, when substituted with a substituent, the atom not included in the substituent is not counted as the carbon involved in the ring formation), and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phen yl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_6$-$C_{60}$ aryloxy group" as used herein refers to a group represented by —$OA_{103}$ (wherein $A_{103}$ is the $C_6$-$C_{60}$ aryl group), and examples thereof include a 1-naphthyl oxy group, a 2-naphthyloxy group, a 2-azulenyloxy group, and the like.

The term "$C_6$-$C_{60}$ arylthio group" as used herein refers to a group represented by —$SA_{104}$ ($A_{104}$ is the $C_6$-$C_{60}$ aryl group).

The term "$C_1$-$C_{60}$ heteroaryl group" as used herein refers to a monovalent group having a heterocyclic aromatic system that has at least one N, O, Si, P, Se, Ge, B, S, or any combination thereof, as a ring-forming atom, and 1 to 60 carbon atoms. The term "$C_1$-$C_{60}$ heteroarylene group" as used herein refers to a divalent group having a heterocyclic aromatic system that has at least one heteroatom N, O, Si, P, Se, Ge, B, S, or any combination thereof as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed with each other.

The term "$C_1$-$C_{60}$ heteroaryloxy group" as used herein refers to a group represented by —$OA_{105}$ (wherein $A_{105}$ is the $C_1$-$C_{60}$ heteroaryl group). Examples thereof include a 2-furanyloxy group, a 2-thienyloxy group, a 2-indolyloxy group, a 3-indolyloxy group, a 2-benzofuriloxy group, a 2-benzothienyloxy group, and the like.

The term "$C_1$-$C_{60}$ heteroarylthio group" as used herein refers to a group represented by —$SA_{106}$ (wherein $A_{106}$ is the $C_1$-$C_{60}$ heteroaryl group).

The term "$C_7$-$C_{60}$ alkylaryl group" as used herein refers to a monovalent group in which an arylene group is substituted with an alkyl group and the sum of the carbon atoms constituting the alkyl group and the arylene group is 7 to 60. An example of the $C_7$-$C_{60}$ alkylaryl group is the toluyl group (i.e., -Ph-$CH_3$).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom N, O, P, Si, Se, Ge, B, or S, other than carbon atoms, as a ring-forming atom, and no aromaticity in its entire molecular structure. Non-limiting examples of the monovalent non-aromatic condensed heteropoly cyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group (or $C_5$-$C_{30}$ carbocyclic group)" as used herein refers to a saturated or unsaturated cyclic group having, as a ring-forming atom, 5 to 60 (or 30) carbon atoms only. The term "$C_5$-$C_{60}$ carbocyclic group (or $C_5$-$C_{30}$ carbocyclic group)" as used herein refers to a monocyclic group or a polycyclic group, and, according to its chemical structure, a monovalent, divalent, trivalent, tetravalent, pentavalent, or hexa valent group.

The term "$C_1$-$C_{60}$ heterocyclic group (or $C_1$-$C_{30}$ heterocyclic group)" as used herein refers to a saturated or unsaturated cyclic group having, as a ring-forming atom, at least one N, O, Si, P, Se, Ge, B, S, or any combination thereof other than 1 to 60 (or 30) carbon atoms. The term "$C_1$-$C_{60}$ heterocyclic group (or $C_1$-$C_{30}$ heterocyclic group)" as used herein refers to a monocyclic group or a polycyclic group, and, according to its chemical structure, a monovalent, divalent, trivalent, tetravalent, pentavalent, or hexavalent group In the present specification, at least one substituent of the substituted $C_5$-$C_{60}$ carbocyclic group, the substituted $C_5$-$C_{30}$ carbocyclic group, the substituted $C_1$-$C_{60}$ heterocyclic group, the substituted $C_1$-$C_{30}$ heterocyclic group, the substituted $C_1$-$C_{60}$ alkyl group, the substituted $C_1$-$C_{30}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{25}$)($Q_{29}$), or any combination thereof; or
—N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Others

In the present specification, the term "A to B" as used herein refers to a range from A to B, including A and B.

Although one embodiment of the present disclosure has been described above with reference to the accompanying drawings, the present disclosure is not limited thereto. It will be apparent to those of ordinary skill in the art that various changes or modifications may be made within the scope of the technical idea described in the claims. It will be understood that such various changes and modifications also fall within the technical scope of the present disclosure.

Hereinafter, a charge transport material represented by Formula 1 and an organic light-emitting device including the same will be described in detail with reference to Examples and Comparative Examples. The following Examples are presented by way of example only, and the charge transport material and the organic light-emitting device including the same, according to one or more embodiments, are not limited to the following Examples.

The wording "'B' was used instead of 'A'" used in describing Synthesis Example s means that a molar equivalent of 'A' was identical to a molar equivalent of 'B'.

Also, "%" is based on weight unless defined otherwise.

EXAMPLES

Synthesis of Compound 3'

Synthesis Example 1-1: Synthesis of Intermediate 1a

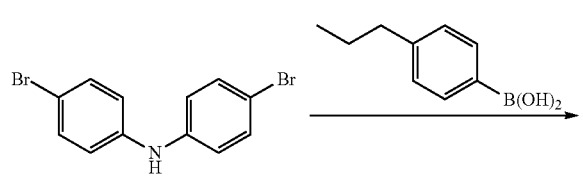

-continued

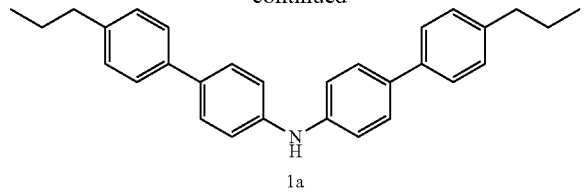

1a

In a nitrogen atmosphere, bis(4-bromophenyl)amine (581.0 mmol, 190.0 g), (4-propylphenyl)boronic acid (1162 mmol, 190.6 g), and tetrahydrofuran (THF) (2,905 ml) were added to a four-neck flask and dissolved. After 1,162 ml of 2 M aqueous potassium carbonate solution was added thereto, palladium acetate (34.9 mmol, 7.83 g) and tri(o-tolyl)phosphine (52.3 mmol, 15.92 g) were added thereto and refluxed for 5 hours. After the reaction was completed, the reaction product was cooled to room temperature and extracted with toluene. The product obtained therefrom was dried by using magnesium sulfate and filtered by using a silica gel pad, and recrystallization was repeated thereon twice in methanol. Vacuum drying (50° C., 16 hours) was performed thereon to obtain Intermediate 1a that is a white solid. The obtained amount of Intermediate 1a was 200.3 g.

Synthesis Example 1-2: Synthesis of Intermediate 1b

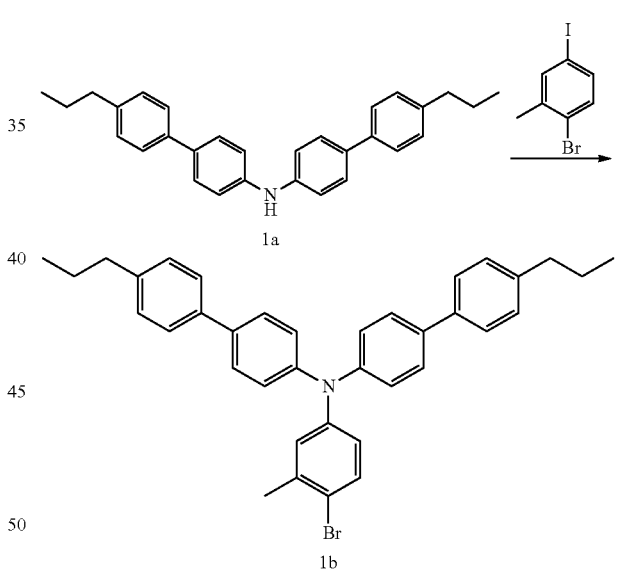

In a nitrogen atmosphere, Intermediate 1a (246.6 mmol, 100 g), 1-bromo-4-iodine-2-methylbenzene (1.05 eq., 258.9 mmol, 76.87 g), tert-BuONa (2 eq., 493.2 mmol, 47.4 g), and 1,4-dioxane (493 ml) were added to a four-neck flask, stirred, and then dispersed. CuI (3 mol %, 7.4 mmol, 1.41 g) and trans-1,2-diaminocyclohexane (15 mol % 37.0 mmol, 4.4 ml) were added thereto and refluxed for 10 hours. After the reaction was completed, the reaction product was cooled to room temperature, diluted with toluene, and then filtered by using CELITE. The product obtained therefrom was concentrated and purified by silica gel chromatography (hexane:toluene=7:3), and recrystallization was performed thereon in acetone to obtain Intermediate 1b that is a white solid (obtained amount: 99.2 g, yield: 70%).

Synthesis Example 1-3: Synthesis of Intermediate 1c

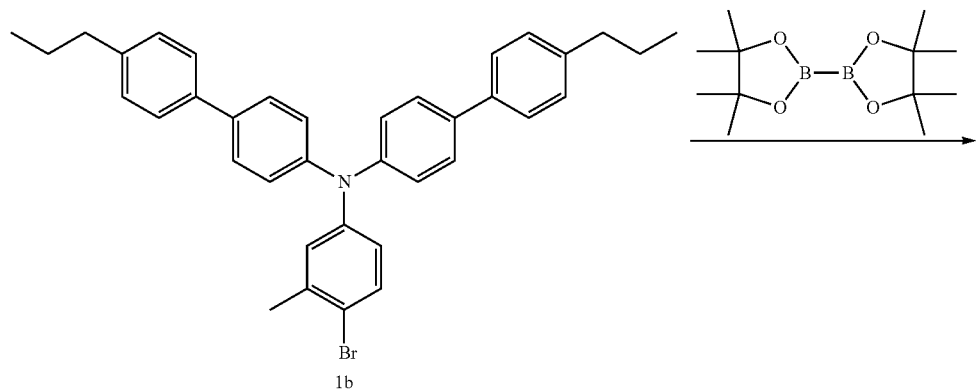

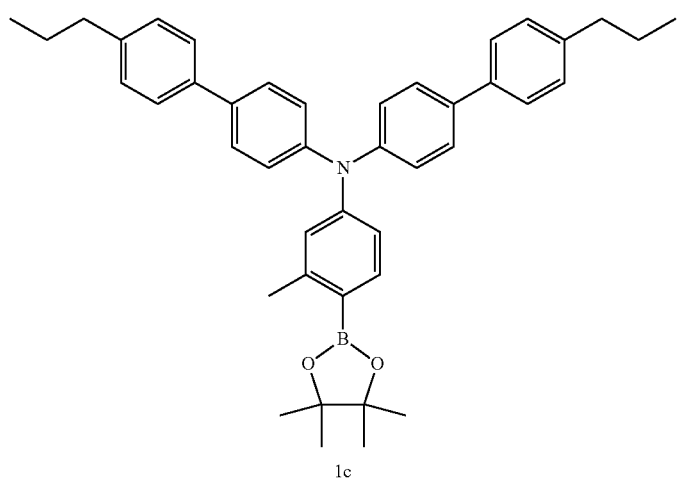

In a nitrogen atmosphere, Intermediate 1b (200 mmol, 114.9 g), bispinacolatodiboron (1.05 eq., 210 mmol, 53.3 g), potassium acetate (2 eq., 400 mmol, 39.3 g), and N,N-dimethylformamide (800 ml) were added to a four-neck flask and dispersed, and 1,1'-(diphenylphosphino)ferrocene] palladium(II) dichloride-dichloromethane adduct (2 mol %, 4 mmol, 3.27 g) were added thereto and refluxed for 10 hours. After the reaction was completed, the reaction product was cooled to room temperature, diluted with toluene (1 L), and filtered by using CELITE. The filtrate obtained therefrom was washed three times by using a separatory funnel, dried by using anhydrous magnesium sulfate, filtered by using a silica gel pad, and then concentrated. The product obtained therefrom was purified by silica gel chromatography (developing solvent:dichloromethane:hexane=1:2), and recrystallization was performed thereon in toluene:ethanol (200 ml:1,000 ml) to obtain Intermediate 1c that is a white solid (obtained amount: 94.5 g, yield: 76%).

Synthesis Example 1-4: Synthesis of Intermediate 1d

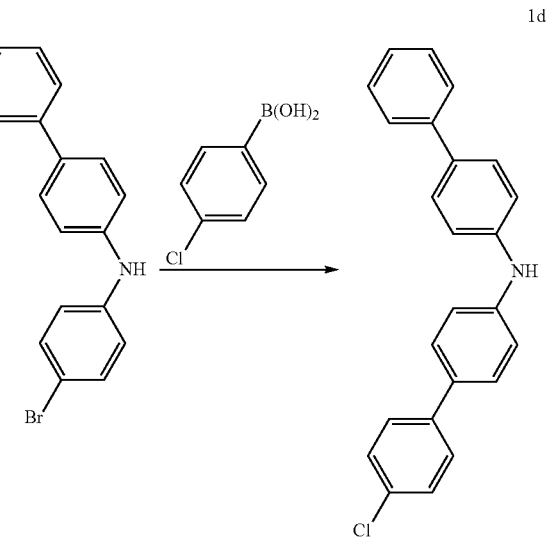

In a nitrogen atmosphere, N-(4-bromophenyl)-[1,1'-biphenyl]-4-amine (160 mmol, 51.9 g), 4-chlorophenylboronic acid (1.05 eq., 168 mmol, 26.3 g), toluene (640 ml), and ethanol (160 ml) were added to a four-neck flask and dissolved. After 160 ml of 2 M aqueous potassium carbonate solution was added thereto, tetrakis(triphenylphosphine)palladium (4.8 mmol, 5.55 g) was added thereto and heated and stirred at a temperature of 70° C. for 12 hours. After the reaction was completed, the reaction product was cooled to room temperature and diluted with methanol to obtain a precipitated solid. The precipitated solid was collected by filtering and washed with methanol. The precipitated solid was vacuum-dried (50° C., 16 hours), dissolved in THF (1 L), filtered by using a silica gel pad, and then concentrated. Recrystallization was performed thereon twice with 200 ml of toluene per 1 g of a purified raw material to obtain Intermediate 1d that is a gray solid (obtained amount: 40.4 g, yield: 71%).

Synthesis Example 1-5: Synthesis of Intermediate 1e

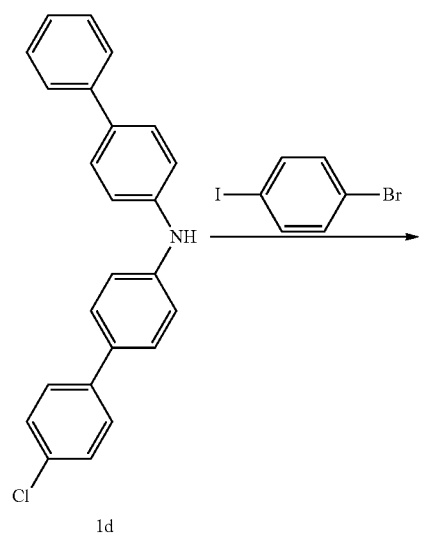

In a nitrogen atmosphere, Intermediate 1d (110 mmol, 39.1 g), 1-bromo-4-iodobenzene (1.2 eq., 132 mmol, 37.3 g), tert-BuONa (1.5 eq., 165 mmol, 15.9 g), and toluene (550 ml) were added to a three-neck flask. After the flask was nitrogen-purged, 1,1'-(diphenylphosphino)ferrocene] palladium(II) dichloride (4 mol %, 4.4 mmol, 3.22 g) was added thereto and heated and stirred at a temperature of 100° C. for 4 hours. After the reaction was completed, the reaction product was diluted with toluene (500 ml), and then filtered by using CELITE. The product obtained therefrom was filtered by using a silica gel pad and concentrated. The result obtained therefrom was purified by silica gel chromatography (hexane:toluene=1:1), and recrystallization was performed thereon twice in a mixed solvent of toluene:hexane=4 ml:10 ml per 1 g of a purified raw material to obtain Intermediate 1e that is a white solid (obtained amount: 37.7 g, yield; 67%).

Synthesis Example 1-6: Synthesis of Intermediate 1f

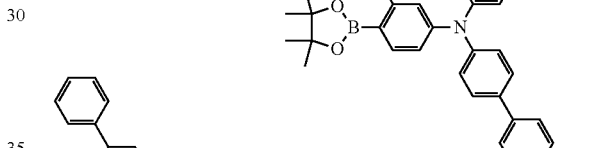

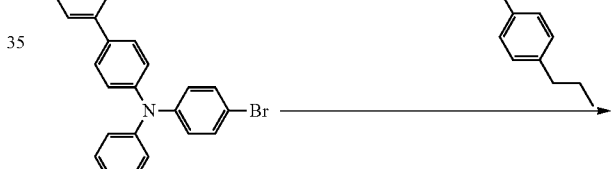

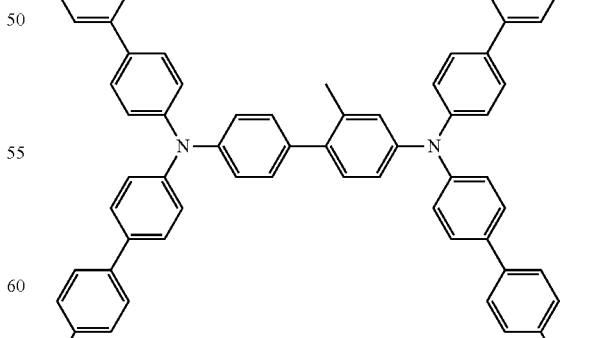

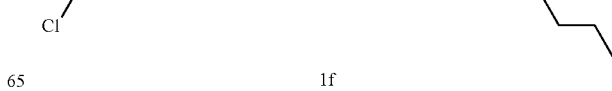

In a nitrogen atmosphere, Intermediate 1e (70 mmol, 35.8 g), Intermediate 1c (1.05 eq., 73.5 mmol, 45.7 g), toluene (350 ml), and ethanol (70 ml) were added to a three-neck flask and dissolved. After 70 ml of 2 M aqueous potassium carbonate solution was added thereto, tetrakis(triphenylphosphine)palladium (3.5 mmol, 4.04 g) was added thereto and heated and stirred at a temperature of 70° C. for 12 hours. After the reaction was completed, the reaction product was diluted with toluene (1 L), washed three times by using a separatory funnel, dried by using anhydrous magnesium sulfate, filtered by using a silica gel pad, and then concentrated. The product obtained therefrom was purified by silica gel chromatography (hexane:toluene=1:1), and recrystallization was performed thereon twice in a mixed solvent of toluene:ethyl acetate=4 ml:10 ml per 1 g of a purified raw material to obtain Intermediate 1f that is a white solid (obtained amount: 47.3 g, yield: 73%).

Synthesis Example 1-7: Synthesis of Intermediate 1g

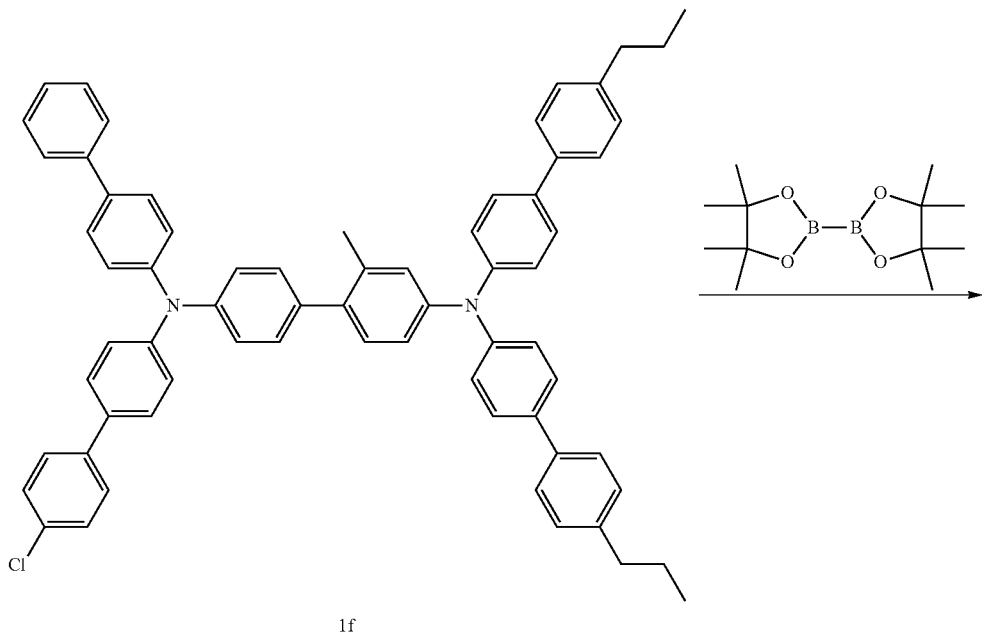

1f

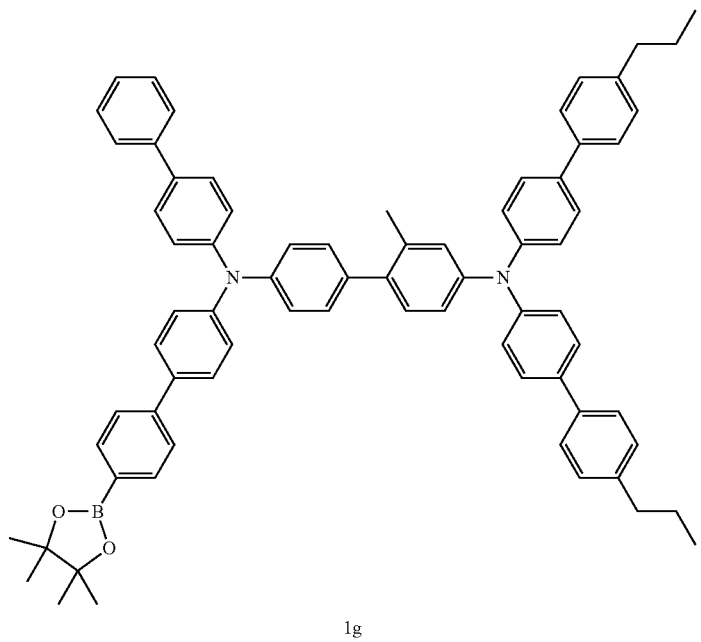

1g

In a nitrogen atmosphere, Intermediate 1f (50 mmol, 46.3 g), bispinacolatodiboron (1.05 eq., 52.5 mmol, 13.3 g), potassium acetate (2 eq., 100 mmol, 9.81 g), and 1,4-dioxane (250 ml) were added, stirred, and then dispersed, and palladium acetate (2 mol %, 1 mmol, 225 mg) and Xphos (4 mol %, 2 mmol, 953 mg) were added thereto and heated and stirred at a temperature of 100° C. for 12 hours. After the reaction was completed, the reaction product was cooled to room temperature, diluted with toluene (1 L), and filtered by using Celite. The filtrate obtained therefrom was washed three times by using a separatory funnel, dried by using anhydrous magnesium sulfate, filtered by using a silica gel pad, and then concentrated. The product obtained therefrom was purified by silica gel chromatography (developing solvent:dichloromethane:hexane=1:2), and recrystallization was performed thereon in toluene:ethanol (200 ml:1,000 ml) to obtain Intermediate 1g that is a pale yellow solid (obtained amount: 40.7 g, yield: 80%).

Synthesis Example 1-8: Synthesis of Intermediate 1h

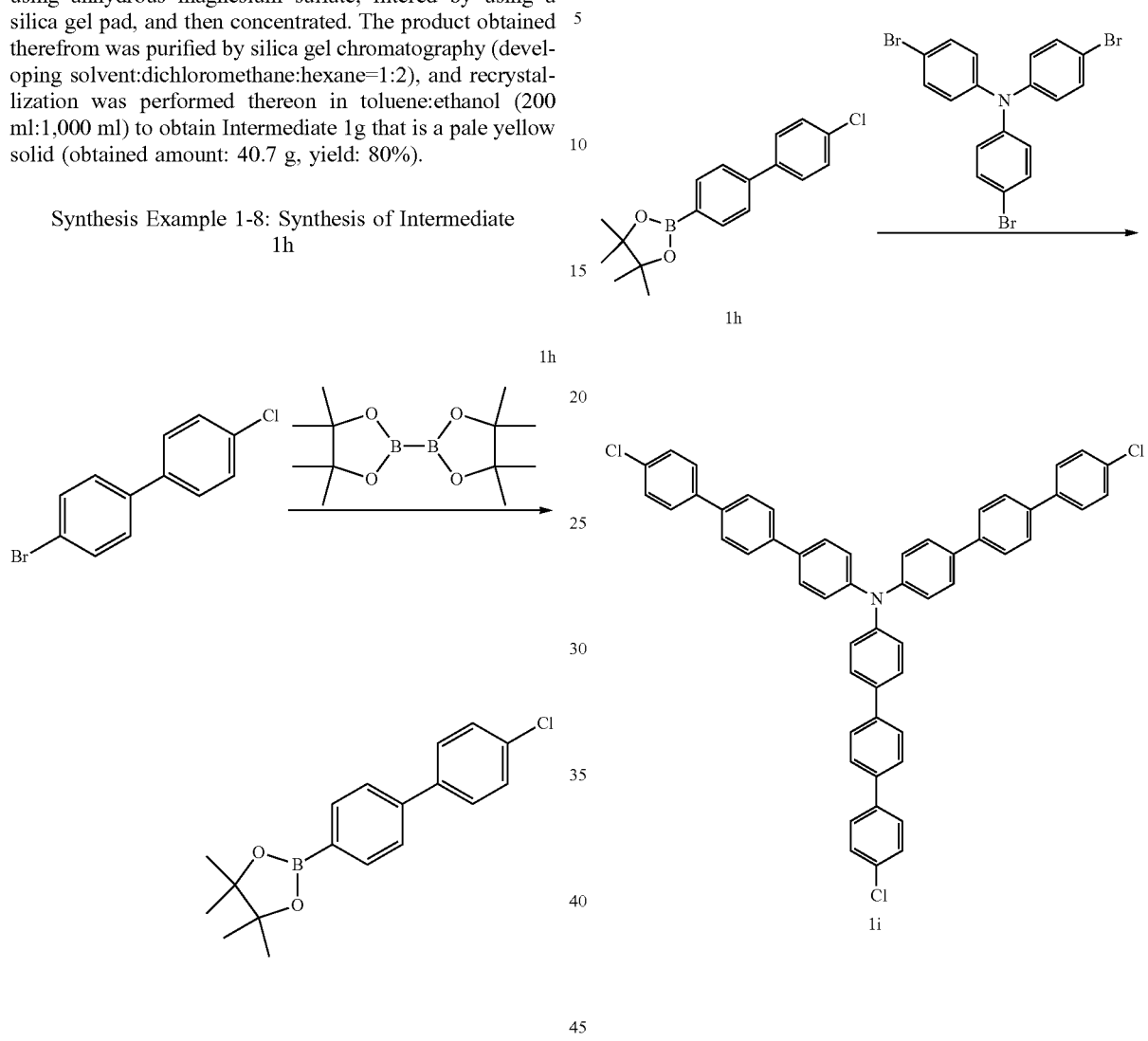

4-bromo-4'-chloro-1,1'-biphenyl (374 mmol, 100.2 g), bispinacolatodiboron (1.05 eq., 392.7 mmol, 99.7 g), potassium acetate (2 eq., 748 mmol, 73.4 g), and N,N-dimethylformamide (1,496 ml) were added, stirred, and then dispersed, and 1'-(diphenylphosphino)ferrocene]palladium(II) dichloride-dichloromethane adduct (2 mol %, 7.5 mmol, 6.10 g) were added thereto and refluxed for 10 hours. After the reaction was completed, the reaction product was diluted with toluene (1.5 L) and filtered by using CELITE. The filtrate obtained therefrom was washed three times by using a separatory funnel, dried by using anhydrous magnesium sulfate, filtered by using a silica gel pad, and then concentrated. Recrystallization was performed thereon twice in a mixed solvent of toluene:hexane (2 ml:10 ml) per 1 g of a purified raw material to obtain Intermediate 1h that is a white solid (obtained amount: 84.7 g, yield: 72%).

Synthesis Example 1-9: Synthesis of Intermediate 1i

Tris(4-bromophenyl)amine (20 mmol, 9.64 g), Intermediate 1h (3.3 eq., 66 mmol, 20.8 g), toluene (100 ml), and ethanol (20 ml) were added to a three-neck flask and dissolved. After 40 ml of 2 M aqueous potassium carbonate solution was added thereto, tetrakis(triphenylphosphine)palladium (0.6 mmol, 0.69 g) was added thereto and heated and refluxed at a temperature of 70° C. for 24 hours. After the reaction was completed, the reaction product was diluted with methanol (200 ml) to obtain a precipitated solid. The precipitated solid was collected by filtering, vacuum-dried (50° C., 16 hours), heated and dissolved in toluene (300 ml), filtered by using a silica gel pad, and then concentrated. Recrystallization was performed thereon twice in toluene (=20 ml) per a purified raw material to obtain Intermediate 1i that was a pale yellow solid (obtained amount: 10.5 g, yield: 65%).

Synthesis Example 1-10: Synthesis of Compound 3'
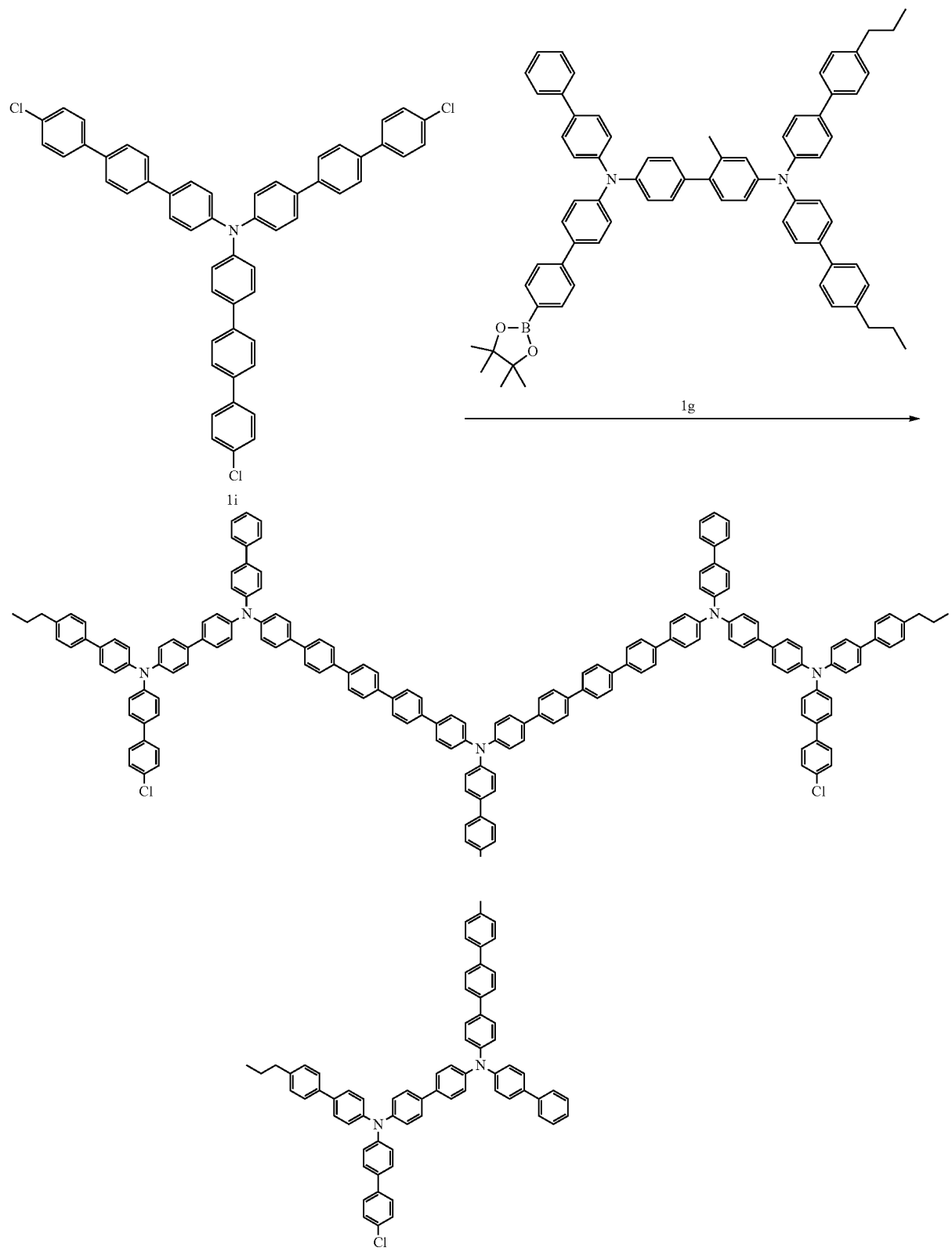

Intermediate 1i (5 mmol, 4.03 g), Intermediate 1g (3.3 eq., 16.5 mmol, 16.78 g), toluene (100 ml), and ethanol (10 ml) were added to a three-neck flask and dispersed. After 15 ml of 2 M aqueous potassium carbonate solution was added thereto, palladium acetate (5 mol %, 0.25 mmol, 56 mg) and Sphos (8 mol %, 0.4 mmol, 164 mg) were added thereto and heated and stirred at a temperature of 70° C. for 24 hours. After the reaction was completed, the reaction product was diluted with methanol (200 ml) to obtain a precipitated solid. The precipitated solid was collected by filtering and vacuum-dried (50° C., 16 hours). The precipitated solid was heated and dissolved in toluene (300 ml), filtered by using a silica gel pad, and then concentrated.

The precipitated solid was purified by silica gel chromatography (developing solvent:toluene) and preparative gel permeation chromatography (GPC) (developing solvent: THF) to obtain Compound 3' that is a light yellow solid (obtained amount: 11.46 g, yield: 68%).

Comparative Example 1: Compound C1

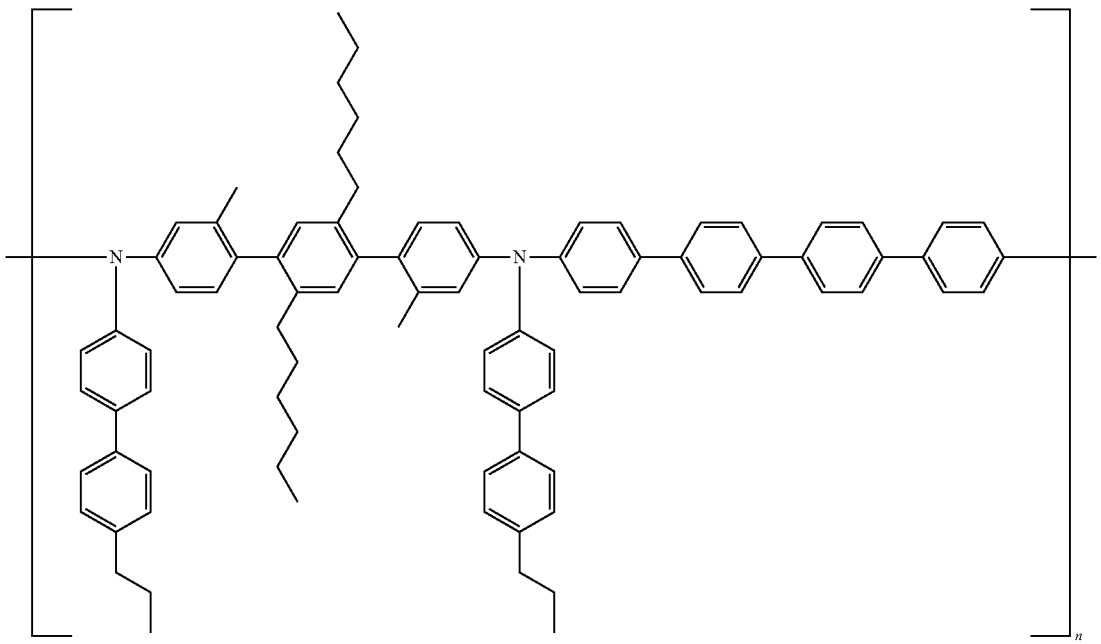

Comparative Example 2: Compound C2

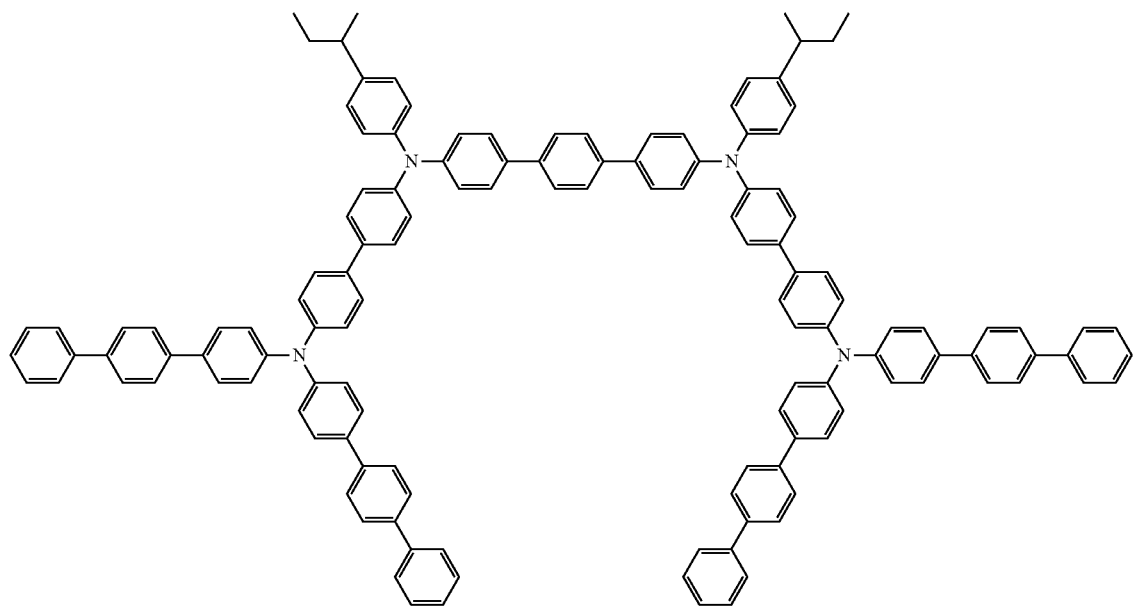

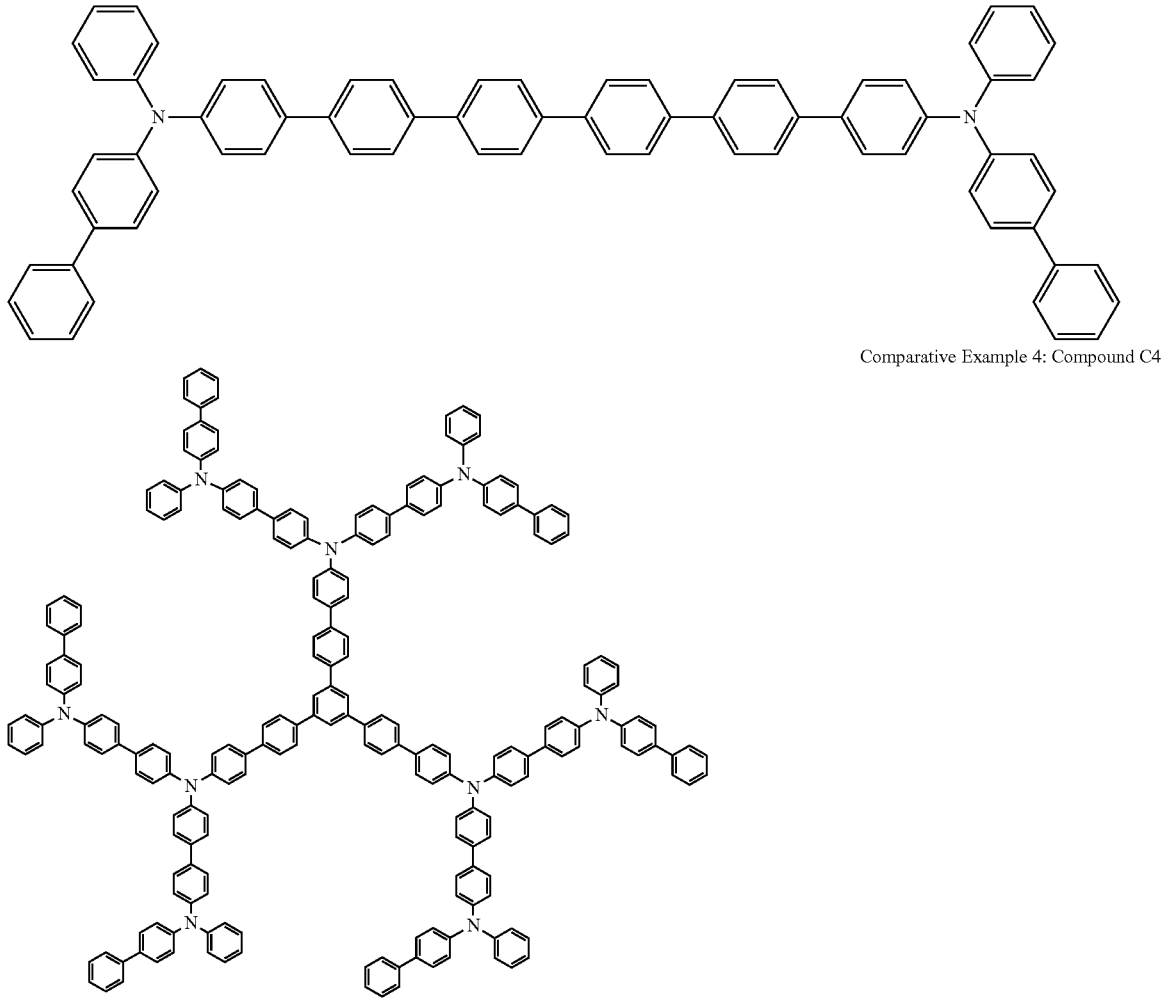

Comparative Example 3: Compound C3

Comparative Example 4: Compound C4

Evaluation Method

Evaluation of Solubility

The solubilities of Compound 3' and Comparative Compounds C1 to C4 in anisole were evaluated. Specifically, anisole was added and heated at a temperature of 80° C. for 10 minutes so that a solid content of each compound was 1 wt %. Then, a dissolved state was visually confirmed. Results thereof are shown in Table 1. The solubility was rated using the following symbols:

○: A state in which a residue is invisible to the naked eye;

Δ: A state in which some residues are slightly visible to the naked eye; and x: A state in which many residues are visible to the naked eye.

Measurement of Viscosity

A viscosity mPa·s) at a temperature of 25° C. was measured with an Ostwald viscometer by using an ink for a hole transport layer manufactured by the same method as the method used for the evaluation of the solubility. It may be said that, when the viscosity is 5 mPa·s or less, it is suitable for ink-jet printing for obtaining a high-precision organic light-emitting device.

Evaluation of Stackability (1) Evaluation of Residual Film Ratio (Evaluation of Probability of Solving Solvent Resistance to Solvent Applied on Upper Layer)

Two types of thin films were manufactured through the following process by using an ink for a hole transport layer manufactured in the same method as the method used for the evaluation of the solubility.

Thin Film 1 (Manufacture of Basic Thin Film)

(A) Film-forming process: An ink film for a hole transport layer was formed on a quartz substrate to a thickness of 100 nm by spin coating.

(B) Drying process: The ink film was heated at a temperature of 230° C. for 1 hour under a vacuum of $10^{-1}$ Pa or less.

(C) Annealing process: The ink film was cooled to room temperature (25° C.) under a vacuum of $10^{-1}$ Pa or less.

Thin film 2 (evaluation of probability of solving dissolution resistance of thin film 1 to solvent applied on upper layer)

(D) A quartz substrate having a thin film obtained in (C) was provided to a spin coating apparatus, and a solvent used in a process of coating an upper layer (hereinafter, referred to as an upper layer solvent) was added dropwise to the thin film. In the present example, methyl benzoate was used as the solvent. Spinning was performed after waiting for 10 seconds in a state in which the upper layer solvent was added dropwise to the thin film.

(E) The same process as those of (B) and (C) was performed.

UV-Vis absorbance was measured by using thin film 1 and thin film 2 obtained in the above, a residual film ratio was evaluated according to Equation 1. This calculation method is based on the Beer-Lambert law.

Residual film ratio=$I_2/I_1 \times 100(\%)$   Equation 1

($I_1$: absorbance of thin film 1; $I_2$: absorbance of thin film 2)

The calculated residual film ratio was determined according to the following criteria:

⊚: Residual film ratio 98% to 99%

○: Residual film ratio 90% to 98% x: Residual film ratio 90% or less.

Results thereof are shown in Table 1 below.

(2) Evaluation of interfacial mixing property between coated stacked layers

An interfacial mixing property of a two-layer thin film in which an emission layer was applied and stacked on a hole transport layer was evaluated according to a method (hereinafter, a photo luminescence (PL) method) disclosed in Patent Document (WO 2015/089304), and incorporated herein by reference. The symbols used are described below ○: Interfacial mixing is invisible.

Δ: Interfacial mixing is slightly visible.

x: Interfacial mixing is strongly visible.

The results thereof are shown in Table 1.

Manufacture of Organic Light-Emitting Device

Example 1

A glass substrate in which a stripe-shaped 150 nm ITO (anode) was deposited as a first electrode (anode) was prepared. Poly(3,4-ethylene dioxythiophene)/poly(4-styrenesulfonate) (PEDOT/PSS) (manufactured by Sigma-Aldrich) was deposited on the glass substrate by spin coating so that a thickness of a dry film was 30 nm, thereby forming a hole injection layer.

Then, an ink for a hole transport layer including Compound 3' produced in the above was deposited on the hole injection layer by spin coating, so that a thickness of a dry film was 100 nm, was heated at a temperature of 230° C. for 1 hour under a vacuum of $10^{-1}$ Pa or more, and was cooled to room temperature under a vacuum of $10^{-1}$ Pa or less to form a hole transport layer.

Then, an ink for an emission layer (Compounds h-1 and h-2 obtained in the above as a host material, a methyl benzoate solution that was a composition including Compound TEG (D1, tris(2-(3-p-xylyl)phenyl)pyridineiridum) as a dopant material), which was a liquid composition, was deposited on the hole transport layer by spin coating so that a thickness of a dry film was 30 nm, thereby forming an emission layer on the hole transport layer.

The ink for the emission layer included 1.2 parts by weight of Compound h-1 as a solid, 2.8 parts by weight of Compound h-2, and 0.4 parts by weight of TEG based on 100 parts by weight of methyl benzoate as a solvent.

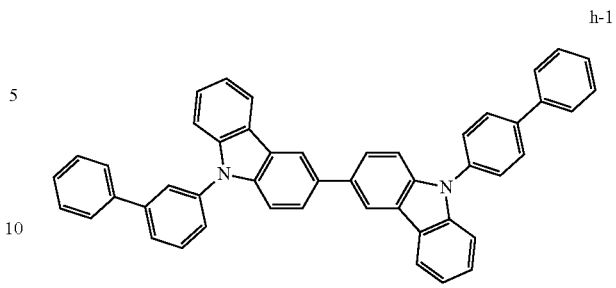

h-1

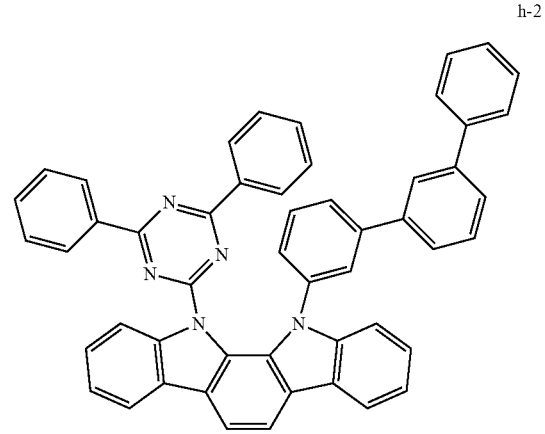

h-2

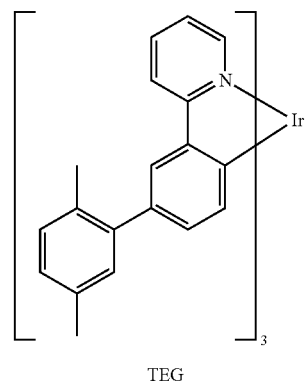

TEG (8-quinolinolato)lithium (LiQ) and KLET-03 (manufactured by Chemipro Kasei) were co-deposited on the emission layer at a weight ratio of 2:8 in a vacuum deposition apparatus to form an electron transport layer having a thickness of 30 nm.

Lithium fluoride (LiF) was deposited on the electron transport layer in a vacuum deposition apparatus to form an electron injection layer having a thickness of 1 nm.

Aluminum (Al) was deposited on the electron injection layer in a vacuum deposition apparatus to form a second electrode (cathode) having a thickness of 100 nm.

Then, a sealed organic light-emitting device was manufactured by using a glass sealing tube containing a drying agent and an ultraviolet curable resin in a nitrogen atmosphere glove box having a moisture concentration of 1 ppm or less and an oxygen concentration of 1 ppm or less.

Comparative Examples 1 to 4

Organic light-emitting devices were manufactured in the same manner as in Example 1, except that inks for a hole transport layer including Comparative Compounds $C_1$ to C4 were each used instead of an ink for a hole transport layer including Compound 3'.

Evaluation of Organic Light-Emitting Devices

The driving voltage, current efficiency, and light-emission lifespan (durability) were evaluated by the following methods.

A DC constant voltage supply (KEYENCE Source Meter) was used to continuously change a voltage applied to an organic light-emitting device from 0 V to 20 V, so that the organic light-emitting device was energized to emit light. Luminance at this time was measured by a luminance measurement apparatus (SR-3 manufactured by Topcom).

A current value per unit area in the area of the organic light-emitting device (current density) was calculated, and a current efficiency (cd/A) was calculated by dividing luminance ($cd/m^2$) by the current density ($A/m^2$). Also, the current efficiency indicates the efficiency (conversion efficiency) of converting the current into luminescence energy. As the current efficiency is higher, the performance of the organic light-emitting device is higher.

Also, for the light-emission lifespan (durability), an amount of time until light-emission luminance decreasing with the lapse of a continuous operation time was 80% of initial luminance (100%) at a current value at which initial luminance was 6,000 $cd/m^2$ was measured as "LT80(h)."

Evaluation results thereof are shown in Table 1. In Table 1, the current efficiency is expressed as a relative value when the current efficiency of the organic light-emitting device of Comparative Example 1 is 100. The light-emission lifespan (durability) is expressed as a relative value when the lifespan (LT80(h)) of the organic light-emitting device of Comparative Example 1 is 100. "*1" indicates that the measurement was impossible because Comparative Compound was not dissolved. Also, "*2" indicates that the measurement was impossible because the light-emitting device could not be measured.

one or more embodiments. Also, it may be seen that the low-molecular-weight amine compounds $C_2$, $C_3$, and C4 have poor solubility and stackability and are not suitable for forming a thin film stacked structure.

Example 2

An organic light-emitting device was manufactured in the same manner as in Example 1, except that Compound I was added to the ink for the hole transport layer as a low-molecular-weight compound at 20 wt % based on Compound 3'.

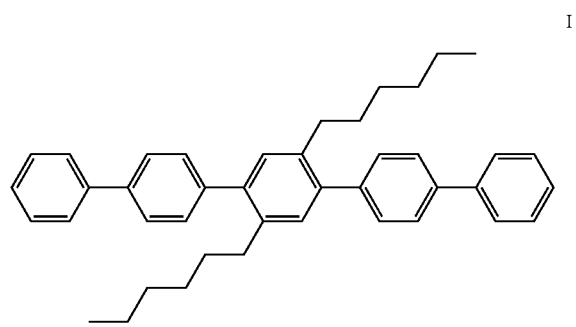 [SMILES: CCCCCCc1cc(-c2ccc(-c3ccccc3)cc2)c(CCCCCC)cc1-c1ccc(-c2ccccc2)cc1]

I

Comparative Example 5

An organic light-emitting device was manufactured in the same manner as in Comparative Example 1, except that Compound I was added to the ink for the hole transport layer

TABLE 1

|  | Compound | Solubility | Viscosity (mPa · s) | Stackability | | | Driving voltage (V) | Current efficiency (relative value) | Light-emission lifespan (relative value) |
| --- | --- | --- | --- | --- | --- | --- | --- | --- | --- |
|  |  |  |  | Residual film ratio | Interfacial mixing property |  |  |  |  |
| Example 1 | 3' | ○ | 4 | ○ | Δ |  | 5.8 | 114 | 140 |
| Comparative Example 1 | C1 | ○ | 8 | ○ | Δ |  | 6.0 | 100 | 100 |
| Comparative Example 2 | C2 | Δ | 4 | X | X |  | 7.2 | 40 | 15 |
| Comparative Example 3 | C3 | X | *1 | *1 | *1 |  | *2 | *2 | *2 |
| Comparative Example 4 | C4 | ○ | 4 | X | X |  | 6.8 | 60 | 5 |

From the results of Table 1, it is confirmed that Compound 3' according to one or more embodiments are excellent in terms of solubility, viscosity, stackability, driving voltage, current efficiency, and light-emission lifespan.

Meanwhile, it is confirmed that, unlike one or more embodiments of the present disclosure, the low-molecular-weight amine compound $C_1$ has high viscosity and exhibits poor characteristics in terms of driving voltage, current efficiency, and light-emission lifespan, as compared with as a low-molecular-weight compound at 20 wt % based on Compound C1.

Results thereof are shown in Table 2. In Table 2, the current efficiency is expressed as a relative value when the current efficiency of the organic light-emitting device of Comparative Example 1 is 100. The light-emission lifespan (durability) is expressed as a relative value when the lifespan of the organic light-emitting device of Comparative Example 1 is 100.

TABLE 2

| | Compound | Addition ratio of low-molecular-weight compound (wt % based on compound) | Stackability | | Driving voltage (V) | Current efficiency (relative value) | Light-emission lifespan (relative value) |
|---|---|---|---|---|---|---|---|
| | | | Residual film ratio | Interfacial mixing property | | | |
| Example 1 | 3' | 0 | ○ | Δ | 5.8 | 114 | 140 |
| Example 2 | 3' | 20 | ○ | ○ | 5.7 | 139 | 265 |
| Comparative Example 5 | C1 | 20 | ○ | Δ | 5.9 | 105 | 100 |

From the results of Table 2, it is confirmed that the organic light-emitting device of Example 2, in which the low-molecular-weight compound is added to the hole transport layer, has more excellent stackability than the organic light-emitting device of Example 1, in which the low-molecular-weight compound is not added, and therefore, the organic light-emitting device of Example 2 is excellent in terms of driving voltage, current efficiency, and light-emission lifespan.

When the charge transport material is employed, the organic light-emitting device having excellent performance (for example, efficiency, lifespan, or the like) may be provided even when the hole transport layer is formed by the wet method.

Although the present disclosure has been described with reference to Synthesis Examples and Examples, the present disclosure is not limited to specific embodiments, and various modifications may be made therein without departing from the spirit and scope as defined in the following claims.

The invention claimed is:

1. A charge transport material represented by Formula 1:

Formula 1

$$(Ar_1)_{b1}\text{—}(L_1)_{a1}\text{—}(G_1)_{c1}\text{—}[(L_2)_{a2}\text{—}(G_2)_{c2}\text{—}[(L_3)_{a3}\text{—}A]_{n2}]_{n1}$$

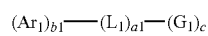

2-1

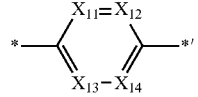

2-2

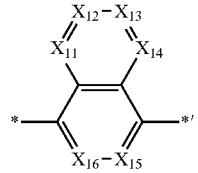

2-3

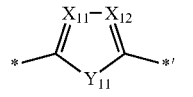

2-4

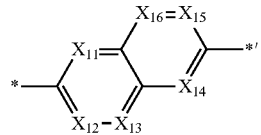

2-5

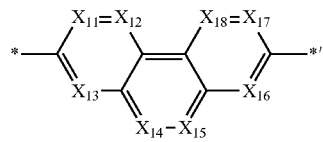

2-6

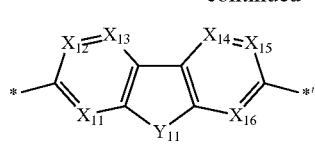

3-1

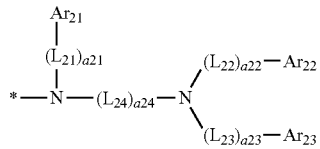

3-2

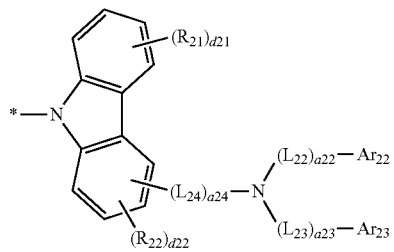

3-3 wherein, in Formulae 1, 2-1 to 2-6, and 3-1 to 3-3,
$Ar_1$ is a substituted or unsubstituted $C_5$-$C_{60}$ carbocyclic group,
b1 is an integer from 0 to 2,
$L_1$ to $L_3$ are each independently groups represented by Formulae 2-1 to 2-6,
a2 is an integer from 3 to 10, wherein, when $L_2$(s) in the number of a2 are each groups represented by Formulae 2-1 to 2-3, then a2 is 4 to 10,
a1 and a3 are each independently an integer from 0 to 10,
wherein, when b1 is 0, a1 is 0, then $G_1$ and $G_2$ are each independently trivalent nitrogen, tetravalent silicon, a substituted or unsubstituted $C_5$-$C_{60}$ carbocyclic group, or a substituted or unsubstituted $C_1$-$C_{60}$ heterocyclic group,
c1 is an integer from 1 to 10,
c2 is 0 or 1, wherein, when c2 is 0, then $G_2$ is a single bond,
A is a group represented by Formulae 3-1 to 3-3,
$X_{11}$ to $X_{18}$ are each independently $C(R_{11})$ or N,
$Y_{11}$ is O, S, Se, C(=O), $C(R_{11})(R_{12})$, or $N(R_{11})$, $L_{21}$ to $L_{24}$ are each independently a group represented by Formulae 2-1 to 2-6, a21 to a23 are each independently an integer from 0 to 5, a24 is an integer from 1 to 5, $Ar_{21}$ to $Ar_{23}$ are each independently a substituted or unsubstituted $C_5$-$C_{60}$ carbocyclic group or a substituted or unsubstituted $C_1$-$C_{60}$ heterocyclic group, $R_{11}$ to $R_{12}$ and $R_{21}$ to $R_{23}$ are each independently hydrogen, deuterium, —F, —Cl, —Br, —I, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), or —N($Q_1$)($Q_2$), d21 is an integer from 0 to 4, d22 is an integer from 0 to 3, any two adjacent groups among $R_{11}$, $R_{12}$, $R_{21}$(s) in the number of d21, $R_{22}$(s) in the number of d22, and $R_{23}$ are optionally linked to form a substituted or unsubstituted $C_5$-$C_{30}$ carbocyclic group or a substituted or unsubstituted $C_1$-$C_{30}$ heterocyclic group, n1 is an integer from 2 to 8, n2 is 1 or 2, wherein at least one of A(s) in the number of n1×n2 comprises one or more $C_1$-$C_{60}$ alkyl groups, and a total number of carbon atoms of the one or more $C_1$-$C_{60}$ alkyl groups is 6 or more, at least one substituent of the substituted $C_5$-$C_{60}$ carbocyclic group, the substituted $C_1$-$C_{60}$ heterocyclic group, the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, —NCS, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, —NCS, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, —Si($Q_1$)($Q_2$)($Q_{13}$), —N($Q_{11}$)($Q_2$), —C(=O)($Q_{11}$), or any combination thereof;

a $C_3$-$C_{10}$ cycloalkyl group, a $C_1$-$C_{10}$ heterocycloalkyl group, a $C_3$-$C_{10}$ cycloalkenyl group, or a $C_1$-$C_{10}$ heterocycloalkenyl group;

a $C_3$-$C_{10}$ cycloalkyl group, a $C_1$-$C_{10}$ heterocycloalkyl group, a $C_3$-$C_{10}$ cycloalkenyl group, or a $C_1$-$C_{10}$ heterocycloalkenyl group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, —Si($Q_{21}$)($Q_{22}$)($Q_{23}$), —N($Q_{21}$)($Q_{22}$), —C(=O)($Q_{21}$), or any combination thereof; or —Si($Q_{31}$)($Q_{32}$)($Q_{33}$), —N($Q_{31}$)($Q_{32}$), or —C(=O)($Q_{31}$), $Q_1$ to $Q_3$, $Q_{11}$ to $Q_{13}$, $Q_{21}$ to $Q_{23}$, and $Q_{31}$ to $Q_{33}$ are each independently hydrogen, deuterium, a $C_1$-$C_{20}$ alkyl group, a $C_1$-$C_{20}$ alkoxy group, a phenyl group, or a biphenyl group, and

* and *' each indicate a binding site to a neighboring atom.

2. The charge transport material of claim 1, wherein $Ar_1$ is: a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, or a pyranthrenyl group; or a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, or a pyranthrenyl group, each substituted with at least one deuterium, —F, —Cl, —Br, —I, a hydroxyl group, a cyano group, a nitro group, an amino group, an amidino group, a hydrazino group, a hydrazono group, a $C_1$-$C_{30}$ alkyl group, a $C_1$-$C_{30}$ alkoxy group, a phenyl group, a pentalenyl group, an indenyl group, a naphthyl group, an anthracenyl group, an azulenyl group, a heptalenyl group, an acenaphthyl group, a phenalenyl group, a fluorenyl group, a spiro-bifluorenyl group, a benzofluorenyl group, a dibenzofluorenyl group, a phenanthrenyl group, a biphenyl group, a terphenyl group, a fluoranthenyl group, a pyrenyl group, a chrysenyl group, a picenyl group, a perylenyl group, a pentaphenyl group, a pentacenyl group, a tetraphenyl group, a hexaphenyl group, a hexacenyl group, a rubicenyl group, a trinaphthyl group, a heptaphenyl group, a pyranthrenyl group, or any combination thereof.

3. The charge transport material of claim 1, wherein $L_1$ to $L_3$ are each independently groups represented by Formulae 4-1 to 4-3:

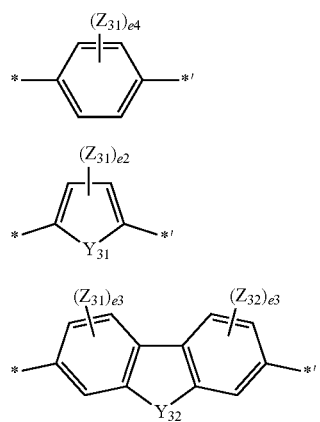

wherein, in Formulae 4-1 to 4-3, $Y_{31}$ is O, S, or Se, $Y_{32}$ is O, S, Se, C(=O), C($Z_{33}$)($Z_{34}$), or N($Z_{33}$), $Z_{31}$ to $Z_{34}$ are each independently hydrogen, —F, —Cl, —Br, —I, a hydroxyl group, a cyano group, a nitro group, or a $C_1$-$C_{30}$ alkyl group, e2 is an integer from 0 to 2, e3 is an integer from 0 to 3, e4 is an integer from 0 to 4, and

* and *' each indicate a binding site to a neighboring atom.

4. The charge transport material of claim 1, wherein *-($L_3$)$_{a3}$-*' is a single bond or a group represented by Formulae 4(1) or 4(2):

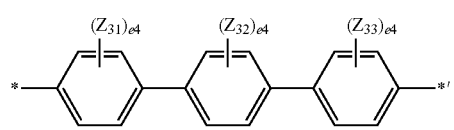

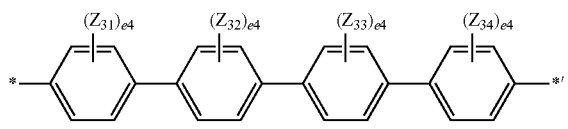

wherein, in Formulae 4(1) and 4(2), $Z_{31}$ to $Z_{34}$ are each independently hydrogen, —F, —Cl, —Br, —I, a hydroxyl group, a cyano group, a nitro group, or a $C_1$-$C_{30}$ alkyl group, e24 is an integer from 0 to 4, and

* and *' each indicate a binding site to a neighboring atom.

5. The charge transport material of claim 1, wherein ($G_1$)$_{c1}$ is groups represented by Formulae 5-1 to 5-8, and ($G_2$), is a single bond or a group represented by Formulae 5-1 to 5-8:

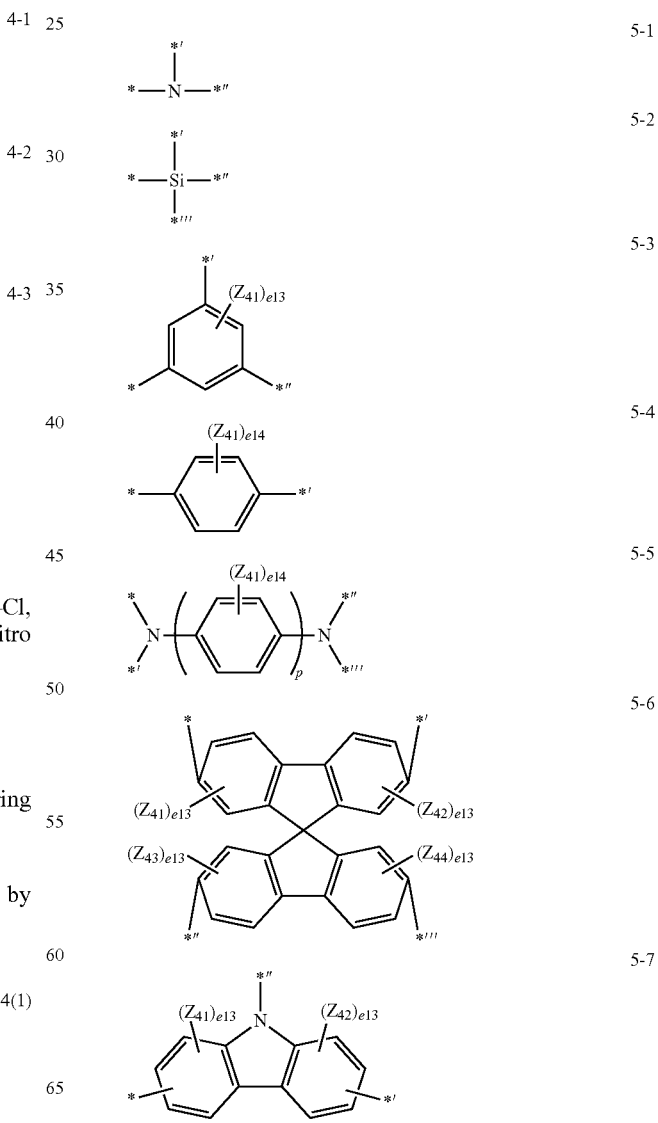

-continued

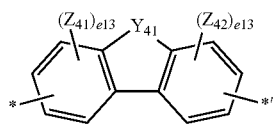
5-8 wherein, in Formulae 5-1 to 5-8, $Y_{41}$ is O, S, Se, C(=O), C($Z_{45}$)($Z_{46}$), or N($Z_{45}$), $Z_{41}$ to $Z_{46}$ are each independently hydrogen, —F, —Cl, —Br, —I, a hydroxyl group, a cyano group, a nitro group, or a $C_1$-$C_{30}$ alkyl group, e13 is an integer from 0 to 3, e14 is an integer from 0 to 4, and

*, *', *'', and *''' each indicate a binding site to a neighboring atom.

6. The charge transport material of claim 1, wherein $L_{21}$ to $L_{24}$ are each independently a group represented by Formulae 4-1 to 4-3:

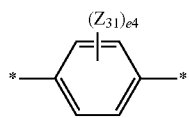
4-1

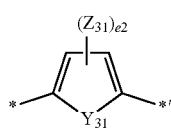
4-2

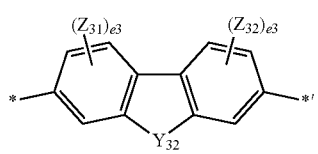
4-3 wherein, in Formulae 4-1 to 4-3, $Y_{31}$ is O, S, or Se, $Y_{32}$ is O, S, Se, C(=O), C($Z_{33}$)($Z_{34}$), or N($Z_{33}$), $Z_{31}$ to $Z_{34}$ are each independently hydrogen, —F, —Cl, —Br, —I, a hydroxyl group, a cyano group, a nitro group, or a $C_1$-$C_{30}$ alkyl group, e2 is an integer from 0 to 2, e3 is an integer from 0 to 3, e4 is an integer from 0 to 4, and

* and *' each indicate a binding site to a neighboring atom.

7. The charge transport material of claim 1, wherein *-($L_{24}$)$_{a24}$-*' is a single bond or a group represented by Formulae 6-1 to 6-6:

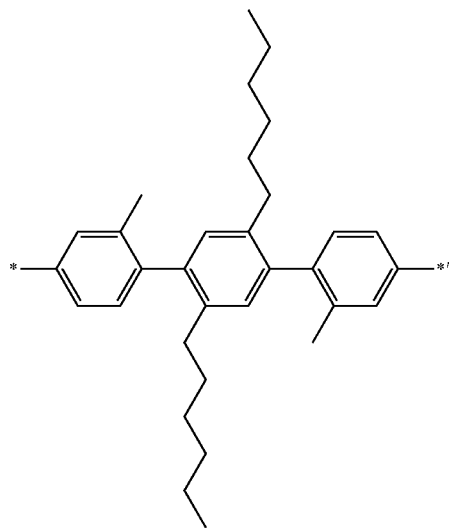
6-1

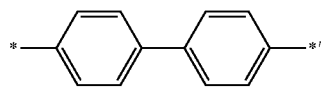
6-2

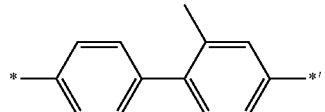
6-3

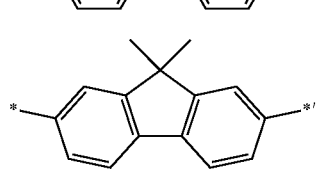
6-4

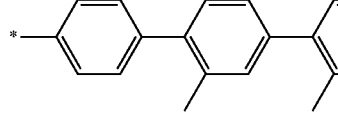
6-5

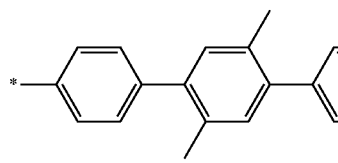
6-6 wherein, in Formulae 6-1 to 6-6,

* and *' each indicate a binding site to a neighboring atom.

8. The charge transport material of claim 1, wherein *-($L_{22}$)$_{a2}$-$Ar_{22}$ and *-($L_{23}$)$_{a23}$-$Ar_{23}$ are each independently a group represented by Formulae 7-1 to 7-5:

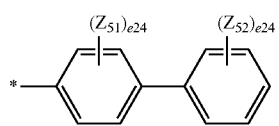
7-1

141
-continued

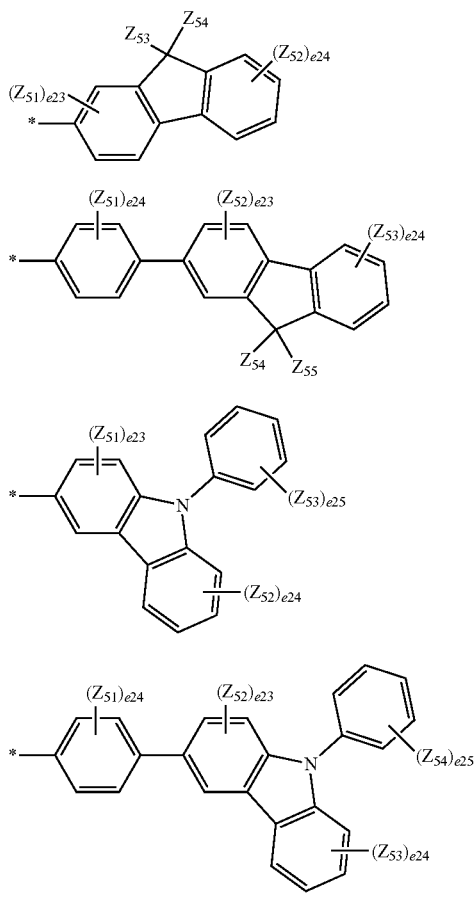

wherein, in Formulae 7-1 to 7-5, $Z_{51}$ to $Z_{55}$ are each independently hydrogen, —F, —Cl, —Br, —I, a hydroxyl group, a cyano group, a nitro group, a $C_1$-$C_{30}$ alkyl group, or a $C_3$-$C_{10}$ cycloalkyl group, e23 is an integer from 0 to 3, e24 is an integer from 0 to 4, e25 is an integer from 0 to 5, and

* indicates a binding site to a neighboring atom.

9. The charge transport material of claim 1, wherein $R_{11}$ to $R_{12}$ and $R_{21}$ to $R_{23}$ are each independently:

hydrogen, deuterium, —F, —Cl, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, or a naphthyl group; or a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, or a naphthyl group, each substituted with at least one deuterium, —F, —Cl, —Br, —I, a cyano group, a phenyl group, a biphenyl group, a terphenyl group, or any combination thereof.

10. The charge transport material of claim 1, wherein n1 is an integer from 2 to 6.

11. The charge transport material of claim 1, wherein A is at least one of Formulae A1 to A9:

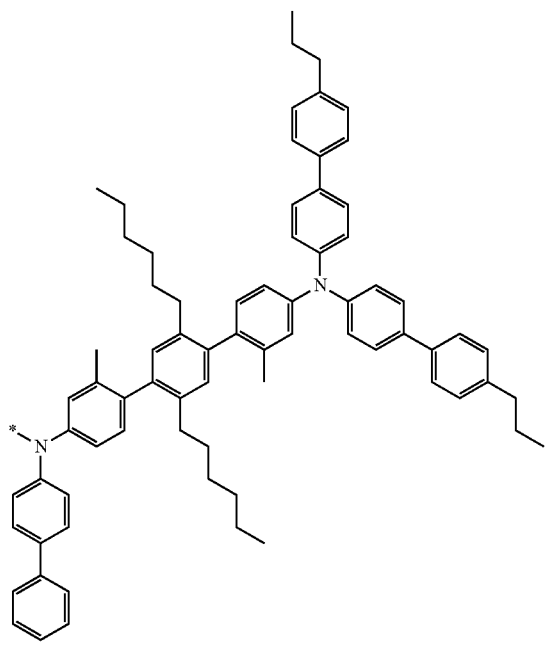

A1

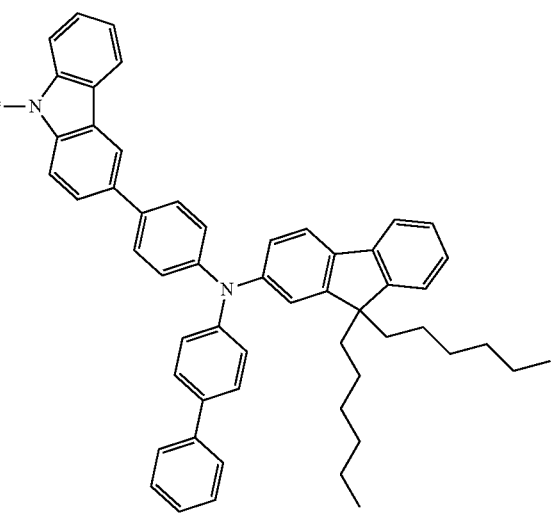

A2

143
-continued
A3
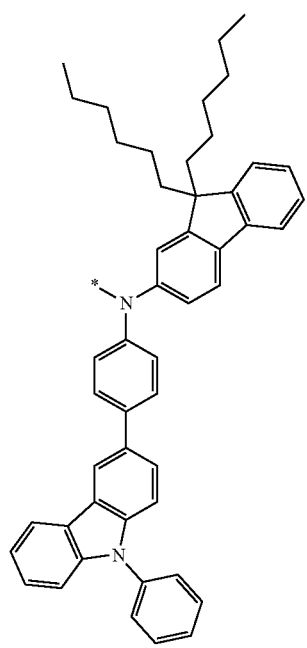
144
-continued
A5
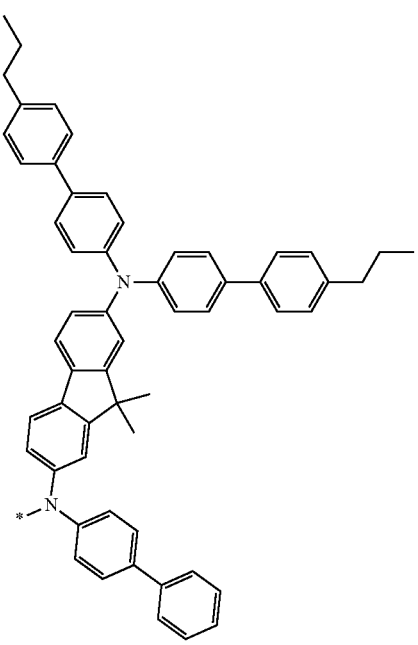
A4
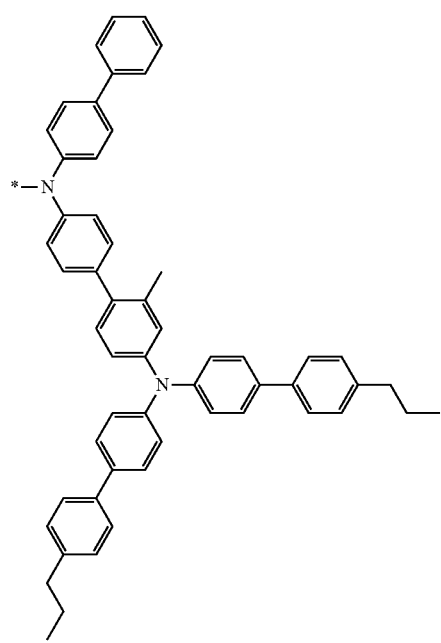
A6
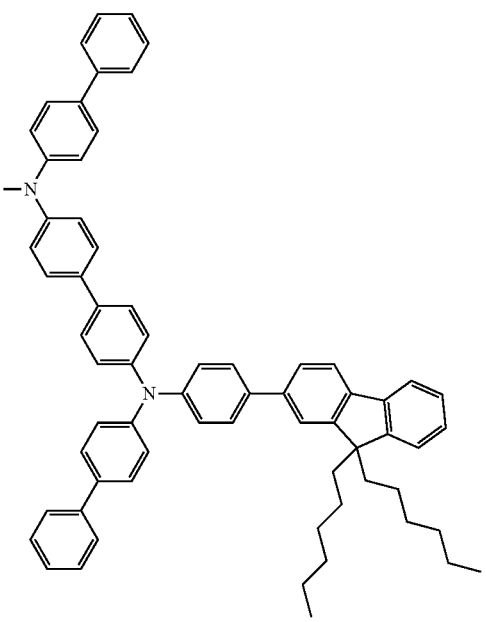

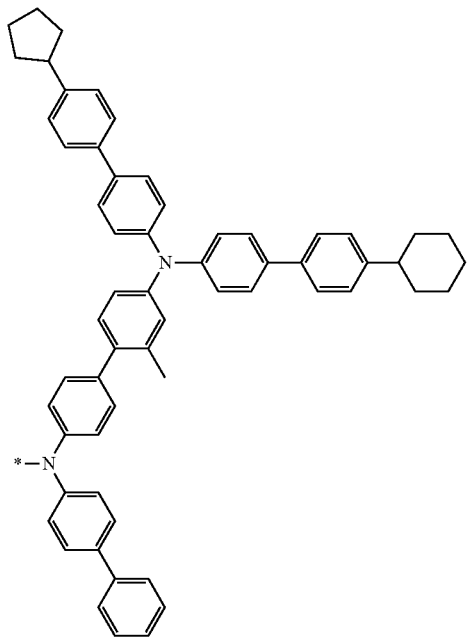

A7

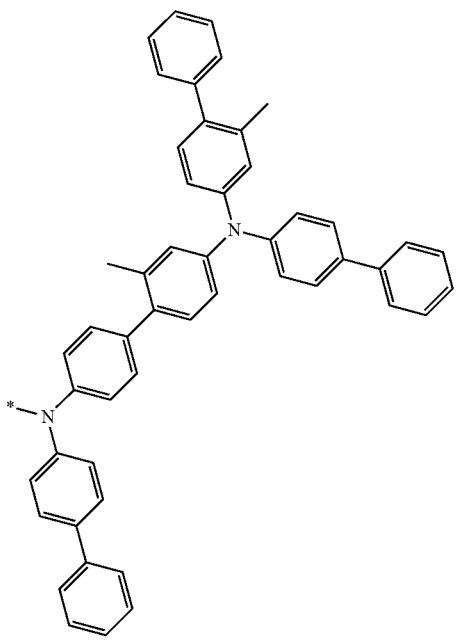

A9

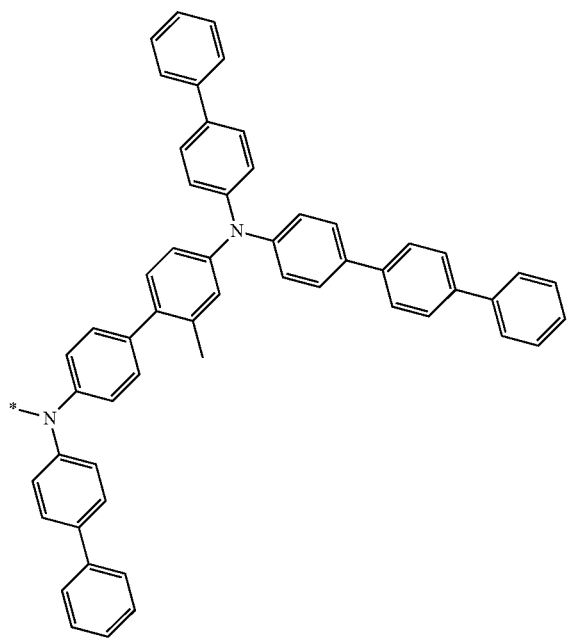

A8 wherein, in Formulae A1 to A9,
* indicates a binding site to a neighboring atom.

12. The charge transport material of claim 1, wherein
a total number of carbon atoms of the one or more $C_1$-$C_{60}$ alkyl groups comprised in A(s) in the number of n1×n2 is 6 to 40.

13. The charge transport material of claim 1, wherein
the charge transport material is a group represented by Formulae 1-1 to 1-10:

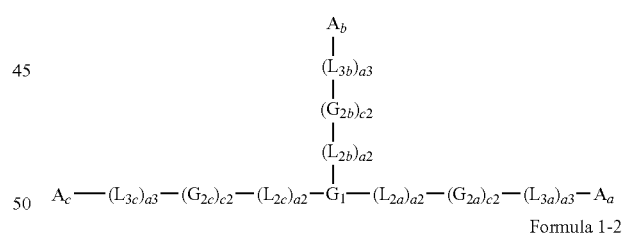

Formula 1-1

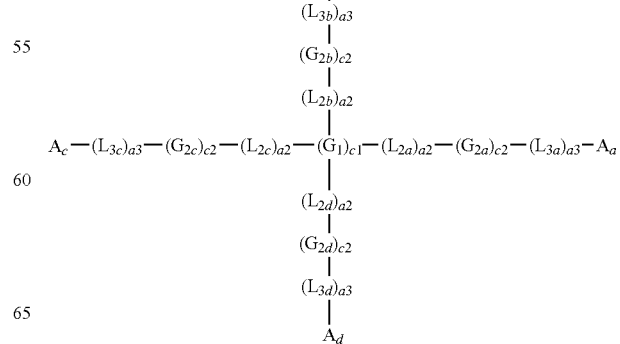

Formula 1-2

Formula 1-3

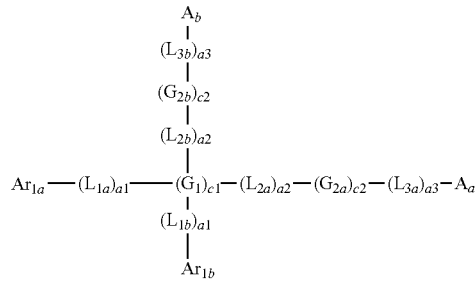

Formula 1-4

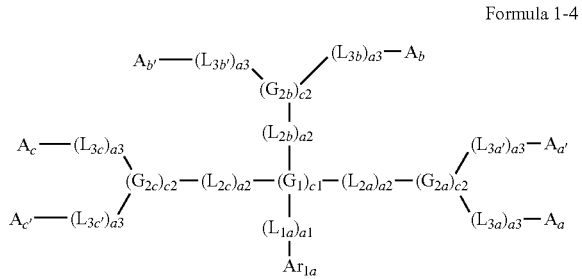

Formula 1-5

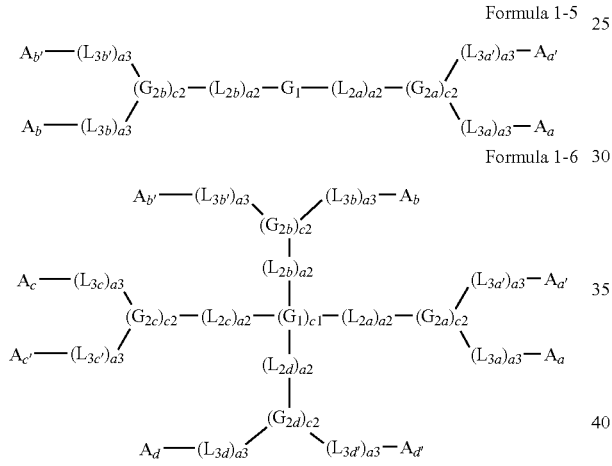

Formula 1-6

Formula 1-7

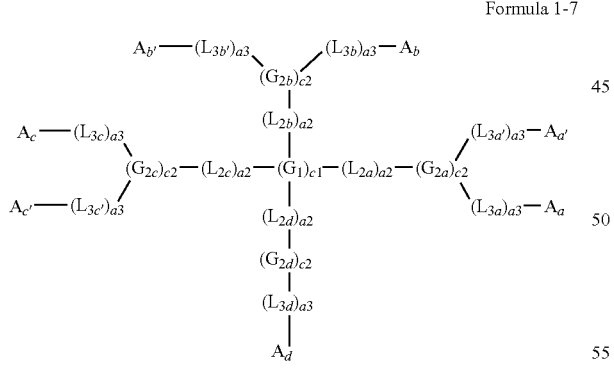

Formula 1-8

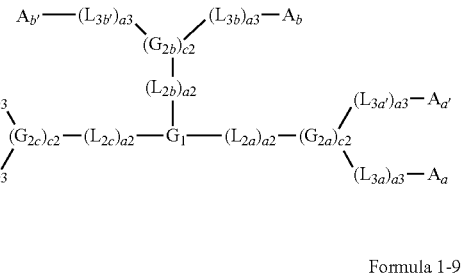

Formula 1-9

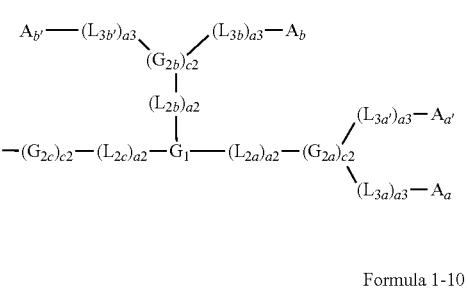

Formula 1-10

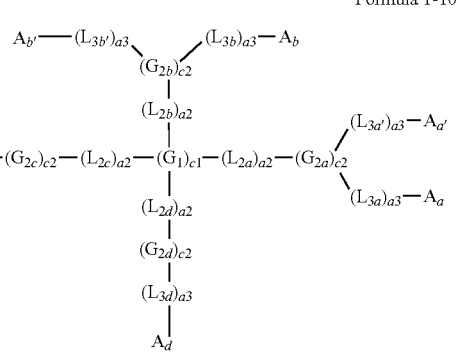

wherein, in Formulae 1-1 to 1-10, $Ar_{1a}$ to $Ar_{1b}$, $L_{1a}$ to $L_{1b}$, $L_{2a}$ to $L_{2a'}$, $L_{3a}$ to $L_{3a'}$, a1 to a3, $G_1$, $G_{2a}$ to $G_{2a}$, c1, c2, and $A_a$ to $A_{d'}$ are each independently the same as defined in connection with $Ar_1$, $L_1$ to $L_3$, a1 to a3, $G_1$, $G_2$, c1, c2, and A in claim 1.

14. The charge transport material of claim 1, wherein the charge transport material has a viscosity of about 5 mPa·s or less at 25° C.

15. The charge transport material of claim 1, wherein the charge transport material has a weight average molecular weight of about 2,000 to about 20,000.

16. The charge transport material of claim 1, wherein the charge transport material is at least one of Compounds 1 to 23:

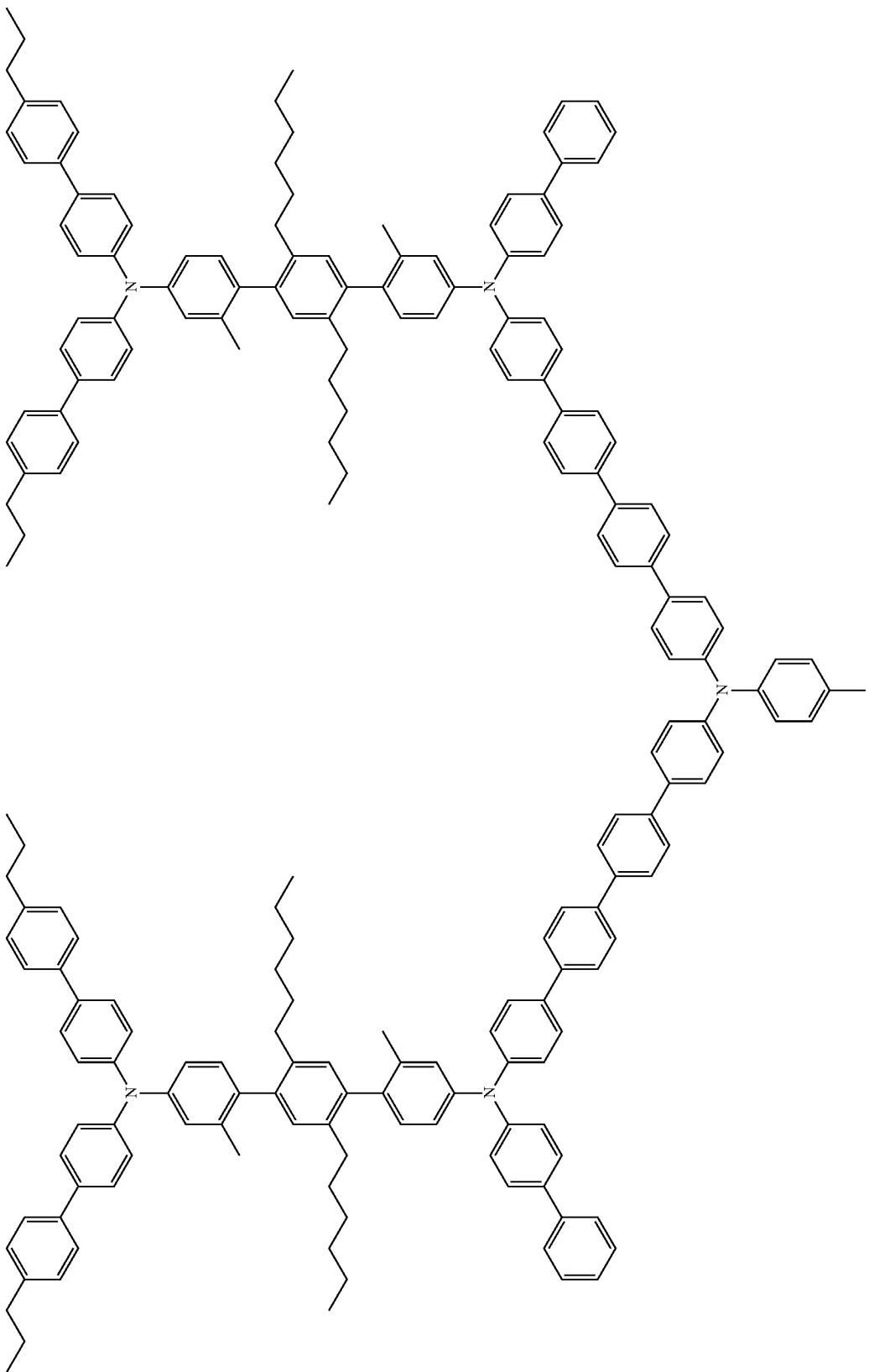

-continued
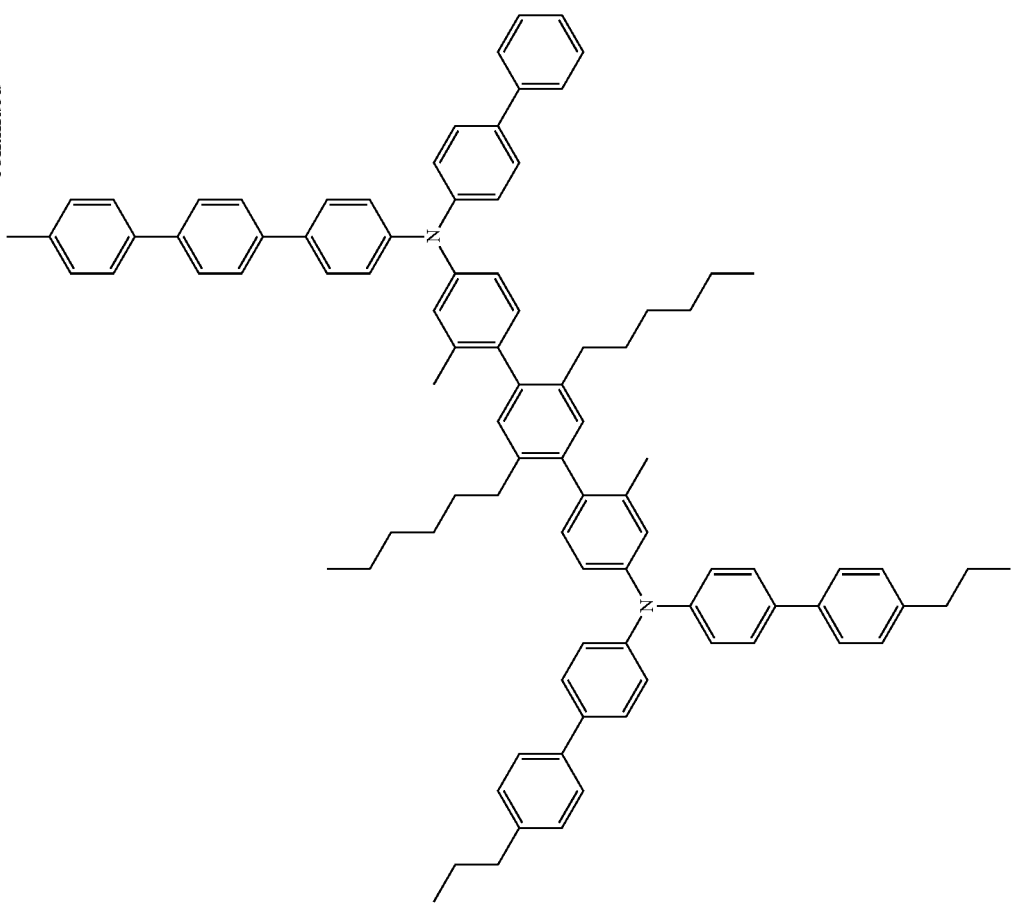

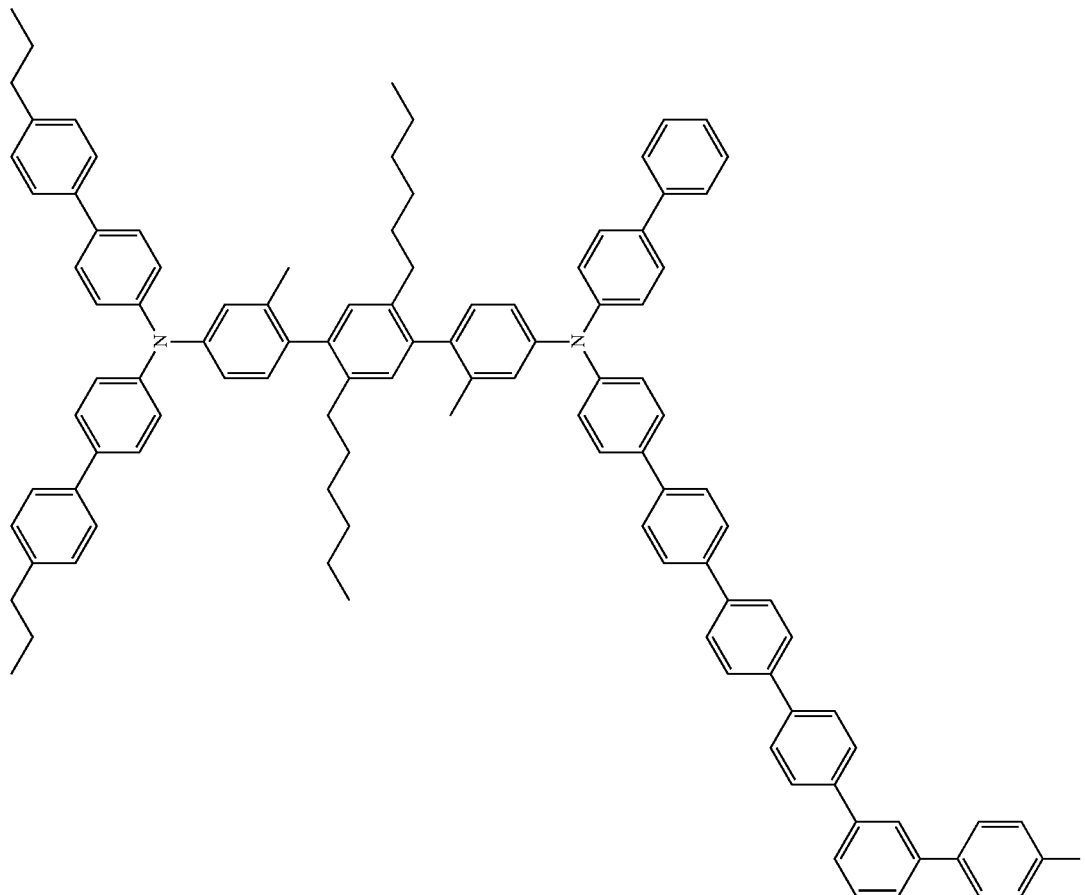
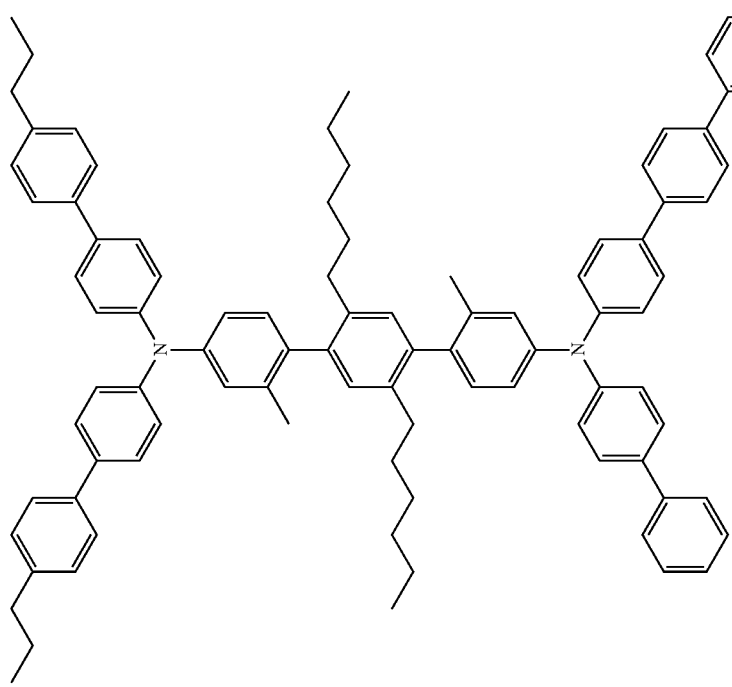

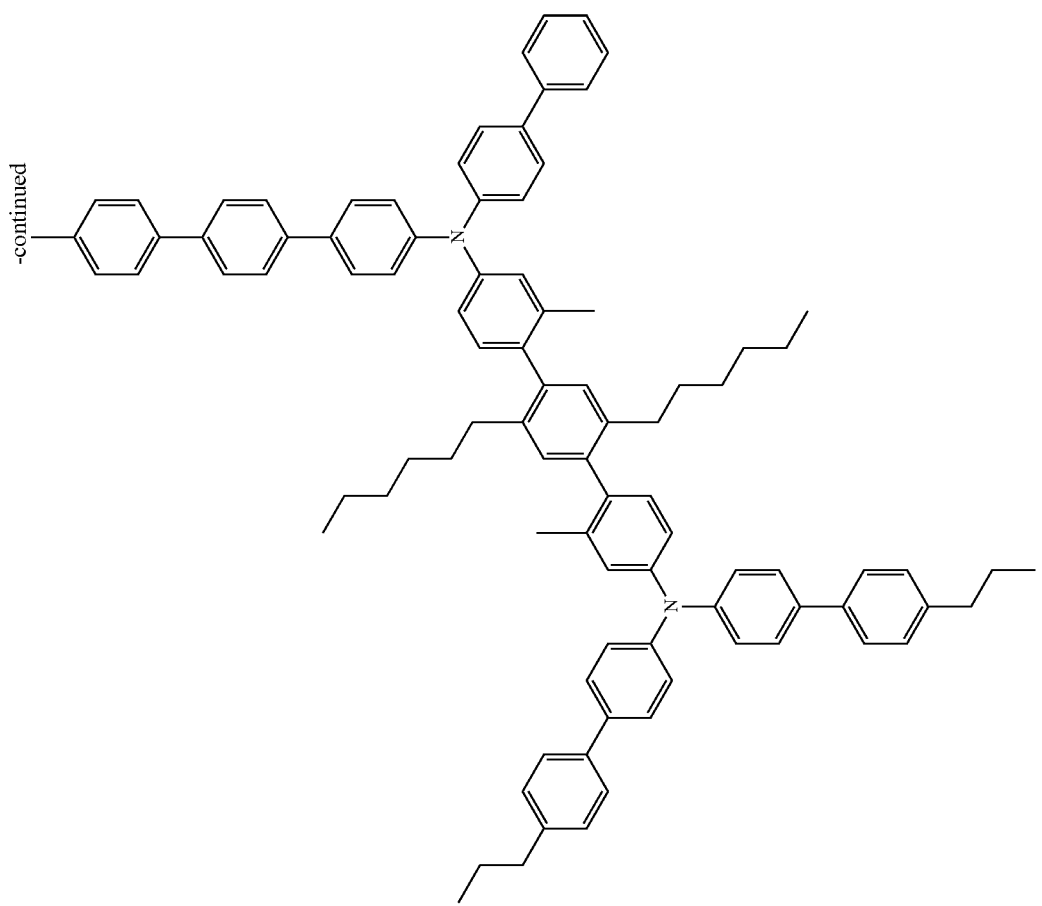

-continued
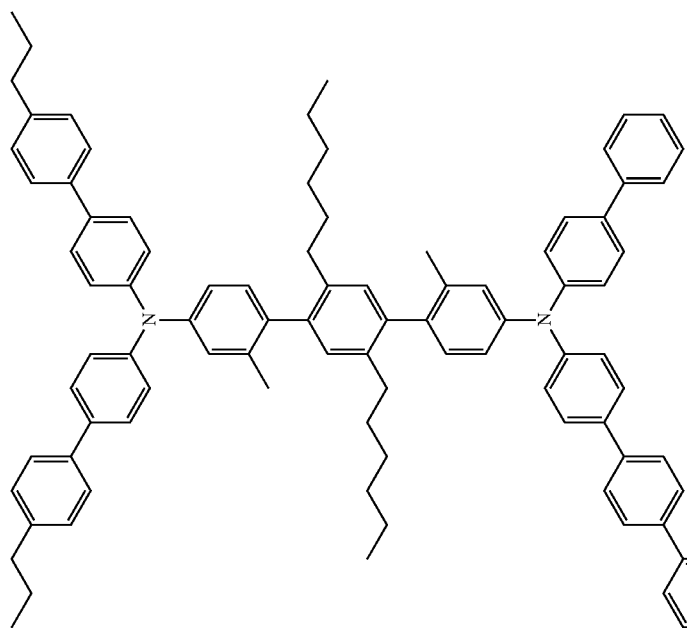
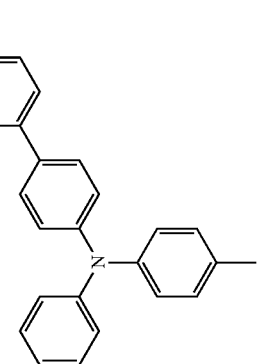
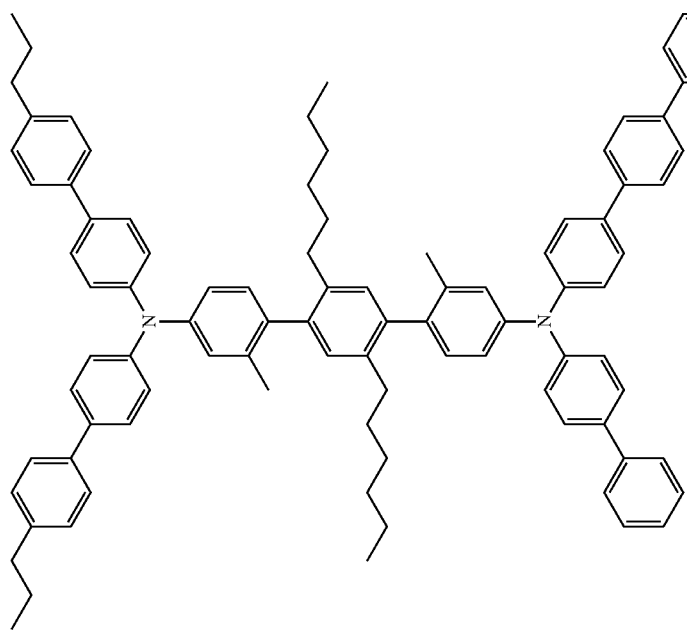

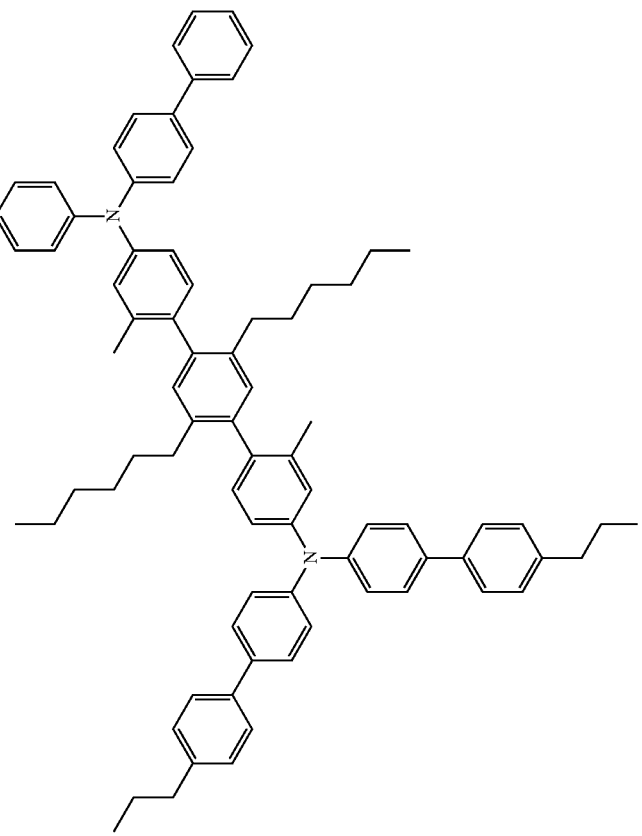

-continued
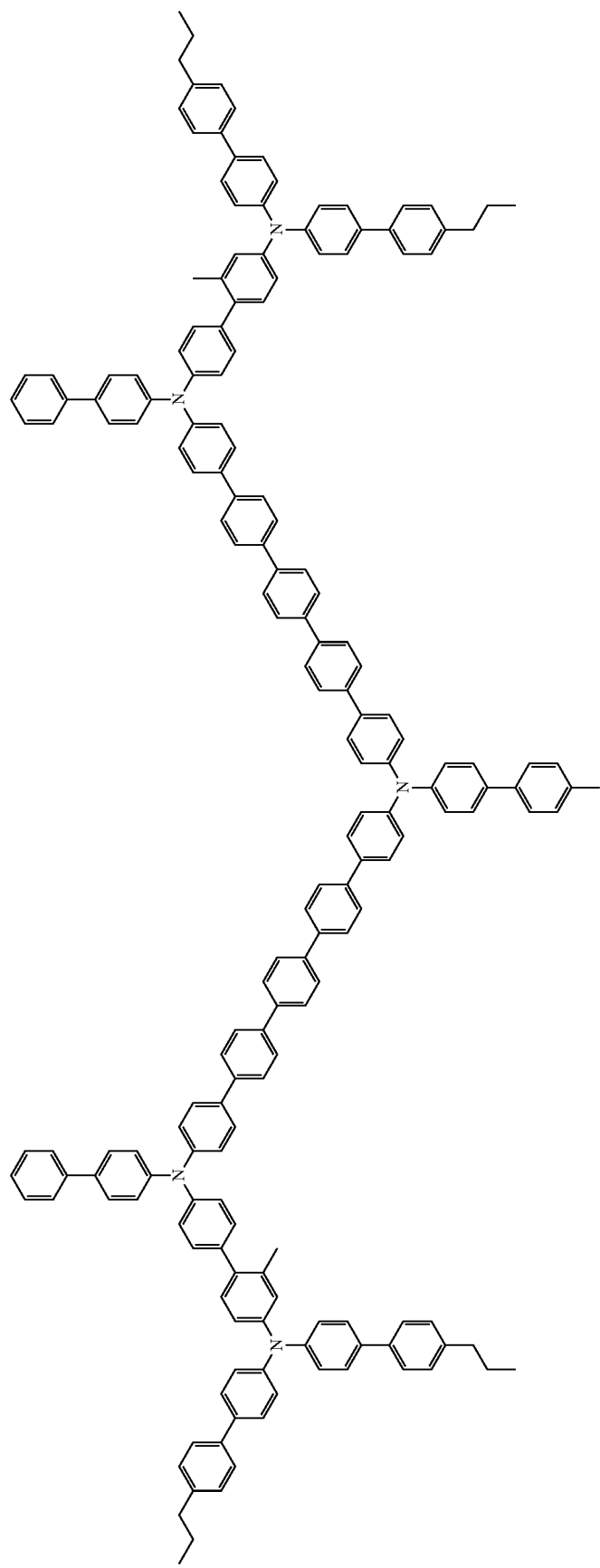

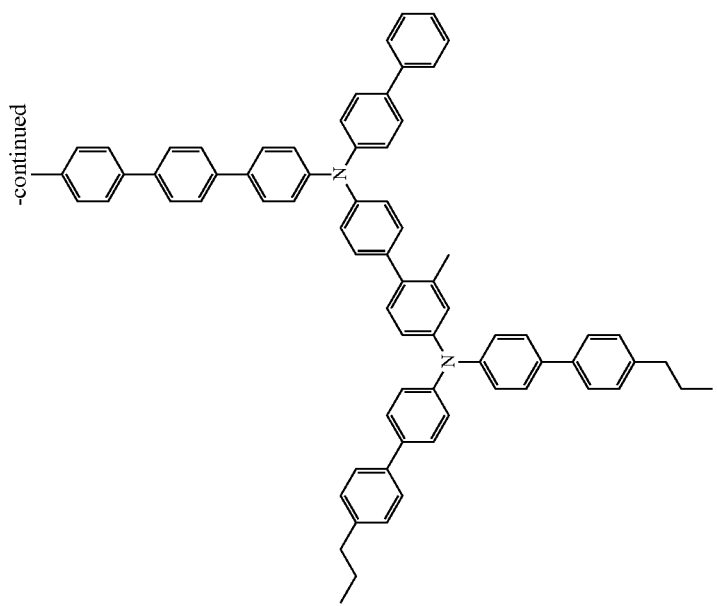

-continued
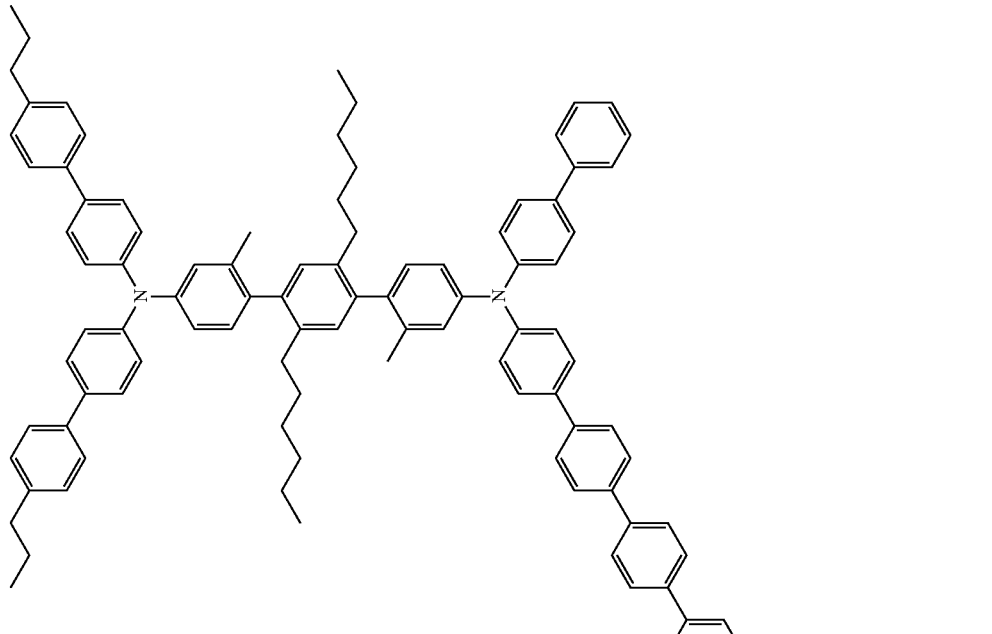
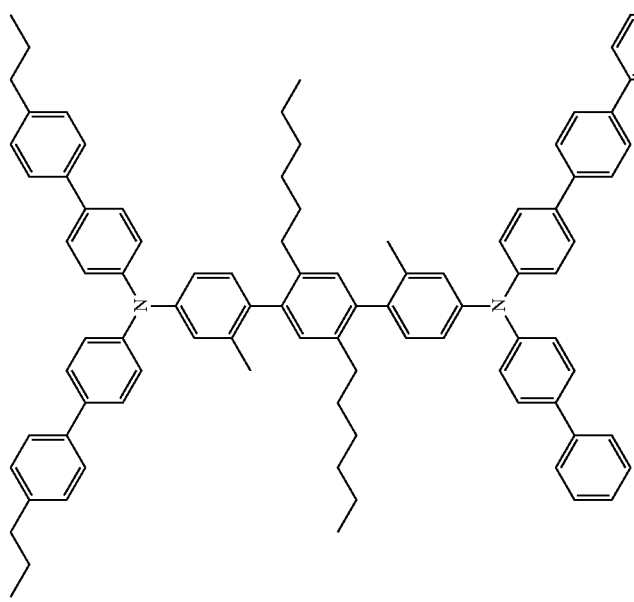

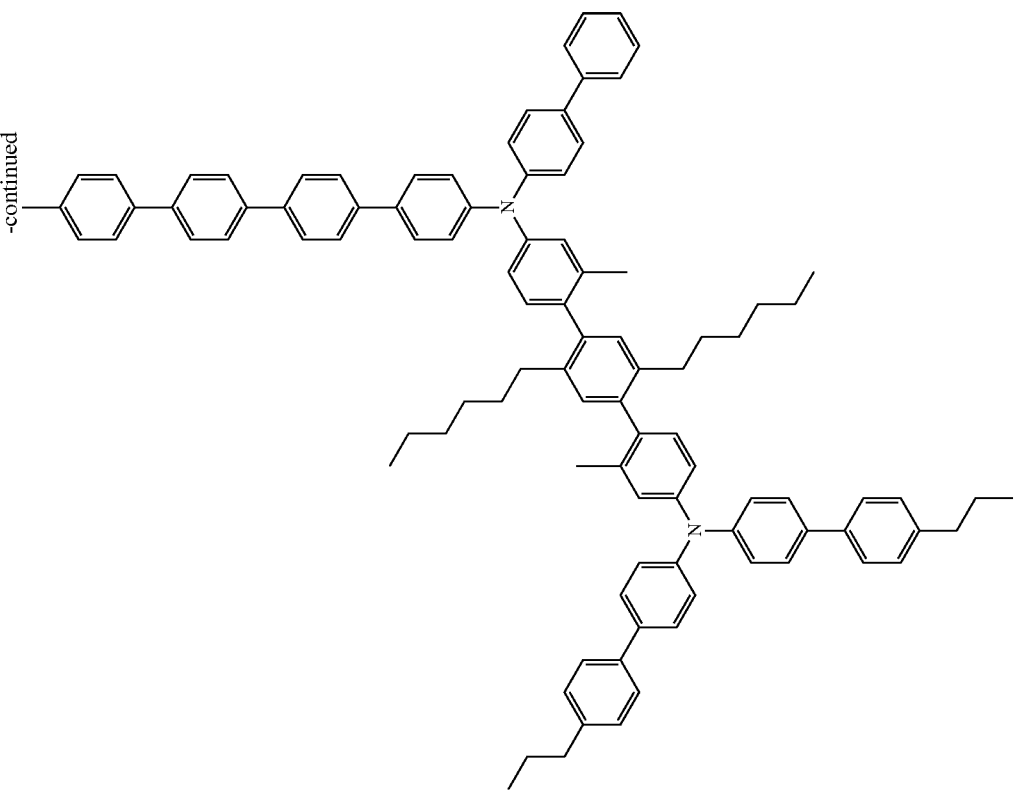

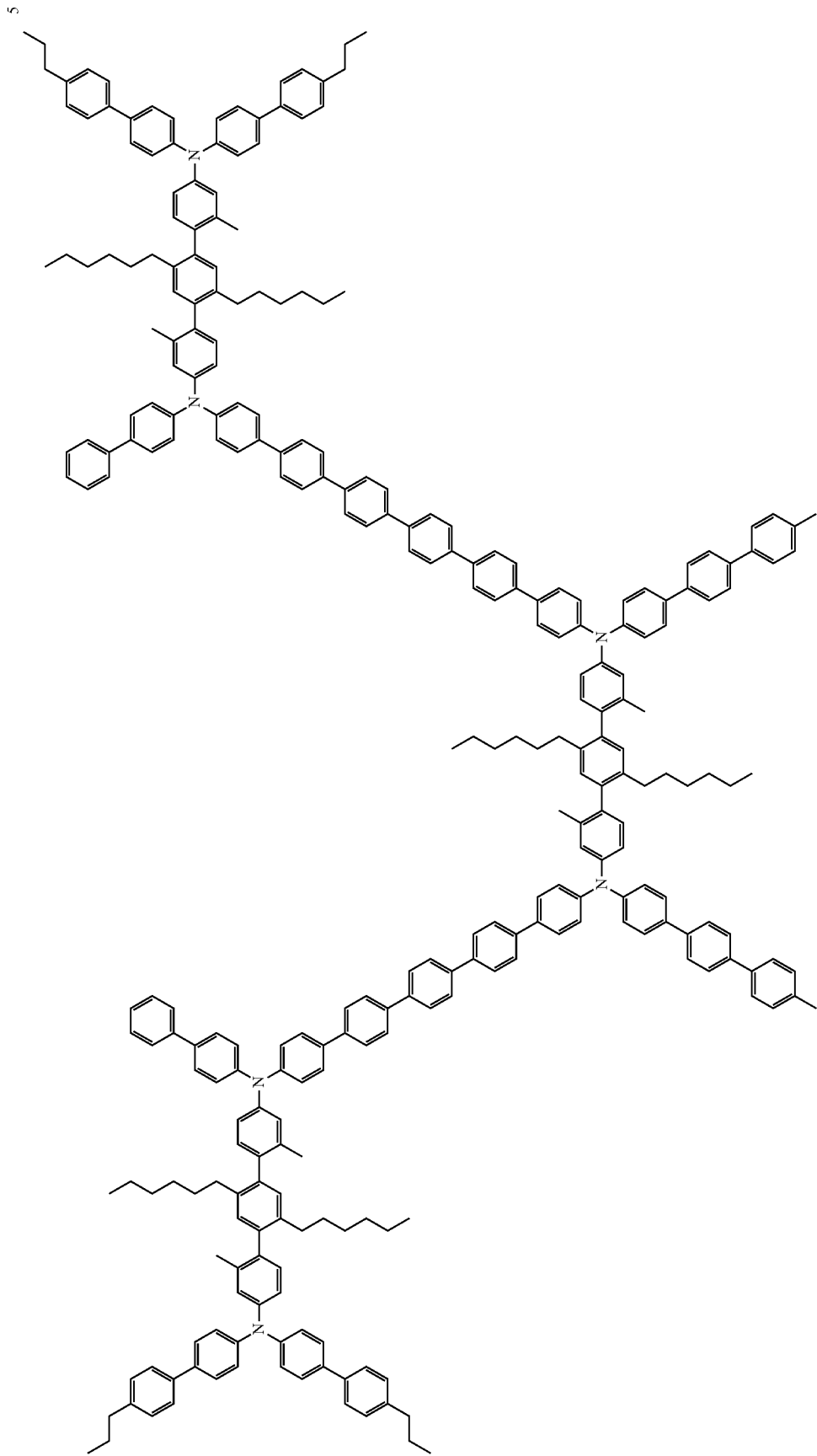

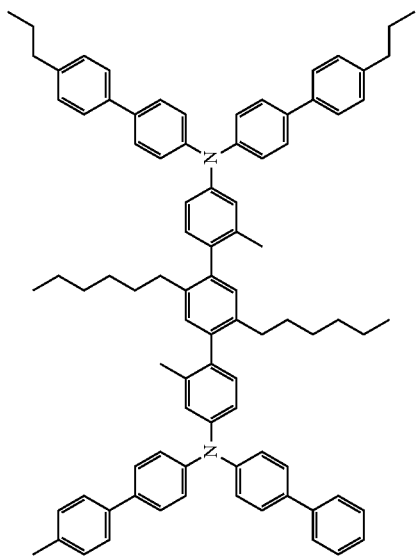
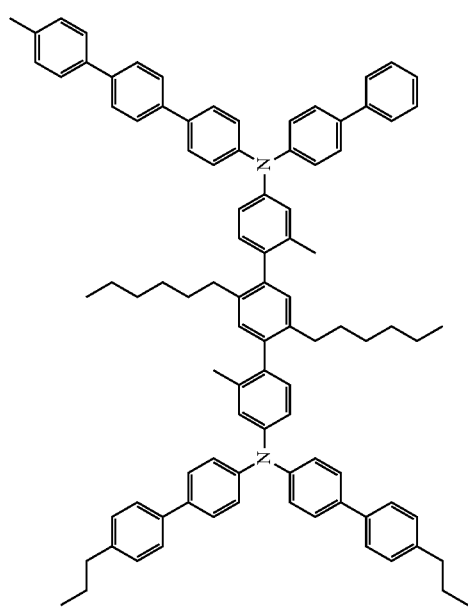

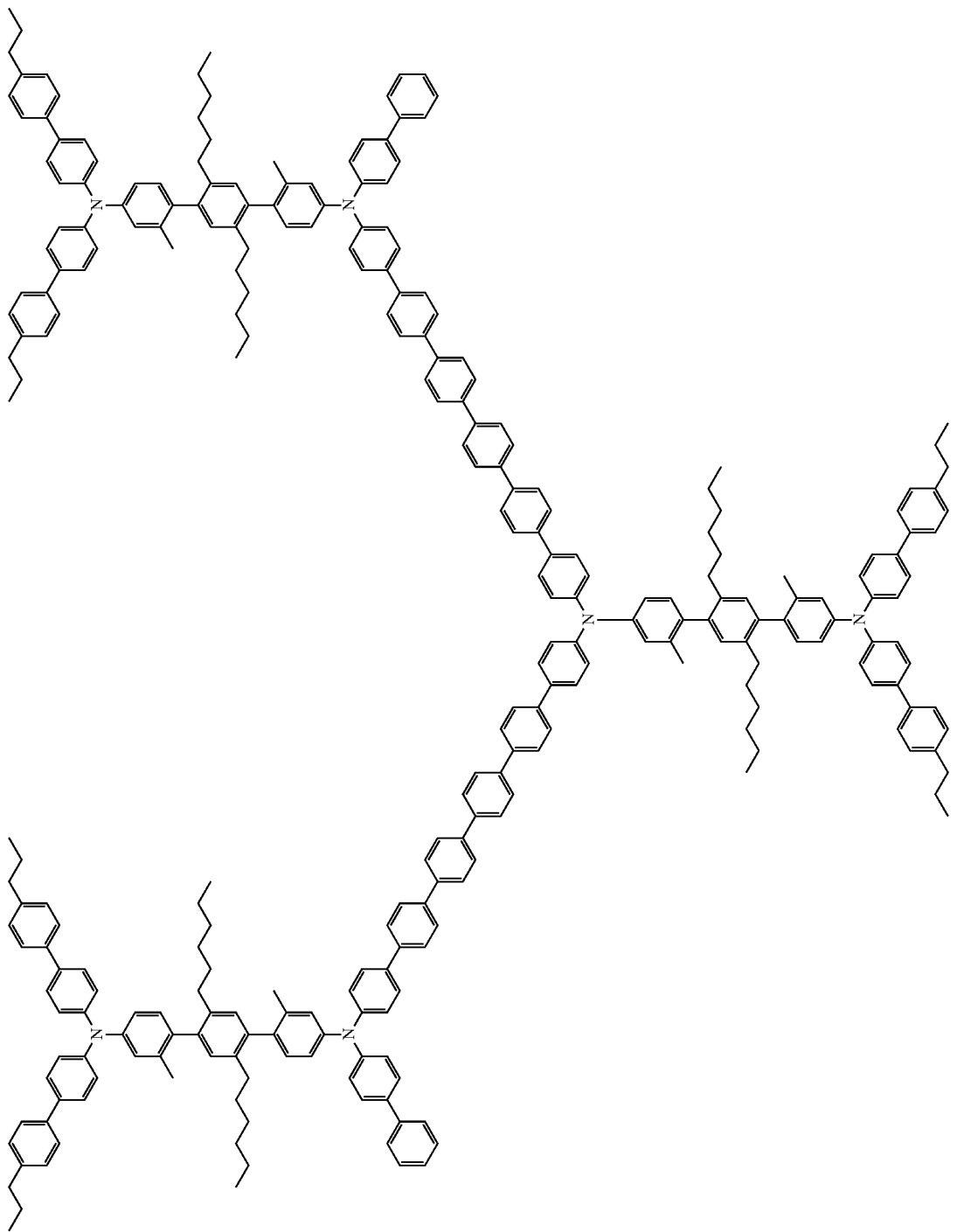

-continued
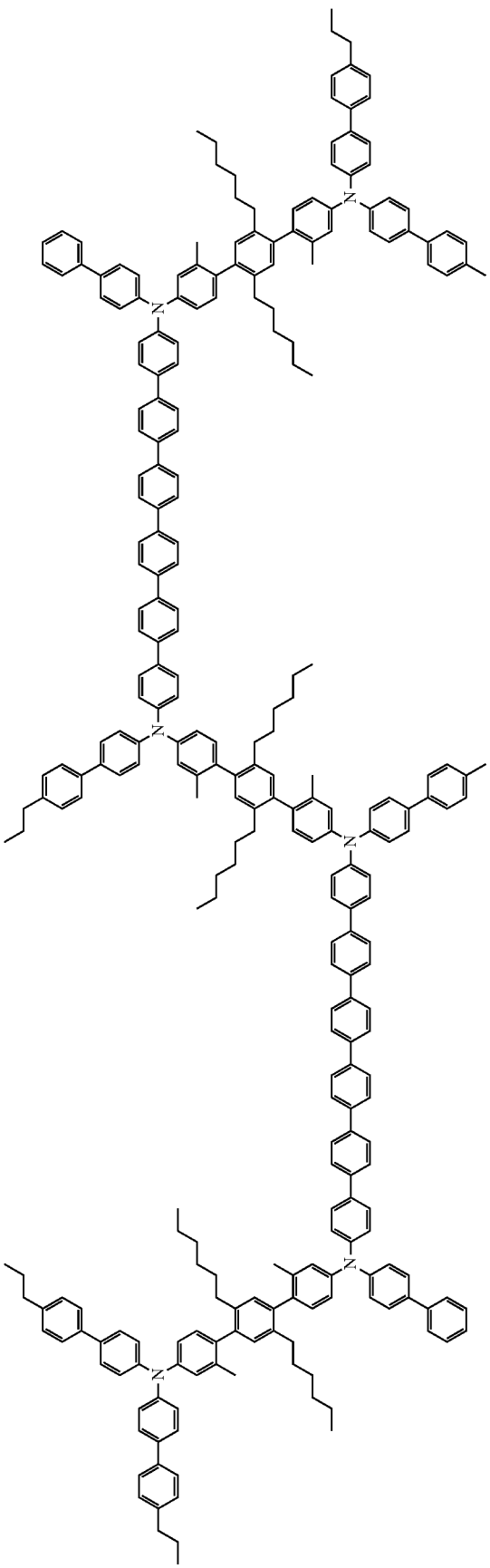

-continued
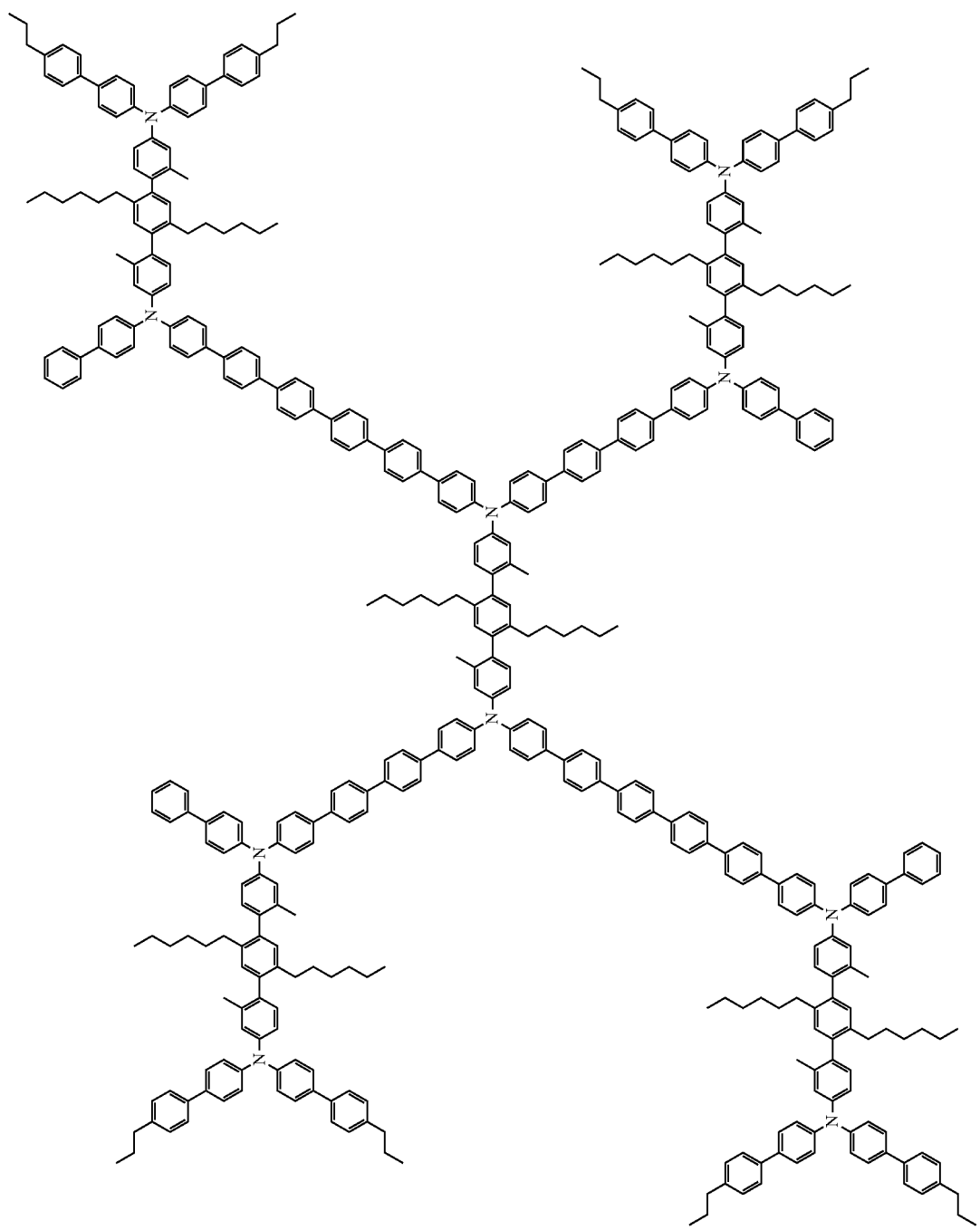

-continued
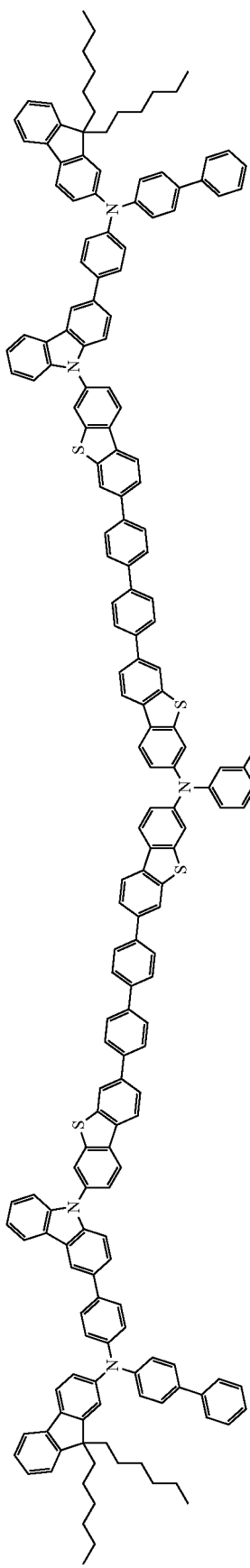 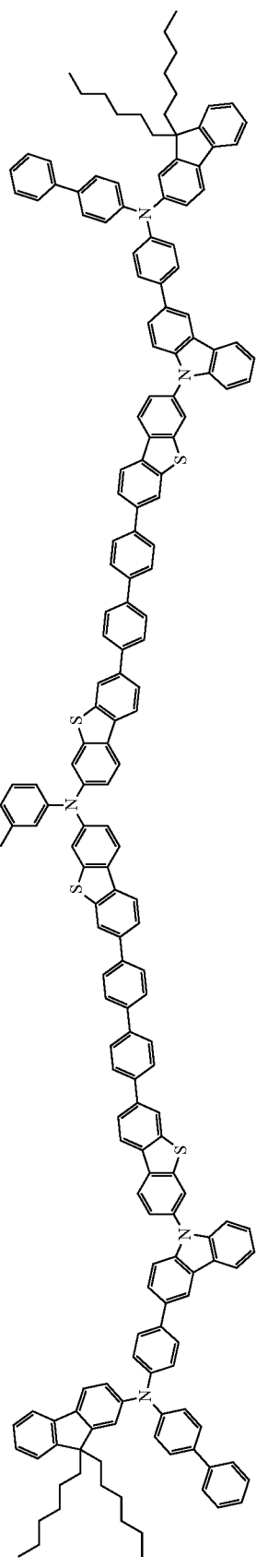

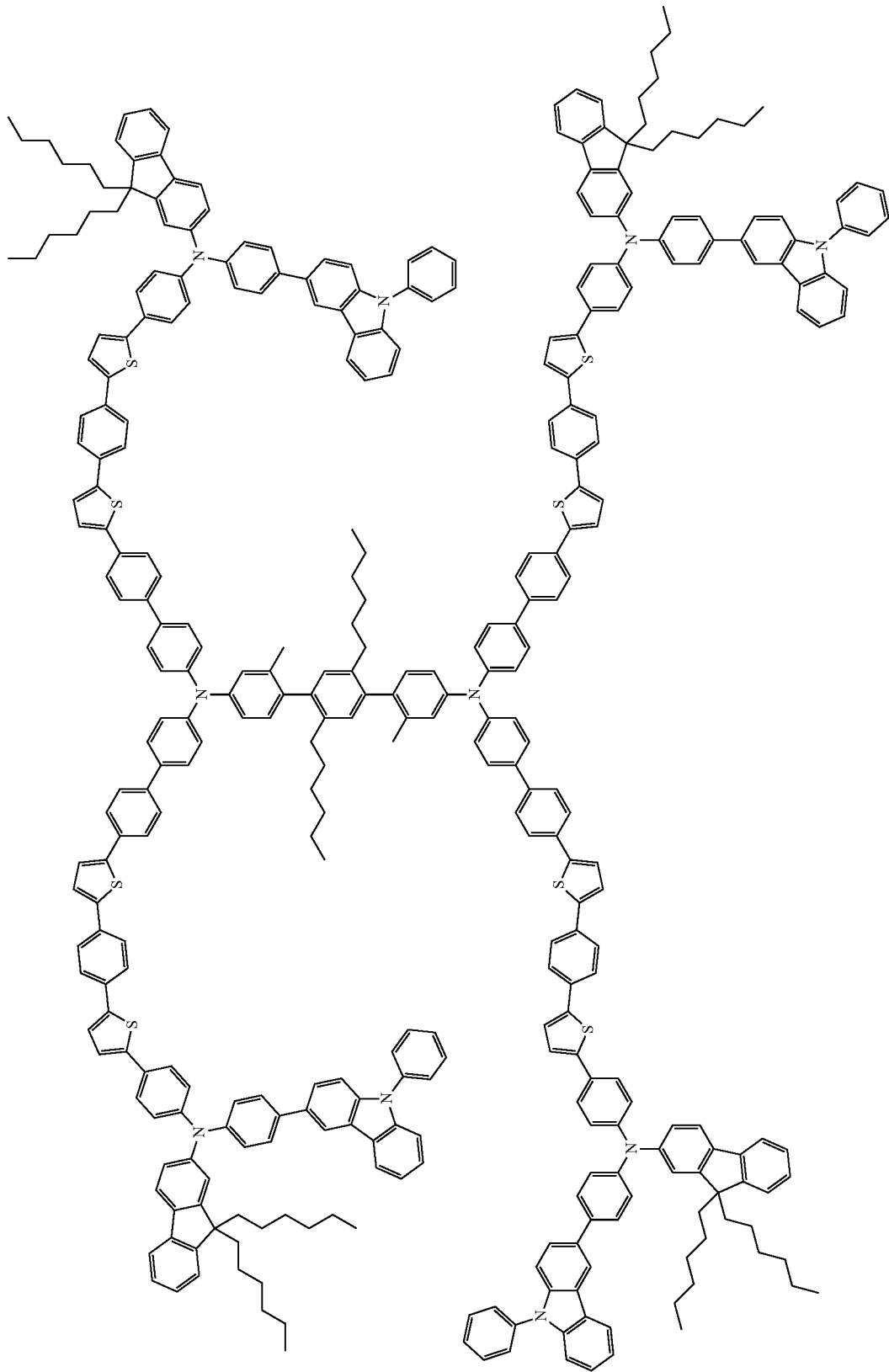

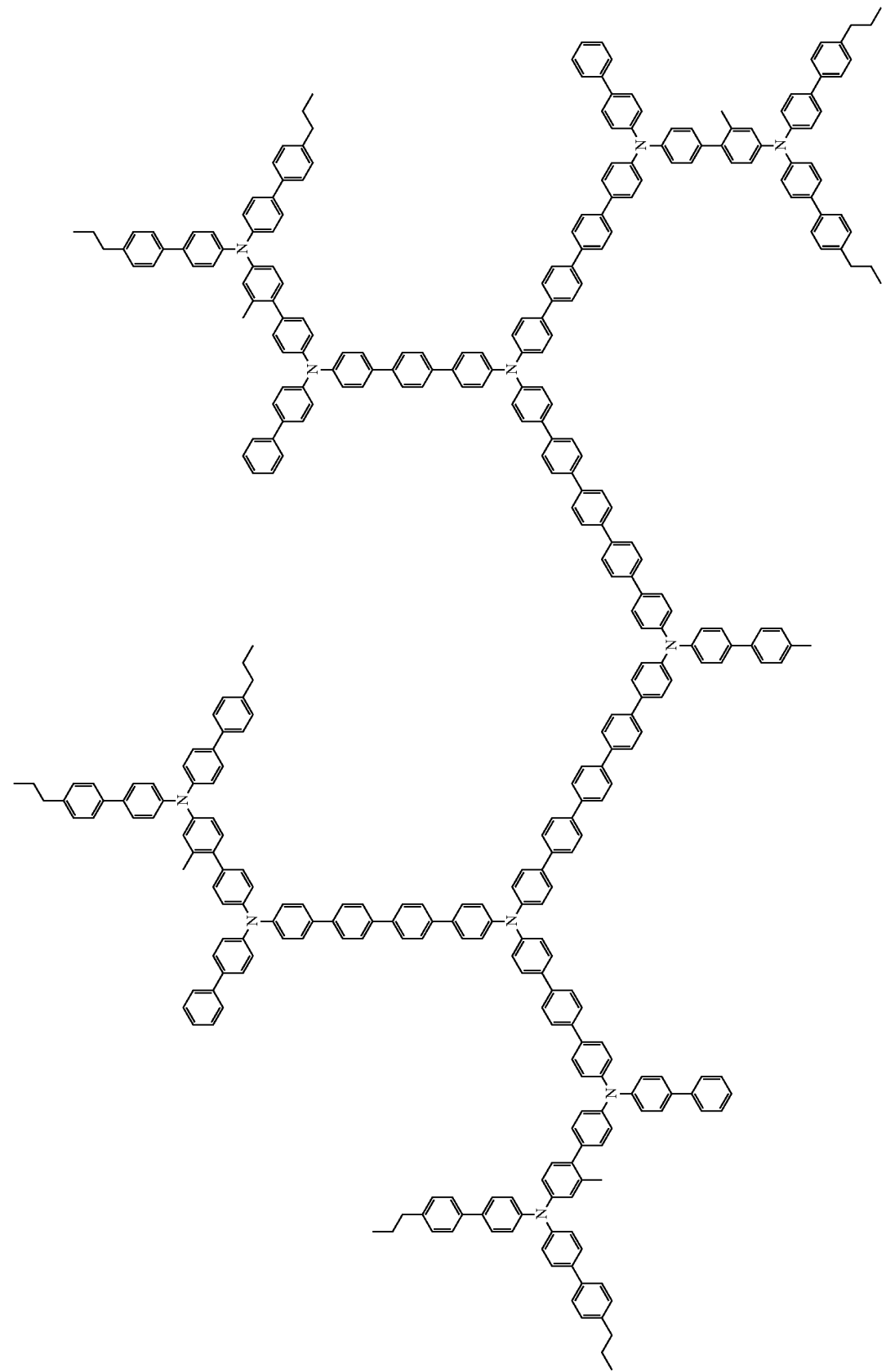

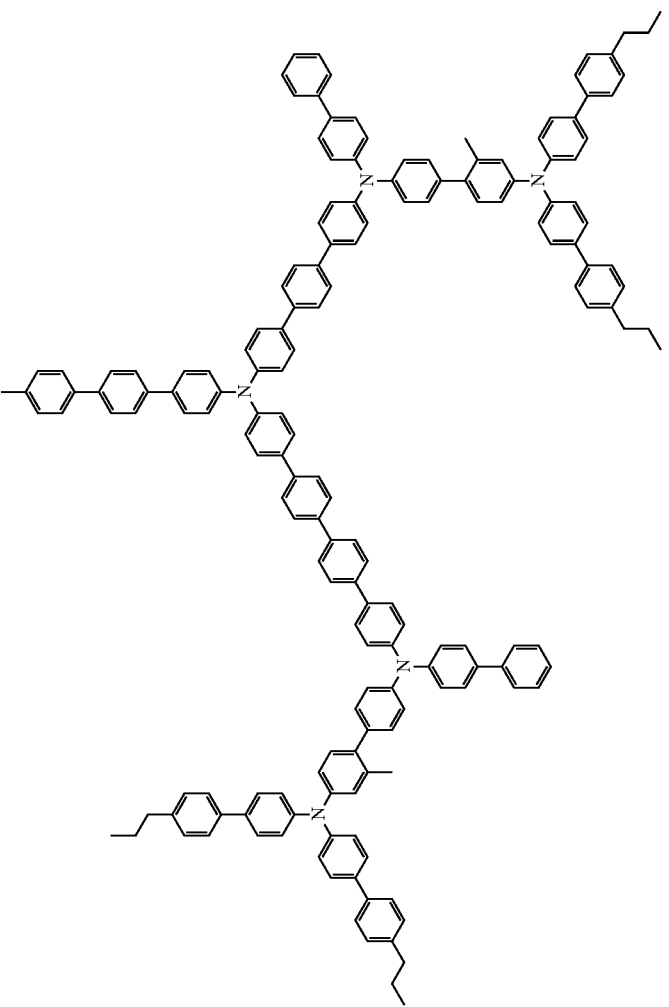

187
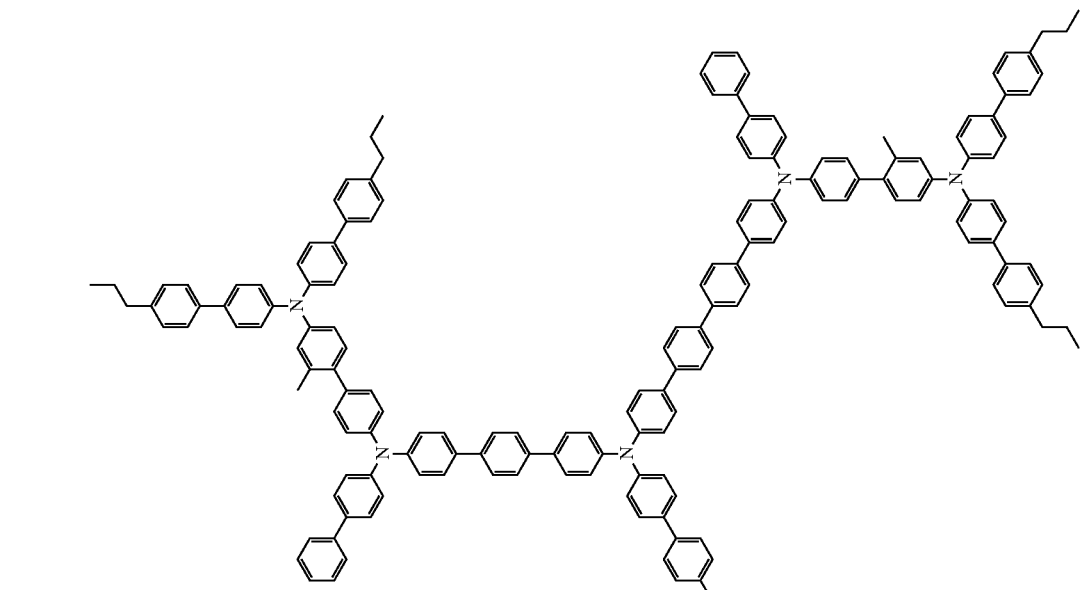
188
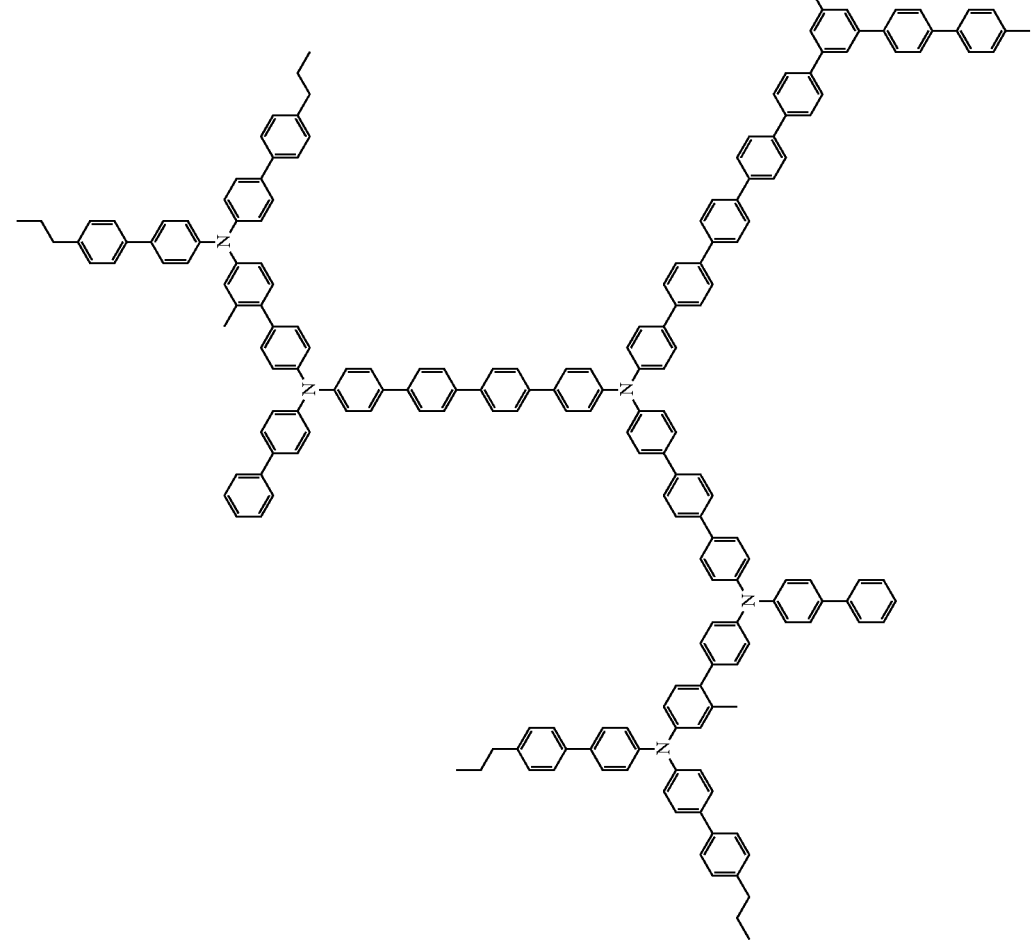

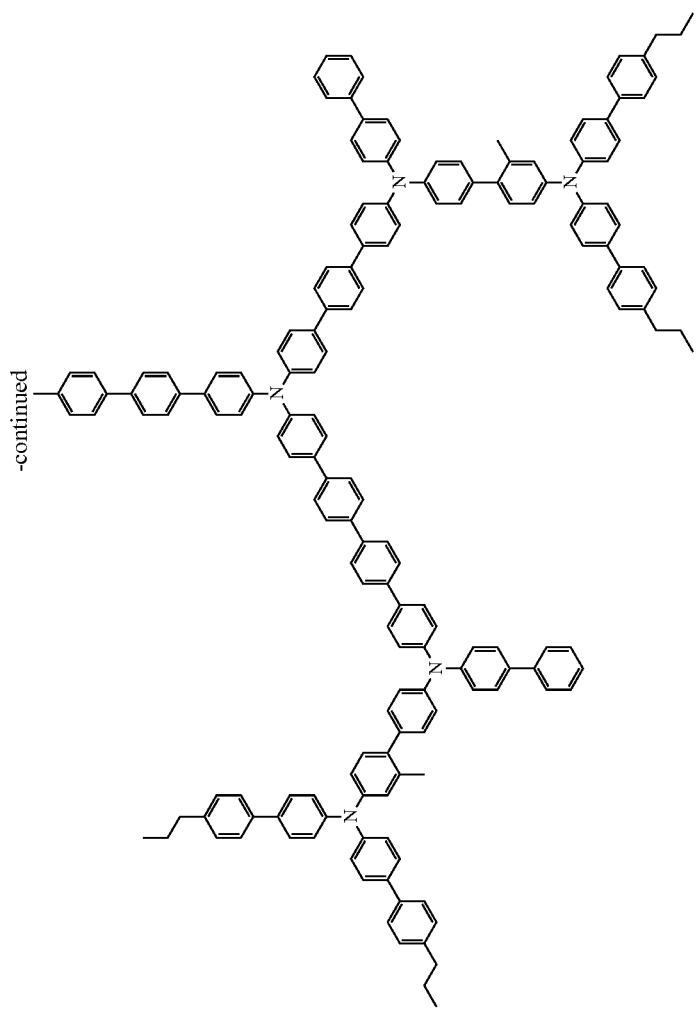

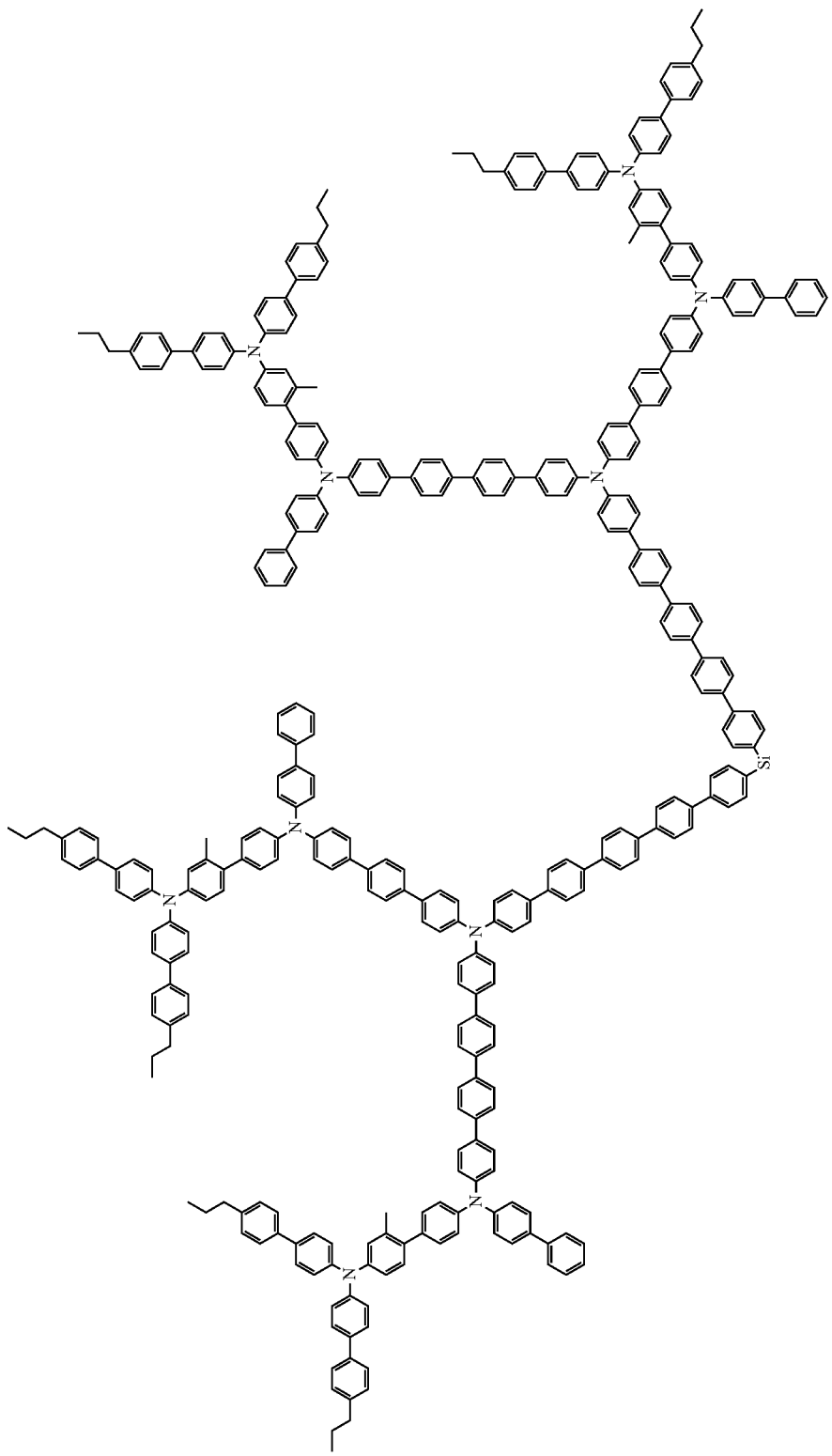

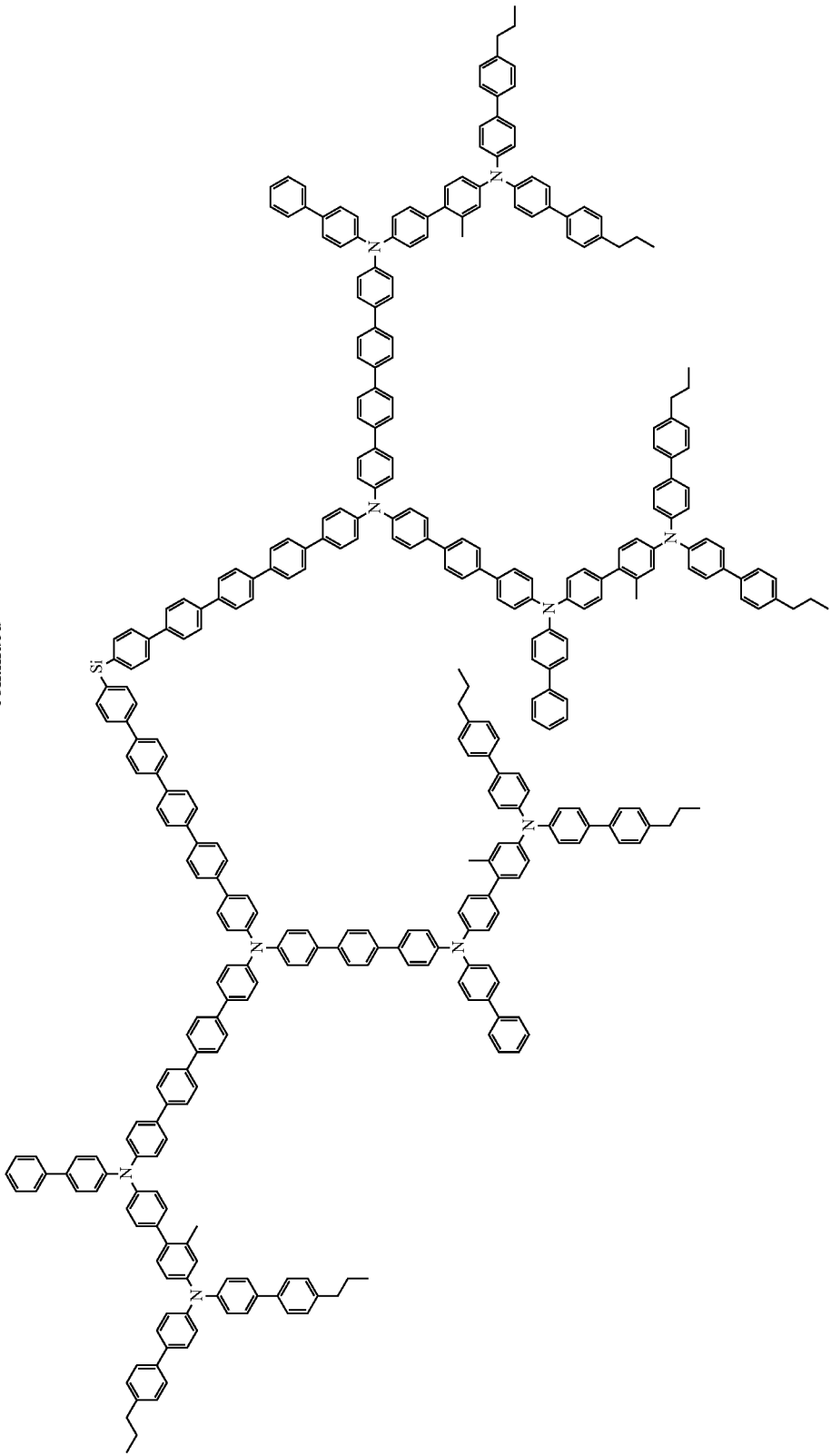

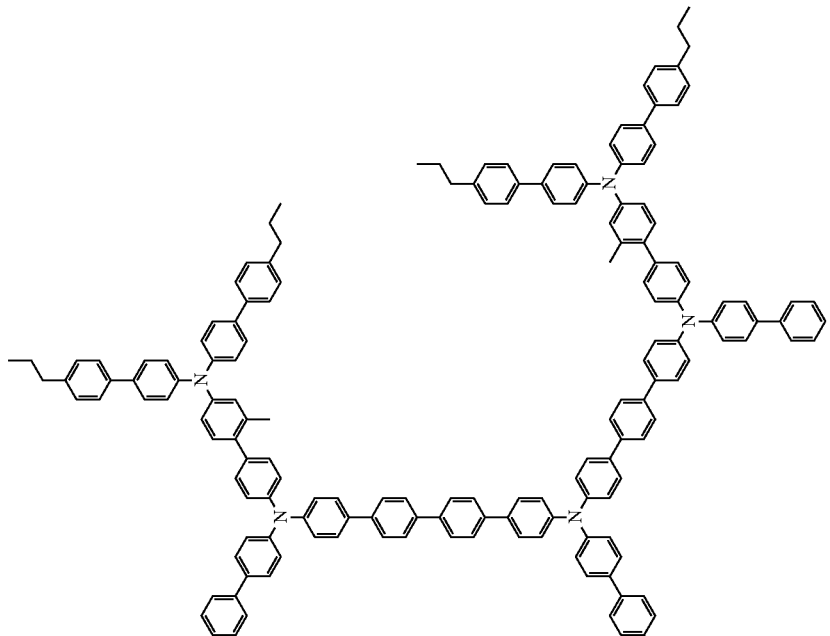
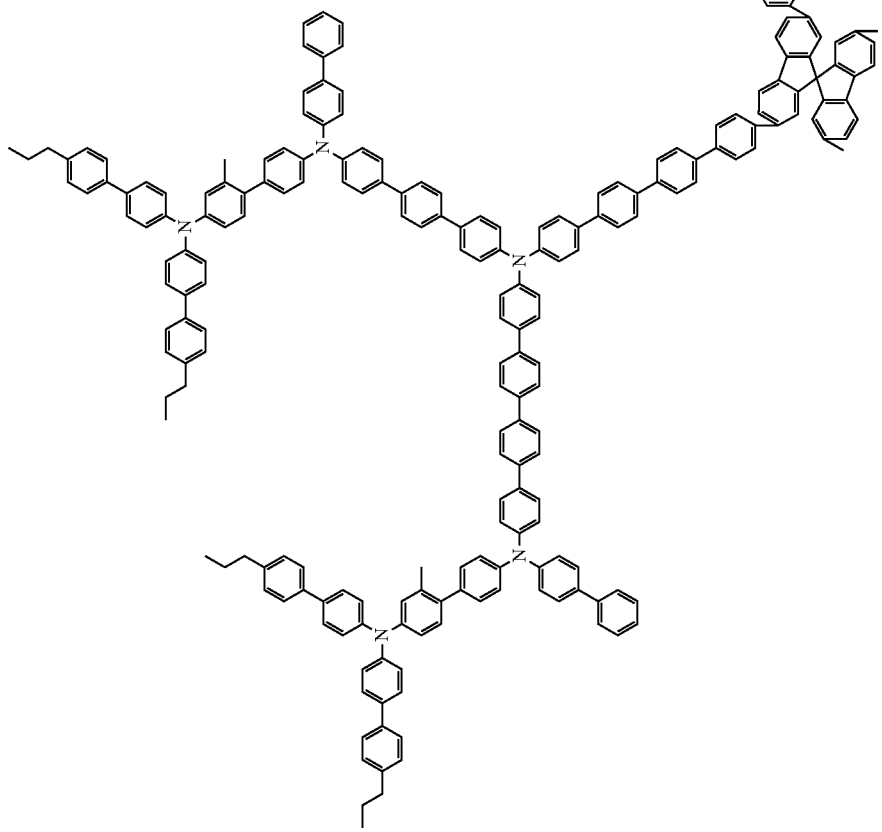

-continued
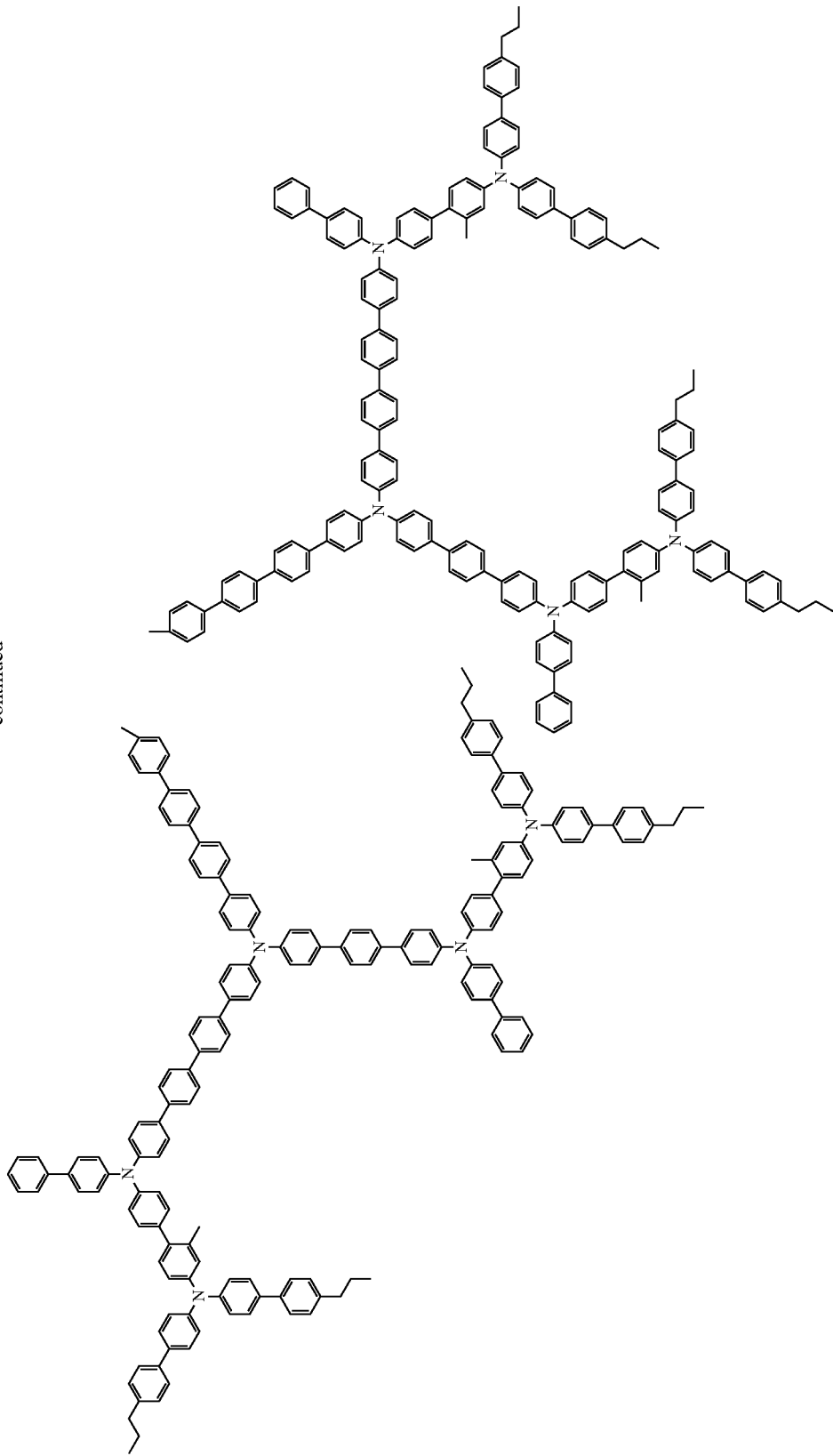

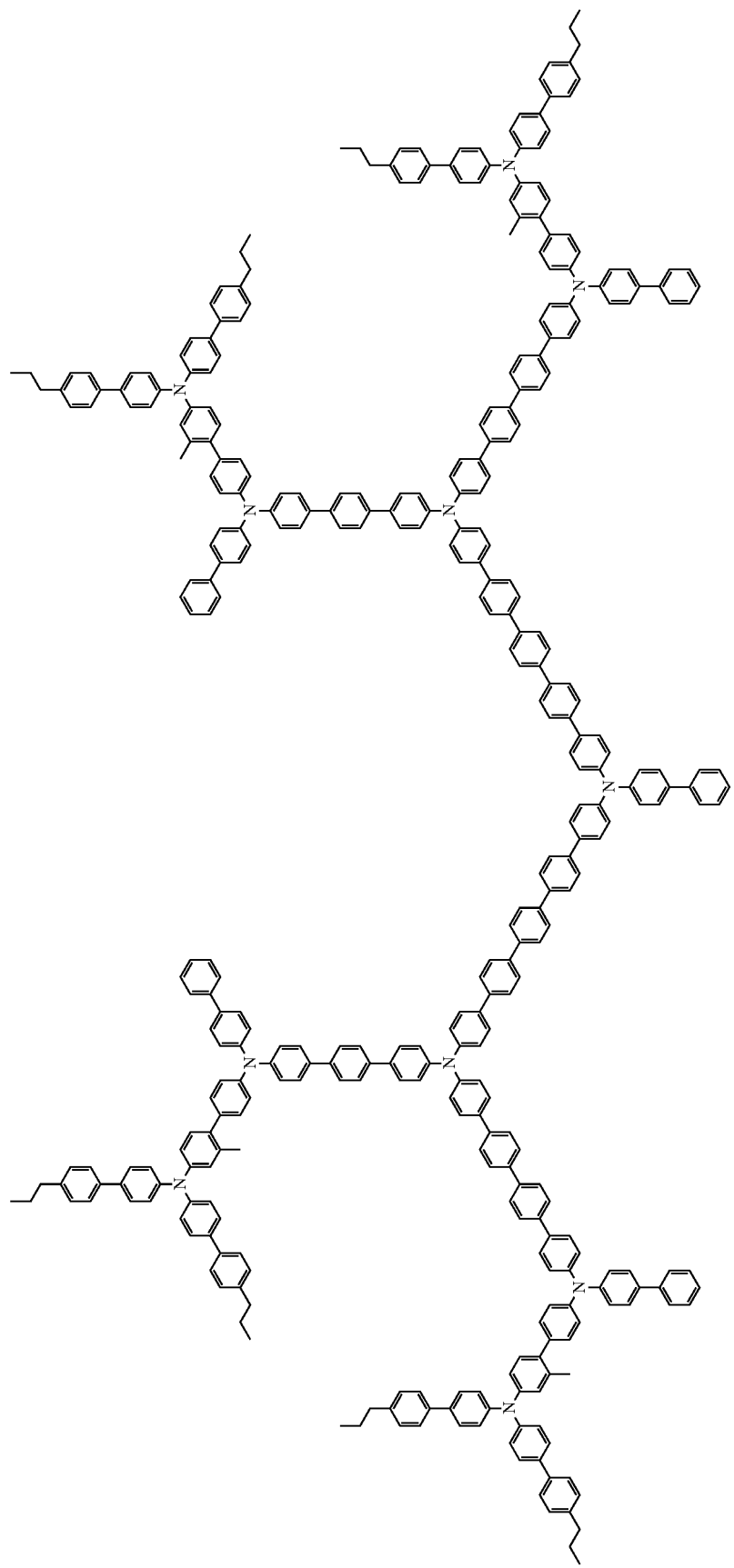

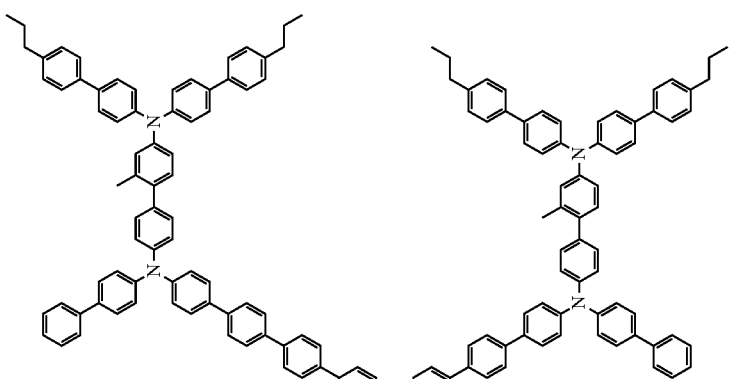
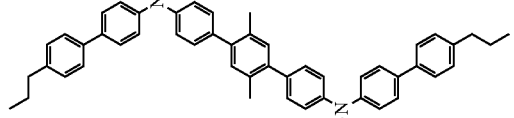
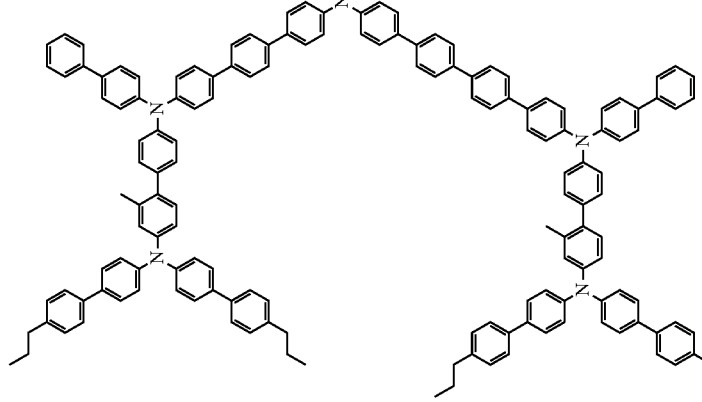

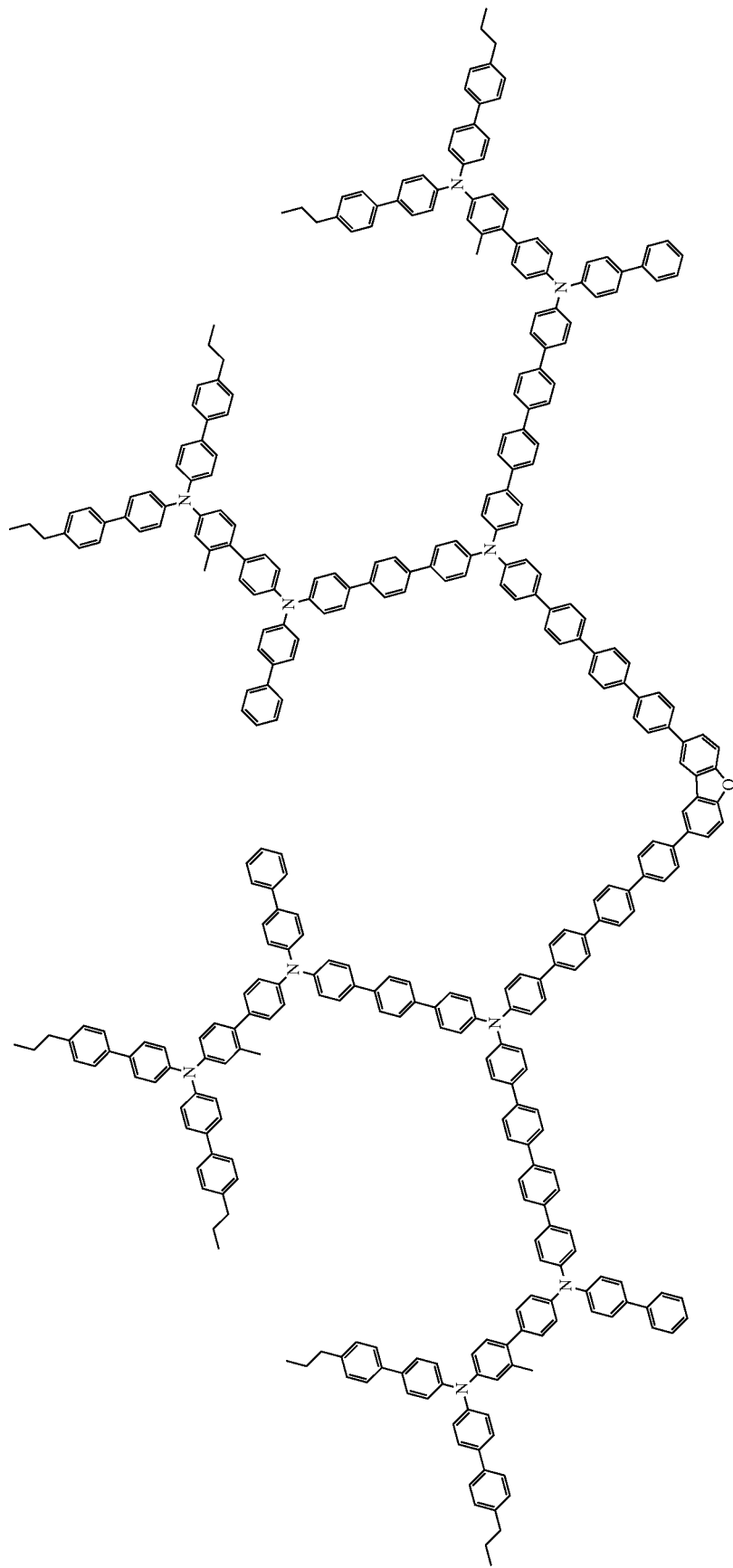

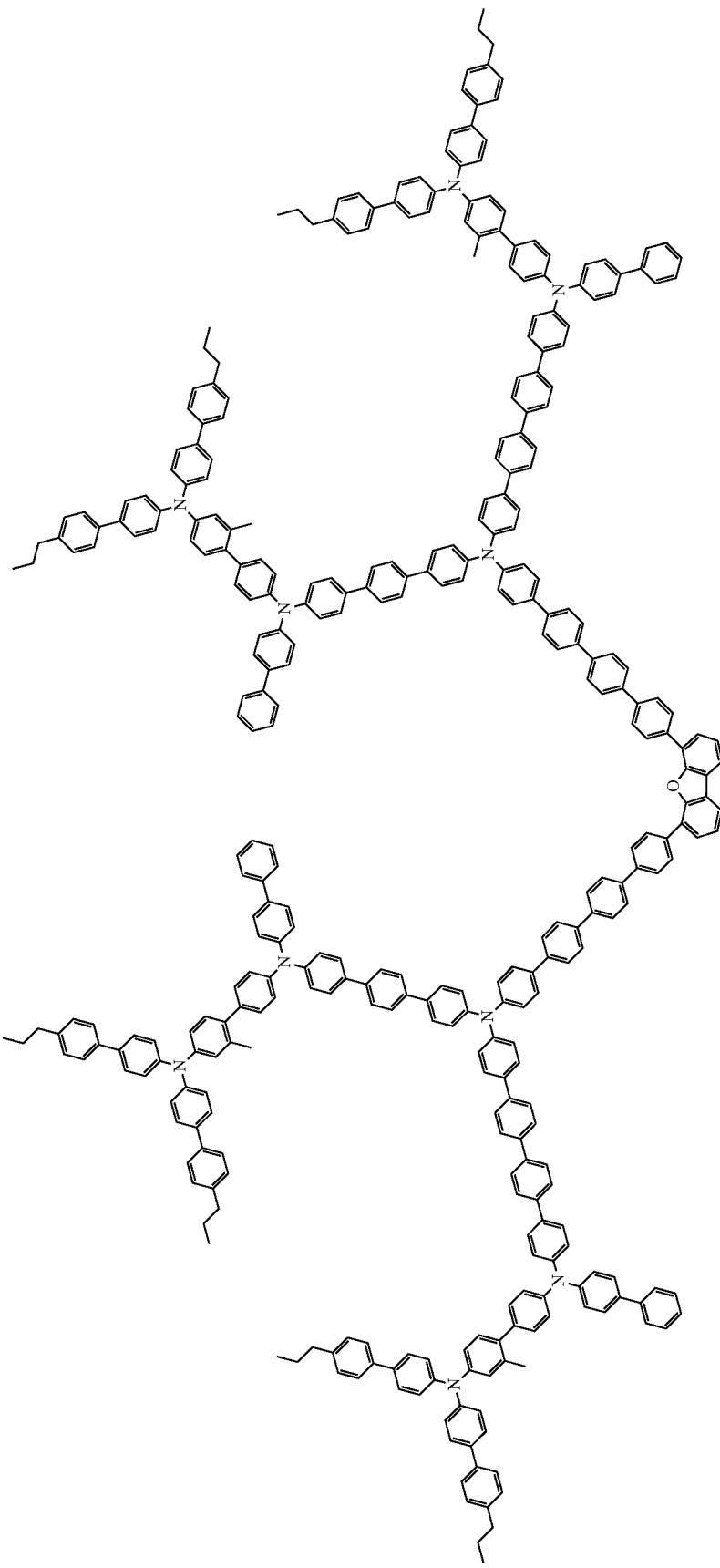

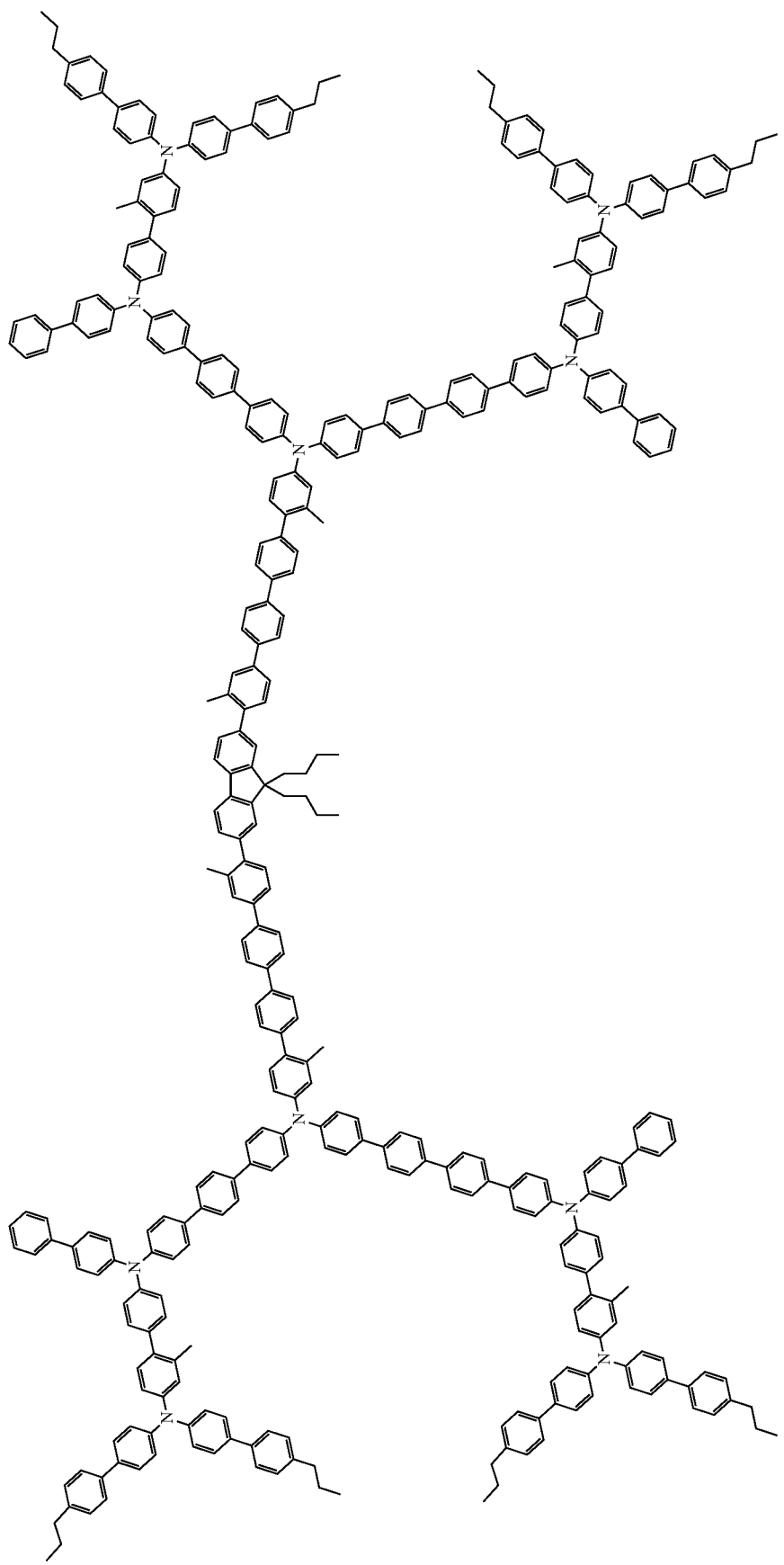

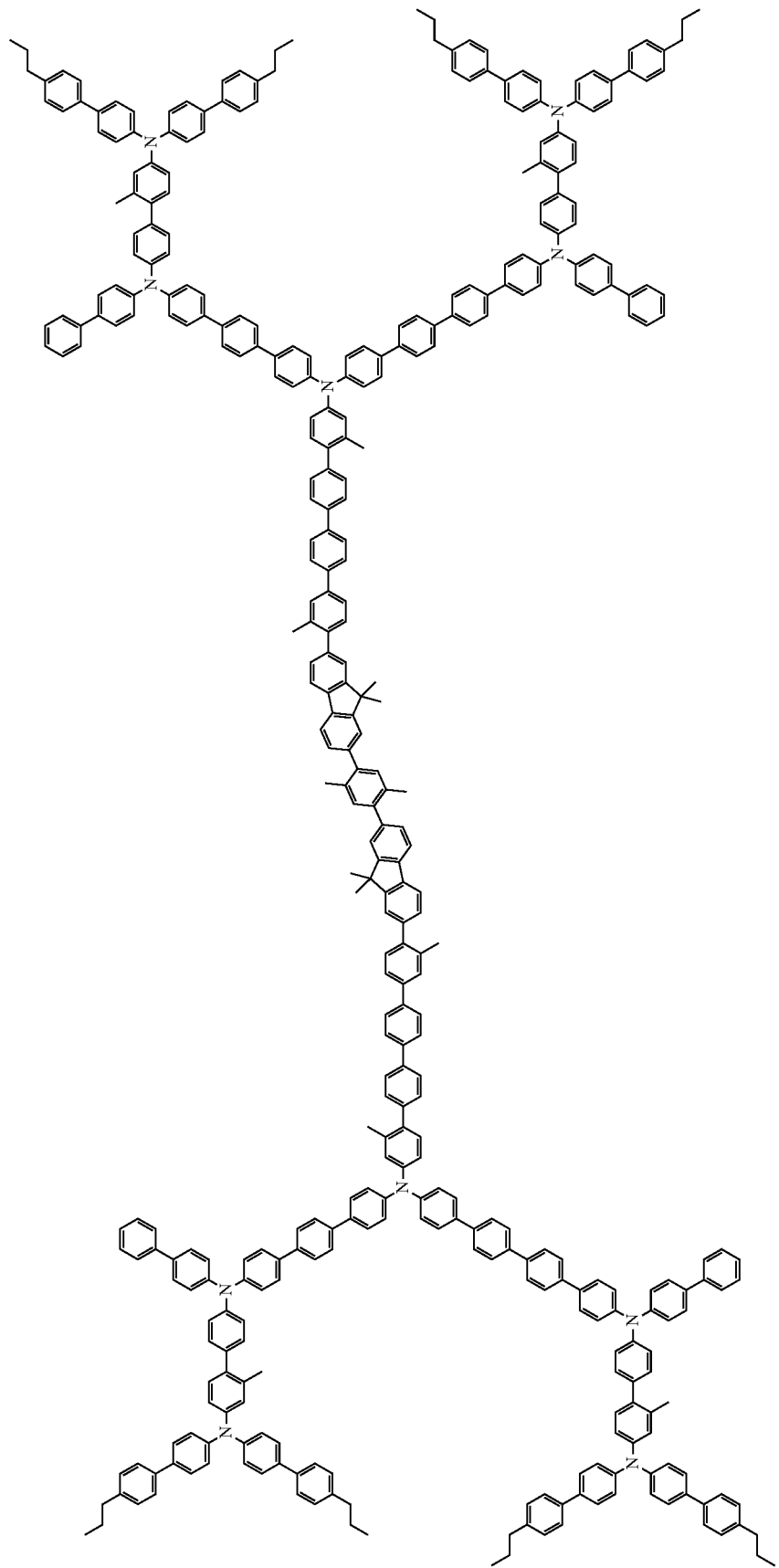

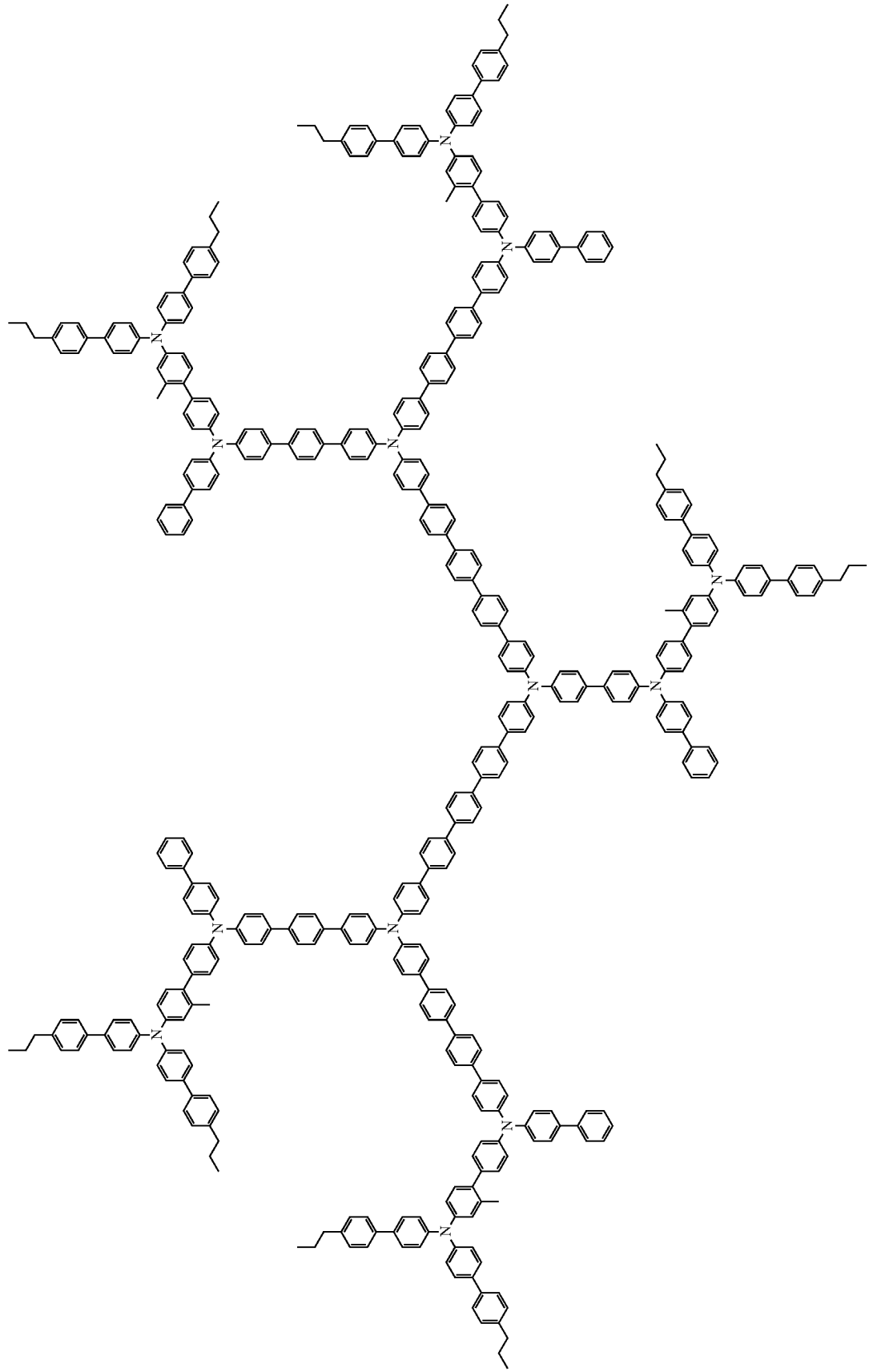

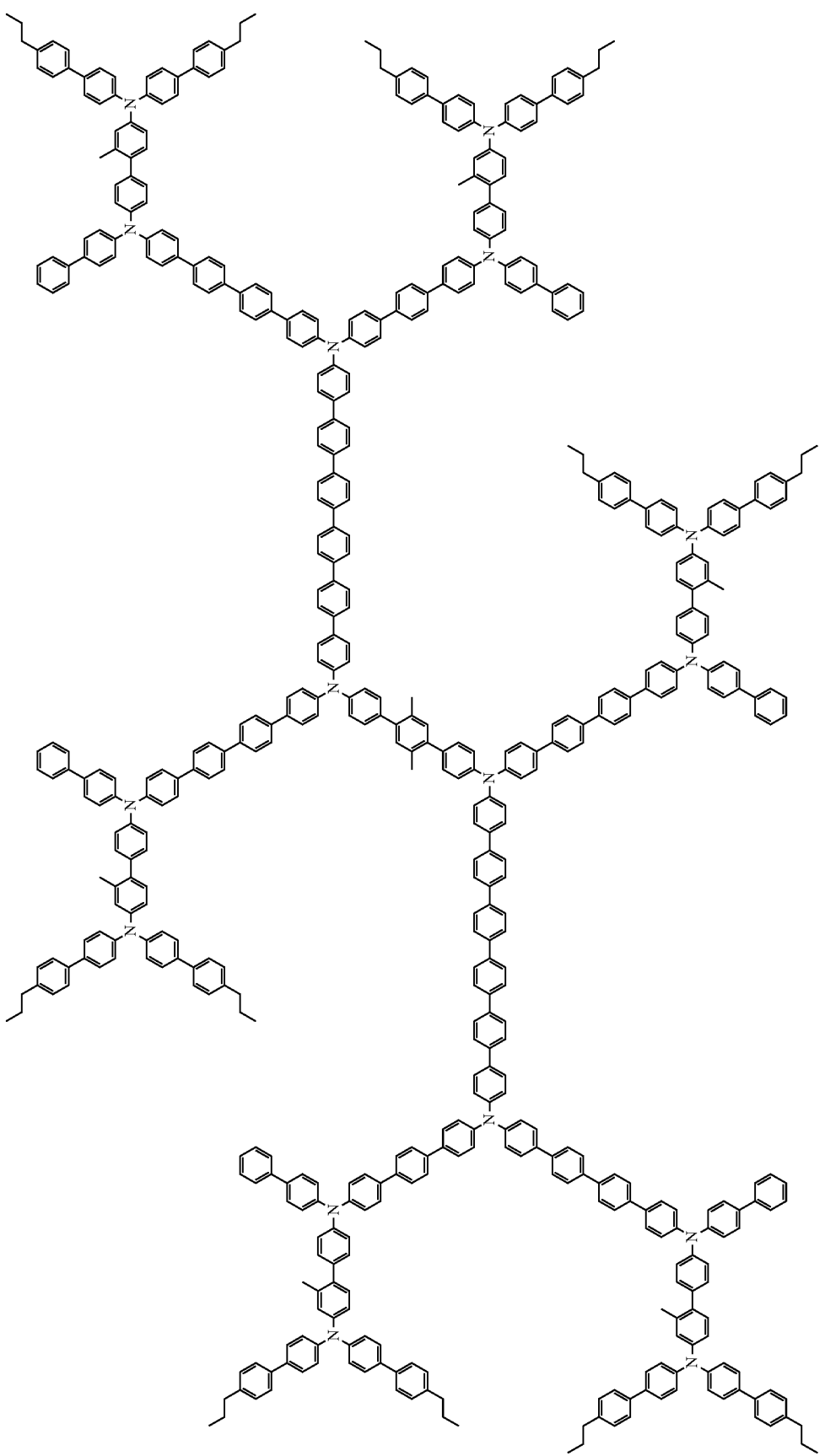

-continued
23
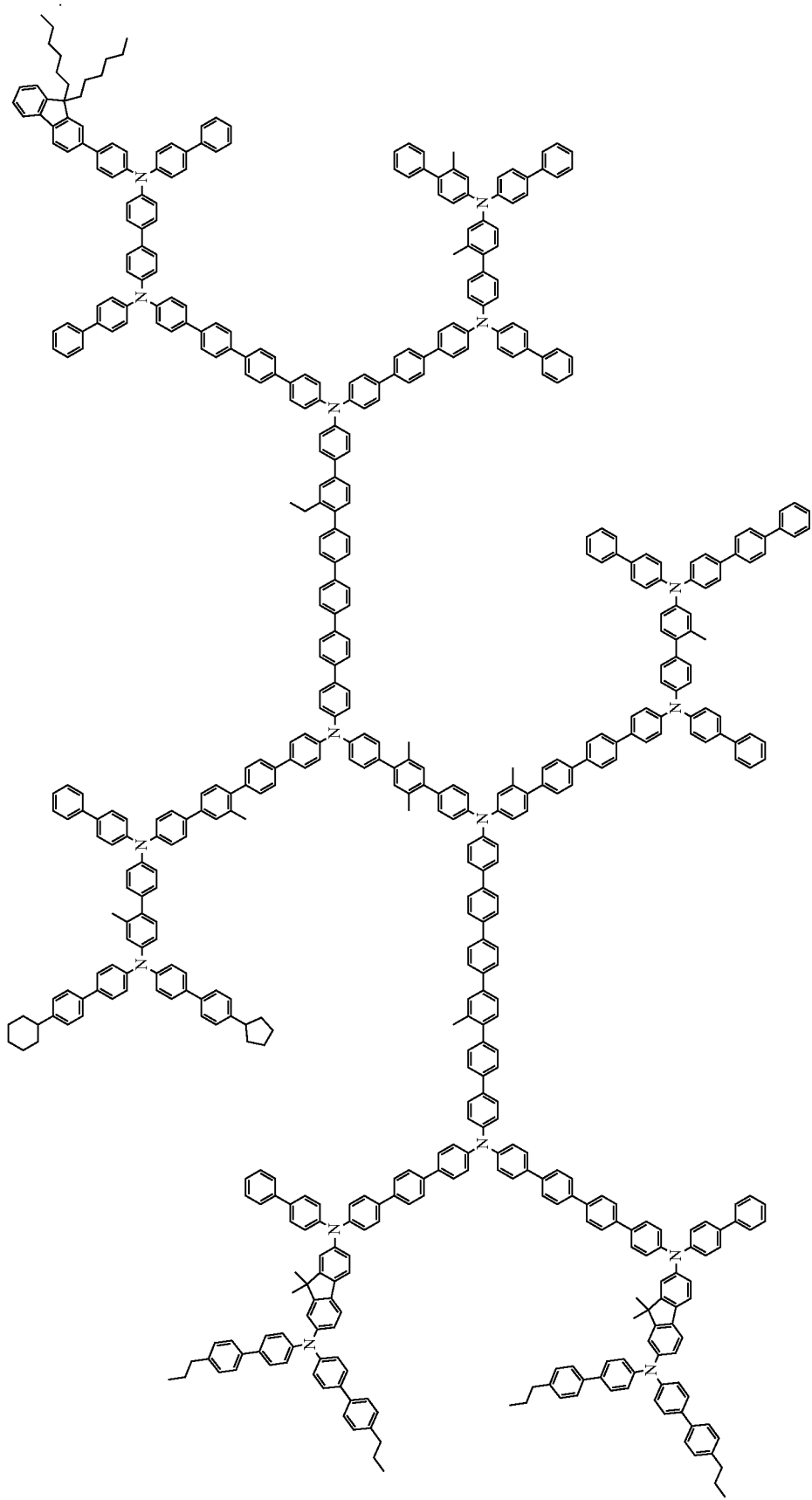

17. A composition comprising:
a solvent; and
the charge transport material of claim 1.

18. The composition of claim 17, further comprising a low-molecular-weight compound having a weight average molecular weight of less than about 2,000.

19. An organic light-emitting device comprising:
a first electrode; a second electrode; and an organic film between the first electrode and the second electrode, wherein the organic film comprises the composition of claim 17.

20. The organic light-emitting device of claim 19, wherein the organic film further comprises a hole injection layer, a hole transport layer, or a combination thereof, and the composition is comprised in the hole injection layer and/or the hole transport layer.

* * * * *